United States Patent
Endo et al.

(10) Patent No.: US 9,188,871 B2
(45) Date of Patent: Nov. 17, 2015

(54) PATTERN FORMING METHOD, ALKALI-DEVELOPABLE THERMOSETTING RESIN COMPOSITION, PRINTED CIRCUIT BOARD AND MANUFACTURING METHOD THEREOF

(71) Applicant: TAIYO INK MFG. CO., LTD., Hiki-gun (JP)

(72) Inventors: Arata Endo, Tsurugashima (JP); Shoji Minegishi, Hiki-gun (JP); Masao Arima, Kawagoe (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 168 days.

(21) Appl. No.: 13/896,966

(22) Filed: May 17, 2013

(65) Prior Publication Data

US 2014/0034371 A1    Feb. 6, 2014

(30) Foreign Application Priority Data

May 17, 2012 (JP) ................................ 2012-113859
May 17, 2012 (JP) ................................ 2012-113863

(51) Int. Cl.
*G03F 7/20* (2006.01)
*G03F 7/038* (2006.01)
*H05K 1/03* (2006.01)
*H05K 3/28* (2006.01)
*H05K 3/34* (2006.01)

(52) U.S. Cl.
CPC ............ *G03F 7/2016* (2013.01); *G03F 7/0382* (2013.01); *H05K 1/0306* (2013.01); *H05K 3/287* (2013.01); *H05K 3/3452* (2013.01)

(58) Field of Classification Search
CPC ..... G03F 7/2016; G03F 7/0382; H05K 1/0306
USPC .................................. 174/258; 430/325, 270.1
See application file for complete search history.

(56) References Cited

U.S. PATENT DOCUMENTS

2004/0067440 A1* 4/2004 Minegishi et al. ......... 430/280.1
2008/0261039 A1* 10/2008 Tanaka et al. ................. 428/352

(Continued)

FOREIGN PATENT DOCUMENTS

| JP | 61-243869 | 10/1986 | |
| JP | 61243869 | * 10/1986 | ............. C09D 11/00 |
| JP | 3-250012 | 11/1991 | |

(Continued)

*Primary Examiner* — Timothy Thompson
*Assistant Examiner* — Charles Pizzuto
(74) *Attorney, Agent, or Firm* — Oblon, McClelland, Maier & Neustadt, L.L.P.

(57) ABSTRACT

[Problem] Provided are: a pattern forming method by which a pattern can be formed by development using a thermosetting resin composition and a cured layer having excellent curability can be obtained; a thermosetting resin composition used in the pattern forming method; and a printed circuit board.

[Means for Solution] The pattern forming method according to the present invention is characterized by comprising the steps of: (A) forming a resin layer composed of an alkali-developable thermosetting resin composition comprising a photobase generator on a substrate; (B) activating the photobase generator contained in the alkali-developable thermosetting resin composition by irradiation with a light in a pattern form so as to cure an irradiated part; and (C) forming a negatively patterned layer by removing a non-irradiated part by alkali development.

17 Claims, 9 Drawing Sheets

(56) References Cited

U.S. PATENT DOCUMENTS

2009/0205857 A1* 8/2009 En et al. .................. 174/258
2010/0204433 A1* 8/2010 Eguchi et al. ............. 528/289

FOREIGN PATENT DOCUMENTS

| JP | 2004-240233 | 8/2004 |
| JP | 2010-258147 | 11/2010 |

* cited by examiner

PATTERN FORMING METHOD, ALKALI-DEVELOPABLE THERMOSETTING RESIN COMPOSITION, PRINTED CIRCUIT BOARD AND MANUFACTURING METHOD THEREOF

TECHNICAL FIELD

The present invention relates to a pattern forming method; an alkali-developable thermosetting resin composition used in the method; a printed circuit board produced by the method; and a method of producing a printed circuit board.

BACKGROUND ART

Conventionally, as a material used for a solder resist of a printed circuit board, a photocurable resin composition which can be developed with an aqueous alkaline solution is employed. For example, in Patent Documents 1 and 2, a photocurable resin composition which contains an epoxy acrylate-modified resin induced by modification of an epoxy resin (hereinafter, may be simply referred to as "epoxy acrylate") is used.

One example of a method of forming a solder resist using such a photocurable resin composition is a method in which a photocurable resin composition is coated and dried onto a substrate to form a resin layer and the resulting resin layer is then irradiated with a light in a pattern form and developed with an alkali developer, thereby forming a solder resist.

Meanwhile, Patent Document 3 discloses a composition which has an improved desmear resistance by not containing a thermosetting resin having a secondary hydroxyl group. Using this composition, for example, a solder resist is formed by screen printing.

Further, Patent Document 4 discloses a method of forming a solder resist layer composed of a thermosetting resin composition on one side of a printed circuit board and a solder resist layer composed of a photocurable resin composition on the other side. Patent Document 4 also discloses a method of forming an opening having a relatively small diameter on the solder resist composed of a thermosetting resin composition by laser processing and an opening having a relatively large diameter on the solder resist layer composed of a photocurable resin composition by photolithography.

RELATED ART DOCUMENTS

Patent Documents

[Patent Document 1] Japanese Unexamined Patent Application Publication No. S61-243869 (Claims)
[Patent Document 2] Japanese Unexamined Patent Application Publication No. H3-250012 (Claims)
[Patent Document 3] Japanese Unexamined Patent Application Publication No. 2004-240233 (Claims)
[Patent Document 4] Japanese Unexamined Patent Application Publication No. 2010-258147

SUMMARY OF THE INVENTION

Problems to be Solved by the Invention

However, since such photocurable thermosetting resin compositions as described in Patent Documents 1 and 2 contain an ester bond originated from epoxy acrylate, it is difficult to attain sufficient curing characteristics in such compositions. For example, these compositions do not have satisfactory resistance to a desmear solution.

Meanwhile, such a thermosetting resin composition as described in Patent Document 3 cannot be irradiated with a light to selectively cure the resulting irradiated part as in the case of a photocurable resin composition; therefore, a patterned layer cannot be formed by development. Accordingly, in the formation of a patterned layer using such a thermosetting resin composition as described in Patent Document 3, there is a problem that the formation method is restricted to a printing method, such as screen printing, or laser processing.

Furthermore, such a thermosetting resin composition of Patent Document 4 also cannot be irradiated with a light to selectively cure the resulting irradiated part as in the case of a photocurable resin composition; therefore, a patterned layer of a prescribed shape cannot be formed by development. Accordingly, it is thought to form a patterned layer by laser processing; however, in that case, an increased number of shots and the like lead to an increased task time.

In view of the above, an object of the present invention is to provide a pattern forming method by which a pattern can be formed by development using a thermosetting resin composition and a patterned layer having excellent curing characteristics can be formed; an alkali-developable thermosetting resin composition used in the pattern forming method; and a printed circuit board.

Another object of the present invention is to provide a patterned layer formed in a short task time; a printed circuit board having an opening; and production methods thereof.

Means for Solving the Problems

The present inventors intensively studied to solve the above-described problems and discovered that the above-described problems can be solved by the following constitution, thereby completing the present invention.

That is, the pattern forming method according to the present invention is characterized by comprising the steps of:

(A) forming a resin layer composed of an alkali-developable thermosetting resin composition comprising a photobase generator on a substrate;

(B) activating the photobase generator contained in the above-described alkali-developable thermosetting resin composition by irradiation with a light in a negative pattern so as to cure an irradiated part; and (C) forming a negatively patterned layer by removing a non-irradiated part by alkali development.

In the above-described step (B) of the pattern forming method according to the present invention, it is preferred that the irradiation with a light be performed such that the above-described alkali-developable thermosetting resin composition exhibits an exothermic peak in DSC measurement, or such that the exothermic onset temperature of the above-described alkali-developable thermosetting resin composition in DSC measurement becomes lower than that of the alkali-developable thermosetting resin composition in unirradiated state or the exothermic peak temperature of the above-described alkali-developable thermosetting resin composition in DSC measurement becomes lower than that of the alkali-developable thermosetting resin composition in unirradiated state.

It is preferred that the pattern forming method according to the present invention further comprise the ultraviolet irradiation step (D) after the above-described step (C).

It is preferred that the pattern forming method according to the present invention further comprise the heat-curing step (E) after the above-described step (C).

It is preferred that the pattern forming method according to the present invention further comprise the laser processing step (F).

It is preferred that the pattern forming method according to the present invention further comprise the desmearing step (G).

The alkali-developable thermosetting resin composition according to the present invention is an alkali-developable thermosetting resin composition to be used in any of the above-described pattern forming methods, which is characterized by comprising:

an alkali-developable resin, a heat-reactive compound and a photobase generator.

The printed circuit board according to the present invention is characterized by comprising a patterned layer formed by any one of the above-described pattern forming methods.

Further, the printed circuit board according to the present invention is characterized by comprising:

a patterned layer formed by irradiating a resin layer composed of an alkali-developable thermosetting resin composition comprising a photobase generator with a light in a negative pattern and then developing the resulting resin layer; and an opening formed on the thus formed patterned layer or other layer by laser processing.

In the printed circuit board according to the present invention, it is preferred that the above-described patterned layer be prepared by forming a resin layer by coating and drying the above-described alkali-developable thermosetting resin composition; activating the photobase generator contained in the alkali-developable thermosetting resin composition by irradiation with a light in a pattern form; and then removing an non-irradiated part by development to form a negative pattern.

Effects of the Invention

According to the present invention, a pattern forming method by which a pattern can be formed by development using a thermosetting resin composition and a patterned layer having excellent curing characteristics can be formed; a thermosetting resin composition used in the pattern forming method; and a printed circuit board can be provided. In addition, according to the present invention, a patterned layer in which distortion and shrinkage on curing are inhibited can be formed.

Further, according to the present invention, a patterned layer formed in a short task time, a printed circuit board having an opening, and production methods thereof can also be provided. Moreover, the patterned layer according to the present invention has excellent curing characteristics.

MODE FOR CARRYING OUT THE INVENTION

[Pattern Forming Method]

Figure 1:
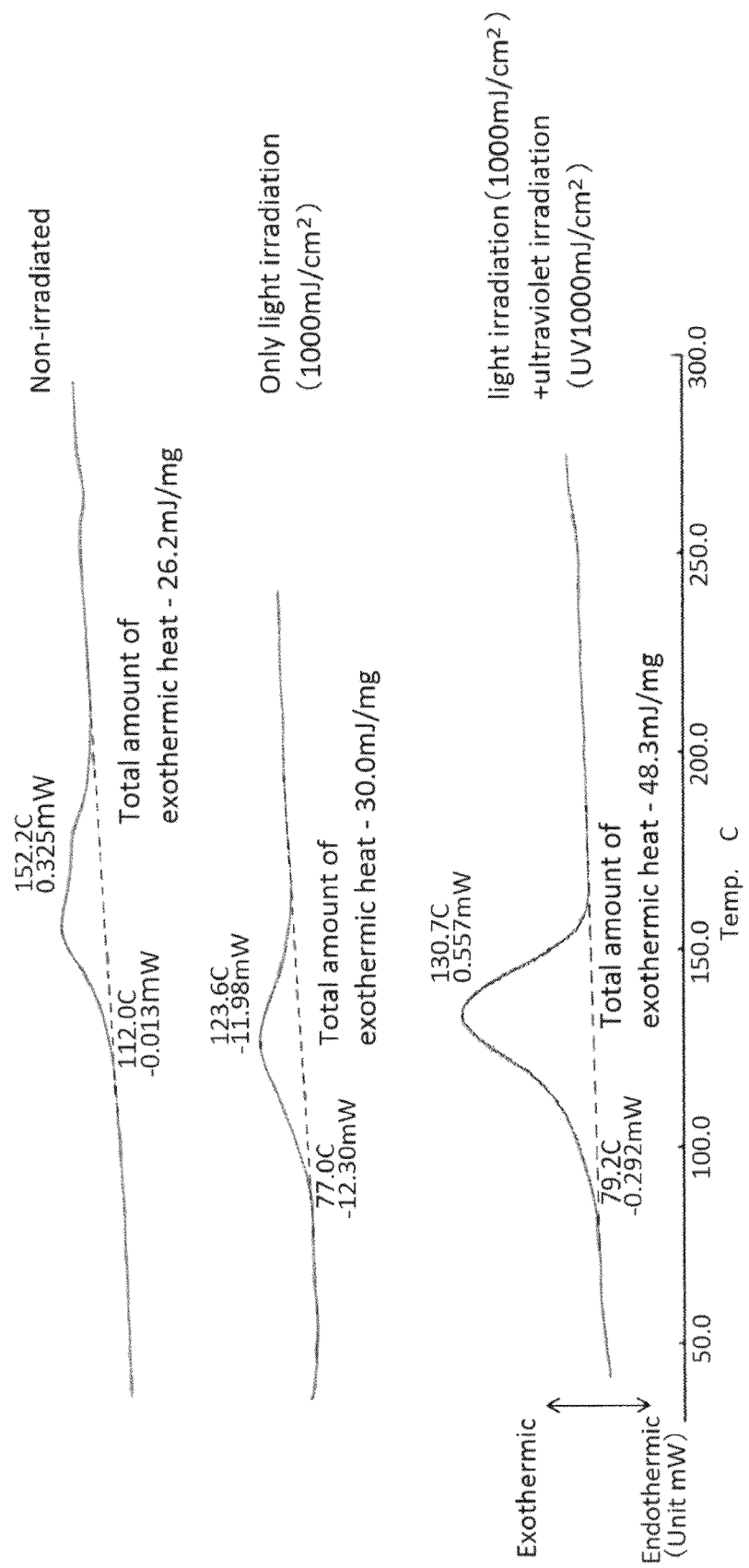
FIG. 1 shows the DSC charts for an irradiated part and a non-irradiated part of a layer composed of the thermosetting resin composition according to Example 1 of the present invention.

The pattern forming method according to the present invention comprises the steps of: (A) forming a resin layer composed of an alkali-developable thermosetting resin composition comprising a photobase generator (hereinafter, may be simply referred to as "thermosetting resin composition") on a substrate; (B) activating the photobase generator contained in the above-described thermosetting resin composition by irradiation with a light in a negative pattern so as to cure an irradiated part; and (C) forming a negatively patterned layer by removing a non-irradiated part by alkali development.

By irradiating the resin layer composed of the thermosetting resin composition with a light, the photobase generator on the surface of the irradiated part is activated to generate a basic substance (hereinafter, may be simply referred to as "base"). This generated base, in turn, destabilizes the photobase generator, which leads to further generation of the base. It is believed that such base generation in this manner allows the base to chemically propagate into a deep portion of the resin layer. Since the base then functions as a catalyst for an addition reaction between the alkali-developable resin and the heat-reactive compound and thereby allows the addition reaction to progress into a deep portion, the resin layer is cured even in a deep portion at the irradiated part. By developing the resulting resin layer with an aqueous alkaline solution to remove the non-irradiated part, a negatively patterned layer can be formed.

Further, since the curing of the thermosetting resin composition according to the present invention proceeds by, for example, epoxy ring-opening reactions induced by thermal reaction, distortion and shrinkage on curing can be inhibited as compared to a case where the curing is advanced by photoreaction.

Here, it is preferred that the pattern forming method according to the present invention comprise, after the step (B), the step (B1) of heating the resulting resin layer. By this, the resin layer is sufficiently cured, so that a patterned layer having even superior curing characteristics can be obtained.

[Step (A)]

The step (A) is a step of forming a resin layer composed of a thermosetting resin composition on a substrate. The step (A) is, for example, a step of forming a resin layer by coating and drying a thermosetting resin composition onto a substrate or a step of laminating a thermosetting resin composition in the form of a dry film onto a substrate.

As a method of coating a thermosetting resin composition onto a substrate, a known means such as a blade coater, a lip coater, a comma coater or a film coater may be used. Further, as a drying method, a known method such as a method in which, in a dryer equipped with a heat source of a steam-heating system (e.g., a hot air circulation-type drying oven, an IR furnace, a hot plate or a convection oven), a hot-air is allowed to circulate in contact with the thermosetting resin composition or blown against a support from a nozzle, may be employed.

As the substrate, in addition to a printed circuit substrate and a flexible printed circuit substrate, for example, a copper-clad laminate of any grade (for example, FR-4) in which a composite material such as a paper-phenol resin, a paper-epoxy resin, a glass cloth-epoxy resin, a glass-polyimide, a glass cloth/nonwoven fabric-epoxy resin, a glass cloth/paper-epoxy resin, a synthetic fiber-epoxy resin, a fluorocarbon resin-polyethylene-polyphenylene-PPO-cyanate ester composite is used, a polyimide film, a PET film, a glass substrate, a ceramic substrate and a wafer substrate can be used.

[Step (B)]

The step (B) is a step of activating the photobase generator contained in the thermosetting resin composition by irradiation with a light in a negative pattern so as to cure an irradiated part. In the step (B), by the work of the base generated at the irradiated part, the photobase generator is destabilized and the base chemically propagates, thereby allowing the resin layer to be sufficiently cured even in a deep portion.

In the step (B), it is preferred that the irradiation with a light be performed such that the exothermic onset temperature of the thermosetting resin composition in DSC measurement becomes lower than that of the thermosetting resin composition in unirradiated state or the exothermic peak temperature of the thermosetting resin composition in DSC measurement becomes lower than that of the thermosetting resin composition in unirradiated state.

Here, the difference in the exothermic onset temperature (hereinafter, may also be referred to as "ΔTstart") or the difference in the exothermic peak temperature (hereinafter, may also be referred to as "ΔTpeak") between irradiated and non-irradiated thermosetting resin compositions, which is determined by DSC measurement, is preferably not less than 10° C., more preferably not less than 20° C., still more preferably not less than 30° C.

By controlling the ΔTstart or ΔTpeak to be 10° C. or larger, occurrence of so-called "fogging" where a non-irradiated part is left unremoved after alkali development or so-called "erosion" where an irradiated part is removed by alkali development can be inhibited. In addition, when the ΔTstart or ΔTpeak is 10° C. or larger, in the step (B1), the ranges of the heating temperature and heating time can be set wide.

Further, depending on the thermosetting resin composition, the irradiation with a light in the step (B) may also be performed such that the thermosetting resin composition exhibits an exothermic peak in DSC measurement only after being irradiated.

The term "ΔTstart" refers to a difference between the exothermic onset temperature representing the start of the curing reaction of irradiated thermosetting resin composition and the exothermic onset temperature of non-irradiated thermosetting resin composition, which temperatures are determined by preparing thermosetting resin compositions having the same constitution, irradiating only one of them with a light to leave the other non-irradiated and then subjecting the respective thermosetting resin compositions to DSC (Differential Scanning calorimetry) measurement. The term "ΔTpeak" refers to a difference in the exothermic peak temperature between irradiated and non-irradiated thermosetting resin compositions, which is determined by performing DSC measurement in the same manner.

The irradiation dose used in the DSC measurement is one at which, when the irradiation dose is increased, there is no longer a shift in the exothermic peak temperature caused by irradiation of the thermosetting resin composition (saturation dose).

As a light irradiation apparatus used for the above-described light irradiation, for example, a direct imaging device capable of irradiating a laser light, a lamp light or an LED light can be employed. The mask used for the patterned light irradiation is a negative-type mask.

As an active energy ray, it is preferred to use a laser light or a scattering light which has the maximum wavelength in the range of 350 to 410 nm. By using such a light having the maximum wavelength in this range, the photobase generator can be efficiently activated. The laser light may be either a gas laser or a solid-state laser as long as it has the maximum wavelength in the above-described range. Further, although the exposure does is variable depending on the film thickness and the like, it may be set in the range of generally 100 to 1,500 mJ/cm$^2$, preferably 300 to 1,500 mJ/cm$^2$.

[Step (B1)]

The step (B1) is a step of curing the irradiated part by heating. In the step (B1), the resin layer can be cured into a deep portion by the work of the base generated in the step (B).

It is preferred that the heating be performed at a temperature at which the irradiate part of the thermosetting resin composition is thermally cured but not the non-irradiated part.

For example, in the step (B1), it is preferred that the heating be performed at a temperature which is lower than the exothermic onset temperature or the exothermic peak temperature of the thermosetting resin composition in unirradiated state and higher than the exothermic onset temperature or the exothermic peak temperature of the irradiated thermosetting resin composition. By performing the heating in this manner, only the irradiated part can be selectively cured.

Here, the heating temperature is, for example, 80 to 140° C. By setting the heating temperature at 80° C. or higher, the irradiated part can be sufficiently cured. Meanwhile, by setting the heating temperature at 140° C. or lower, only the irradiated part can be selectively cured. The heating time is, for example, 10 to 100 minutes. The heating method is the same as the above-described drying method.

At the non-irradiated part, since no base is generated from the photobase generator, heat-curing is inhibited.

[Step (C)]

The step (C) is a step of forming a negatively patterned layer by removing the non-irradiated part by alkali development.

As a development method, for example, a known method such as a dipping method, a shower method, a spray method or a brushing method may be employed. Further, as a developer, an aqueous alkaline solution of potassium hydroxide, sodium hydroxide, sodium carbonate, potassium carbonate, sodium phosphate, sodium silicate, ammonia, an amine such as ethanolamine, tetramethyl ammonium hydroxide (TMAH) or the like, or a mixed solution thereof may be employed.

[Step (D)]

It is preferred that the pattern forming method according to the present invention further comprise the ultraviolet irradiation step (D) after the step (C).

In the step (D), the photobase generator remaining in the patterned layer formed by the step (B) without being activated is activated to generate a base.

The wavelength of the ultraviolet light and the amount of irradiation (exposure dose) in the step (D) may be the same as or different from those used in the step (B). The amount of irradiation (exposure dose) is, for example, 150 to 2,000 mJ/cm$^2$.

[Step (E)]

It is preferred that the pattern forming method according to the present invention further comprise the heat-curing (post-curing) step (E) after the step (C).

In cases where both the steps (D) and (E) are performed after the step (C), it is preferred that the step (E) be performed after the step (D).

In the step (E), the patterned layer is sufficiently heat-cured by the work of the base generated from the photobase generator in the step (B) or the steps (B) and (D). Since the non-irradiated part has already been removed by the time of performing the step (E), the step (E) can be performed at a temperature not lower than the temperature at which the curing reaction of the non-irradiated thermosetting resin composition begins. By this, the patterned layer can be sufficiently heat-cured. The heating temperature is, for example, 160° C. or higher.

[Step (F)]

The pattern forming method according to the present invention may further comprise the laser processing step (F). By laser processing, a finer opening can be formed. As the laser, a known laser such as YAG laser, $CO_2$ laser or excimer laser may be employed.

The step (F) is preferably performed after the step (C), or in cases where the step (D) and/or the step (E) is/are performed, the step (F) is preferably performed after the step (D) and/or the step (E).

[Step (G)]

It is preferred that the pattern forming method according to the present invention further comprise the desmearing step (G) after the step (F).

The step (G) comprises a process of facilitating the removal of smear by swelling (smear swelling step), a process of removing the smear (smear removal step) and a process of neutralizing a sludge generated from a desmear solution used in the smear removal step (neutralization step).

The smear swelling step is performed by using an alkaline chemical solution such as sodium hydroxide and facilitates the removal of smear by a desmear chemical solution.

In the smear removal step, the smear is removed by using an acidic chemical solution containing an oxidizing agent such as a bichromate or a permanganate.

In the neutralization step, the oxidizing agent used in the smear removal step is reduced and removed with an alkaline chemical solution such as sodium hydroxide.

[Alkali-developable Thermosetting Resin Composition]

The thermosetting resin composition used in the pattern forming method of the present invention comprises an alkali-developable resin, a heat-reactive compound and a photobase generator. Further, it is preferred that the thermosetting resin composition used in the below-described printed circuit board of the present invention also comprise an alkali-developable resin, a heat-reactive compound and a photobase generator.

Here, it is preferred that the thermosetting resin composition be one which exhibits a shift of the exothermic onset temperature or exothermic peak temperature to the low temperature side in DSC measurement or exhibits an exothermic peak in DSC measurement only after being irradiated with a light.

[Alkali-Developable Resin]

The alkali-developable resin contains at least one functional group selected from phenolic hydroxyl group, thiol group and carboxyl group. The alkali-developable resin is a resin which can be developed with an alkaline solution, and preferred examples thereof include compounds having two or more phenolic hydroxyl groups; carboxyl group-containing resins; compounds having a phenolic hydroxyl group and a carboxyl group; and compounds having two or more thiol groups.

Examples of the compounds having two or more two or more phenolic hydroxyl groups include known and commonly-used phenol resins such as phenol novolac resins, alkylphenol novolac resins, bisphenol A-type novolac resins, dicyclopentadiene-type phenol resins, xylok-type phenol resins, terpene-modified phenol resins, polyvinylphenols, bisphenol F, bisphenol S-type phenol resins, poly-p-hydroxystyrenes, condensation products of naphthol and an aldehyde and condensation products of dihydroxynaphthalene and an aldehyde.

Further, as a phenol resin, one having a variety of skeletons, which is synthesized by using a compound having a biphenyl skeleton or a phenylene skeleton or both of these skeletons and a phenolic hydroxyl group-containing compound such as phenol, o-cresol, p-cresol, m-cresol, 2,3-xylenol, 2,4-xylenol, 2,5-xylenol, 2,6-xylenol, 3,4-xylenol, 3,5-xylenol, catechol, resorcinol, hydroquinone, methylhydroquinone, 2,6-dimethylhydroquinone, trimethylhydroquinone, pyrogallol or phloroglucinol, may also be used.

These resins may be used individually, or two or more thereof may be used in combination.

As a carboxyl-group containing resin, a known carboxyl group-containing resin can be employed. The presence of a carboxyl group makes the resin composition developable with an alkali. Further, a compound which has an ethylenically unsaturated bond along with a carboxyl group in the molecule may also be used; however, in the present invention, as a carboxyl-group containing resin, it is preferred to use only a carboxyl group-containing resin which has no ethylenically unsaturated double bond, such as the one described in (1) below.

Specific examples of carboxyl group-containing resins that may be used in the present invention include the following compounds (that may each be either an oligomer or a polymer).

(1) A carboxyl group-containing resin obtained by copolymerization of an unsaturated carboxylic acid, such as (meth)acrylic acid, and an unsaturated group-containing compound such as styrene, α-methylstyrene, a lower alkyl (meth)acrylate or isobutylene. Here, the term "lower alkyl" refers to an alkyl group having 1 to 5 carbon atoms.

(2) A carboxyl group-containing urethane resin obtained by a polyaddition reaction of a diisocyanate (e.g., an aliphatic diisocyanate, a branched aliphatic diisocyanate, an alicyclic diisocyanate or an aromatic diisocyanate), a carboxyl group-containing dialcohol compound (e.g., dimethylol propionic acid or dimethylol butanoic acid) and a diol compound (e.g., a polycarbonate-based polyol, a polyether-based polyol, a polyester-based polyol, a polyolefin-based polyol, an acrylic polyol, a bisphenol A-type alkylene oxide adduct diol or a compound having a phenolic hydroxyl group and an alcoholic hydroxyl group).

(3) A terminal carboxyl group-containing urethane resin obtained by allowing an acid anhydride to react with a terminal of a urethane resin produced by a polyaddition reaction of a diisocyanate compound (e.g., an aliphatic diisocyanate, a branched aliphatic diisocyanate, an alicyclic diisocyanate or an aromatic diisocyanate) and a diol compound (e.g., a polycarbonate-based polyol, a polyether-based polyol, a polyester-based polyol, a polyolefin-based polyol, an acrylic polyol, a bisphenol A-type alkylene oxide adduct diol or a compound having a phenolic hydroxyl group and an alcoholic hydroxyl group).

(4) A carboxyl group-containing urethane resin obtained by a polyaddition reaction of a diisocyanate; a (meth)acrylate or partial acid anhydride-modified product of a bifunctional epoxy resin such as a bisphenol A-type epoxy resin, a hydrogenated bisphenol A-type epoxy resin, a bisphenol F-type epoxy resin, a bisphenol S-type epoxy resin, a bixylenol-type epoxy resin or a biphenol-type epoxy resin; a carboxyl group-containing dialcohol compound; and a diol compound.

(5) A carboxyl group-containing urethane resin having a (meth)acrylated terminal, which is obtained by adding a compound having one hydroxyl group and at least one (meth)acryloyl group in the molecule, such as hydroxyalkyl (meth)acrylate, during the synthesis of the resin described in the above (2) or (4).

(6) A carboxyl group-containing urethane resin having a (meth)acrylated terminal, which is obtained by adding a compound having one isocyanate group and at least one (meth)acryloyl group in the molecule, such as an equimolar reaction product of isophorone diisocyanate and pentaerythritol triacrylate, during the synthesis of the resin described in the above (2) or (4).

(7) A carboxyl group-containing resin obtained by allowing the below-described polyfunctional (solid) epoxy resin to react with an unsaturated monocarboxylic acid such as (meth)acrylic acid and then adding a dibasic acid anhydride, such as phthalic anhydride, tetrahydrophthalic anhydride or hexahydrophthalic anhydride, to a hydroxyl group existing in the side chain of the resulting resin.

(8) A carboxyl group-containing resin obtained by allowing the below-described polyfunctional (solid) epoxy resin to react with a saturated monocarboxylic acid and then adding a dibasic acid anhydride, such as phthalic anhydride, tetrahydrophthalic anhydride or hexahydrophthalic anhydride, to a hydroxyl group existing in the side chain of the resulting resin.

(9) A carboxyl group-containing resin obtained by allowing a polyfunctional epoxy resin, which is prepared by further epoxidizing a hydroxyl group of the below-described bifunctional (solid) epoxy resin with epichlorohydrin, to react with (meth)acrylic acid and then adding a dibasic acid anhydride to the resulting hydroxyl group.

(10) A carboxyl group-containing polyester resin obtained by allowing the below-described polyfunctional oxetane resin to react with a dicarboxylic acid and then adding a dibasic acid anhydride to the resulting primary hydroxyl group.

(11) A carboxyl group-containing resin obtained by allowing a reaction product, which is generated by a reaction between a compound having a plurality of phenolic hydroxyl groups in one molecule and an alkylene oxide such as ethylene oxide or propylene oxide, to react with a polybasic acid anhydride.

(12) A carboxyl group-containing resin obtained by allowing a reaction product, which is generated by a reaction between a compound having a plurality of phenolic hydroxyl groups in one molecule and an alkylene oxide such as ethylene oxide or propylene oxide, to react with a saturated monocarboxylic acid and then further allowing the thus obtained reaction product to react with a polybasic acid anhydride.

(13) A carboxyl group-containing resin obtained by allowing a reaction product, which is generated by a reaction between a compound having a plurality of phenolic hydroxyl groups in one molecule and an alkylene oxide such as ethylene oxide or propylene oxide, to react with an unsaturated group-containing monocarboxylic acid and then further allowing the thus obtained reaction product to react with a polybasic acid anhydride.

(14) A carboxyl group-containing resin obtained by allowing a reaction product, which is generated by a reaction between a compound having a plurality of phenolic hydroxyl groups in one molecule and a cyclic carbonate compound such as ethylene carbonate or propylene carbonate, to react with a saturated monocarboxylic acid and then further allowing the thus obtained reaction product to react with a polybasic acid anhydride.

(15) A carboxyl group-containing resin obtained by allowing a reaction product, which is generated by a reaction between a compound having a plurality of phenolic hydroxyl groups in one molecule and a cyclic carbonate compound such as ethylene carbonate or propylene carbonate, to react with a polybasic acid anhydride.

(16) A carboxyl group-containing resin obtained by allowing a reaction product, which is generated by a reaction between a compound having a plurality of phenolic hydroxyl groups in one molecule and a cyclic carbonate compound such as ethylene carbonate or propylene carbonate, to react with an unsaturated group-containing monocarboxylic acid and then further allowing the thus obtained reaction product to react with a polybasic acid anhydride.

(17) A carboxyl group-containing resin obtained by allowing an epoxy compound having a plurality of epoxy groups in one molecule to react with a compound having at least one alcoholic hydroxyl group and one phenolic hydroxyl group in one molecule, such as p-hydroxyphenethyl alcohol, and a saturated monocarboxylic acid; and then allowing the alcoholic hydroxyl group(s) of the resulting reaction product to react with a polybasic acid anhydride such as maleic anhydride, tetrahydrophthalic anhydride, trimellitic anhydride, pyromellitic anhydride or adipic acid.

(18) A carboxyl group-containing resin obtained by allowing an epoxy compound having a plurality of epoxy groups in one molecule to react with a compound having at least one alcoholic hydroxyl group and one phenolic hydroxyl group in one molecule, such as p-hydroxyphenethyl alcohol; and then allowing the alcoholic hydroxyl group(s) of the resulting reaction product to react with a polybasic acid anhydride such as maleic anhydride, tetrahydrophthalic anhydride, trimellitic anhydride, pyromellitic anhydride or adipic acid.

(19) A carboxyl group-containing resin obtained by allowing an epoxy compound having a plurality of epoxy groups in one molecule to react with a compound having at least one alcoholic hydroxyl group and one phenolic hydroxyl group in one molecule, such as p-hydroxyphenethyl alcohol, and an unsaturated group-containing monocarboxylic acid such as (meth)acrylic acid; and then allowing the alcoholic hydroxyl group(s) of the resulting reaction product to react with a polybasic acid anhydride such as maleic anhydride, tetrahydrophthalic anhydride, trimellitic anhydride, pyromellitic anhydride or adipic acid.

(20) A carboxyl group-containing resin obtained by further adding a compound having one epoxy group and one or more (meth)acryloyl groups in the molecule, such as glycidyl (meth)acrylate or α-methylglycidyl (meth)acrylate, to any one of the resins described in the above (1) to (19).

Since the above-described alkali-developable resins have a plurality of carboxyl groups and/or hydroxy groups in the side chain of the respective backbone polymers, they can be developed with an aqueous alkaline solution.

The hydroxyl group equivalent or carboxyl group equivalent of the above-described carboxyl group-containing resins is preferably 80 to 900 g/eq., more preferably 100 to 700 g/eq. When the hydroxyl group equivalent or carboxyl group equivalent is higher than 900 g/eq., the resulting patterned layer may not be able to have an adhesive property and the alkali development may become difficult. Meanwhile, when the hydroxyl group equivalent or carboxyl group equivalent is less than 80 g/eq., since the developer further dissolves the irradiated part, the resulting lines become excessively thin and in some cases, the irradiated and non-irradiated parts may be indistinctively dissolved and detached by the developer, making it difficult to draw a normal resist pattern, which is not preferred. Further, when the carboxyl group equivalent or phenol group equivalent is large, even a resin composition containing only a small amount of an alkali-developable resin can be developed, which is preferred.

Further, the weight-average molecular weight of the alkali-developable resin used in the present invention varies depending on the resin skeleton; however, in general, it is preferably in the range of 2,000 to 150,000, more preferably in the range of 5,000 to 100,000. When the weight-average molecular weight is less than 2,000, the tack-free performance may be impaired and the moisture resistance of the resulting resin layer after light irradiation may become poor to cause a reduction in the film during development, which may greatly deteriorate the resolution. Meanwhile, when the weight-average molecular weight is higher than 150,000, the developing property may be markedly deteriorated and the storage stability may be impaired.

It is noted here that the term "(meth)acrylate" used herein is a general term for acrylates, methacrylates and mixtures thereof and this is hereinafter applicable to all of similar expressions.

Examples of the compounds having thiol groups include trimethylolpropane tristhiopropionate, pentaerythritol tetrakisthiopropionate, ethylene glycol bisthioglycolate, 1,4-butanediol bisthioglycolate, trimethylolpropane tristhioglycolate, pentaerythritol tetrakisthioglycolate, di(2-mercaptoethyl)ether, 1,4-butanedithiol, 1,3,5-trimercaptomethyl benzene, 1,3,5-trimercaptomethyl-2,4,6-trimethyl benzene, terminal thiol group-containing polyethers, terminal thiol group-containing polythioethers, thiol compounds obtained by a reaction between an epoxy compound and hydrogen sulfide, and terminal thiol group-containing thiol compounds obtained by a reaction between a polythiol compound and an epoxy compound.

It is preferred that the alkali-developable resin be a carboxyl group-containing resin or a compound having a phenolic hydroxyl group.

Further, it is also preferred that the alkali-developable resin be a non-photosensitive resin having no photocurable structure, such as epoxy acrylate. Since such a non-photosensitive alkali-developable resin does not have an ester bond originated from epoxy acrylate, it is highly resistant to a desmear solution. Therefore, a patterned layer having excellent curing characteristics can be formed. Moreover, because of the absence of photocurable structure, distortion and shrinkage on curing can be inhibited.

When the alkali-developable resin is a carboxyl-group containing resin, as compared to a case of a phenolic resin, the resin can be developed with a weaker aqueous alkaline solution. Examples of a weak aqueous alkaline solution include solutions in which sodium carbonate or the like is dissolved. By developing the resin with a weak aqueous alkaline solution, development of the irradiated part can be inhibited. In addition, the light irradiation time in the step (B) and the heating time in the step (B1) can be shortened.

[Heat-reactive Compound]

The heat-reactive compound is a resin having a functional group which can undergo a curing reaction when heated. Examples thereof include epoxy resins and polyfunctional oxetane compounds.

The above-described epoxy resins are resins having an epoxy group and, as such an epoxy resin, any known epoxy resin can be used. Examples thereof include bifunctional epoxy resins having two epoxy groups in the molecule and polyfunctional epoxy resins having a plurality of epoxy groups in the molecule. The epoxy resin may also be a hydrogenated bifunctional epoxy compound.

Examples of polyfunctional epoxy compounds include bisphenol A-type epoxy resins, brominated epoxy resins, novolac-type epoxy resins, bisphenol F-type epoxy resins, hydrogenated bisphenol A-type epoxy resins, glycidyl amine-type epoxy resins, hydantoin-type epoxy resins, alicyclic epoxy resins, trihydroxyphenyl methane-type epoxy resins, bixylenol-type or biphenol-type epoxy resins, and mixtures of these resins, as well as bisphenol S-type epoxy resins, bisphenol A novolac-type epoxy resins, tetraphenylolethane-type epoxy resins, heterocyclic epoxy resins, diglycidyl phthalate resins, tetraglycidyl xylenoylethane resins, naphthalene group-containing epoxy resins, epoxy resins having a dicyclopentadiene skeleton, glycidyl methacrylate copolymer-based epoxy resins, cyclohexylmaleimide-glycidyl methacrylate copolymer epoxy resins and CTBN-modified epoxy resin.

Examples of other liquid bifunctional epoxy resins include alicyclic epoxy resins such as vinylcyclohexene diepoxide, (3',4'-epoxycyclohexylmethyl)-3,4-epoxycyclohexane carboxylate and (3',4'-epoxy-6'-methylcyclohexylmethyl)-3,4-epoxy-6-methylcyclohexane carboxylate. These epoxy resins may be used individually, or two or more thereof may be used in combination. A naphthalene group-containing epoxy resin is preferred since the thermal expansion of the resulting cured product can be inhibited.

Examples of the above-described polyfunctional oxetane compounds include polyfunctional oxetanes such as bis[(3-methyl-3-oxcetanylmethoxy)methyl]ether, bis[(3-ethyl-3-oxcetanylmethoxy)methyl]ether, 1,4-bis[(3-methyl-3-oxcetanylmethoxy)methyl]benzene, 1,4-bis[(3-ethyl-3-oxcetanylmethoxy)methyl]benzene, (3-methyl-3-oxcetanyl)methyl acrylate, (3-ethyl-3-oxcetanyl)methyl acrylate, (3-methyl-3-oxcetanyl)methyl methacrylate, (3-ethyl-3-oxcetanyl)methyl methacrylate, and oligomers and copolymers thereof; and etherification products of an oxetane alcohol and a resin having a hydroxyl group such as a novolac resin, a poly(p-hydroxystyrene), a cardo-type bisphenol, a calixarene, a calix resorcin arene or a silsesquioxane. In addition, examples of the polyfunctional oxetane compounds also include copolymers of an unsaturated monomer having an oxetane ring and an alkyl (meth)acrylate.

Here, it is preferred that the heat-reactive compound have a benzene skeleton since it leads to an improved heat resistance. Further, in cases where the thermosetting resin composition contains a white pigment, it is preferred that the heat-reactive compound have an alicyclic skeleton. By this, the photoreactivity of the thermosetting resin composition can be improved.

The amount of the above-described heat-reactive compound to be incorporated is, in terms of its equivalence ratio to the alkali-developable resin (heat-reactive group:alkali-developable group), is preferably 1:0.1 to 1:10, more preferably 1:0.2 to 1:5. When the blending ratio is in this range, the development process is efficiently carried out.

[Photobase Generator]

The photobase generator is a compound which generates at least one basic substance capable of functioning as a catalyst in the polymerization reaction of the above-described heat-reactive compound when the molecular structure is modified or the molecule is cleaved by irradiation with an ultraviolet light, a visible light or the like. Examples of the basic substance include secondary amines and tertiary amines.

Examples of the photobase generator include α-aminoacetophenone compounds; oxime ester compounds; and compounds having a substituent such as an acyloxyimino group, an N-formylated aromatic amino group, an N-acylated aromatic amino group, a nitrobenzyl carbamate group or an alkoxybenzyl carbamate group.

An α-aminoacetophenone compound has a benzoin ether bond in the molecule and undergoes intramolecular cleavage when irradiated with a light, generating a basic substance (amine) which exerts an effect as a curing catalyst. Specific examples of such α-aminoacetophenone compound include commercially available compounds, such as (4-morpholinobenzoyl)-1-benzyl-1-dimethylaminopropane (IRGACURE 369, trade name; manufactured by BASF Japan Ltd.), 4-(methylthiobenzoyl)-1-methyl-1-morpholinoethane (IRGACURE 907, trade name; manufactured by BASF Japan Ltd.) and 2-(dimethylamino)-2-[(4-methylphenyl)methyl]-1-[4-(4-morpholinyl)phenyl]-1-butanone (IRGACURE 379, trade name; manufactured by BASF Japan Ltd.), and solutions of these compounds.

As an oxime ester compound, any compound which generates a basic substance when irradiated with a light can be used. Examples of commercially available oxime ester compound include CGI-325, IRGACURE OXE01 and IRGACURE OXE02, which are manufactured by BASF Japan Ltd.; and N-1919 and NCI-831, which are manufactured by ADEKA Corporation. Further, a compound having two oxime ester groups in the molecule can also be suitably used, and specific examples thereof include those oxime ester compounds having a carbazole structure that are represented by the following formula:

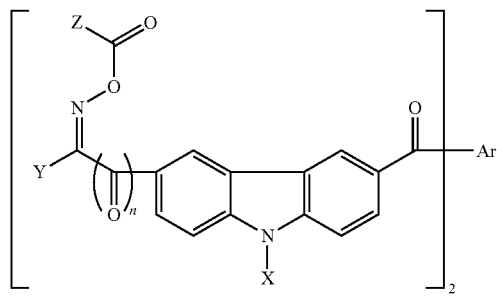

(wherein, X represents a hydrogen atom, an alkyl group having 1 to 17 carbon atoms, an alkoxy group having 1 to 8 carbon atoms, a phenyl group, a phenyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), a naphthyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms); Y and Z each independently represent a hydrogen atom, an alkyl group having 1 to 17 carbon atoms, an alkoxy group having 1 to 8 carbon atoms, a halogen group, a phenyl group, a phenyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), a naphthyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), an anthryl group, a pyridyl group, a benzofuryl group or a benzothienyl group; Ar represents a bond, an alkylene having 1 to 10 carbon atoms, a vinylene, a phenylene, a biphenylene, a pyridylene, a naphthylene, a thiophene, an anthrylene, a thienylene, a furylene, 2,5-pyrrole-diyl, 4,4'-stilbene-diyl or 4,2'-styrene-diyl; and n is an integer of 0 or 1).

Particularly, in the above-described formula, it is preferred that X and Y be each a methyl group or an ethyl group; Z be methyl or phenyl; n be 0; and Ar be a bond, phenylene, naphthylene, thiophene or thienylene.

Further, examples of preferred carbazole oxime ester compound include those compounds that are represented by the following formula:

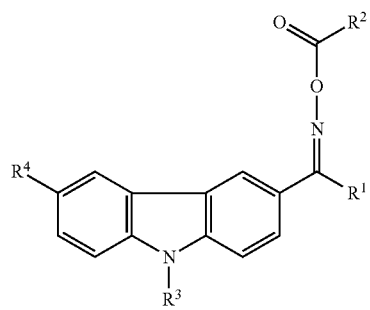

(wherein, $R^1$ represents an alkyl group having 1 to 4 carbon atoms or a phenyl group which is optionally substituted with a nitro group, a halogen atom or an alkyl group having 1 to 4 carbon atoms;

$R^2$ represents an alkyl group having 1 to 4 carbon atoms, an alkoxy group having 1 to 4 carbon atoms or a phenyl group which is optionally substituted with an alkyl or alkoxy group having 1 to 4 carbon atoms;

$R^3$ is optionally linked via an oxygen atom or a sulfur atom and represents an alkyl group having 1 to 20 carbon atoms which is optionally substituted with a phenyl group or a benzyl group which is optionally substituted with an alkoxy group having 1 to 4 carbon atoms;

$R^4$ represents a nitro group or an acyl group represented by X—C(=O)—; and

X represents an aryl group which is optionally substituted with an alkyl group having 1 to 4 carbon atoms, a thienyl group, a morpholino group, a thiophenyl group or a structure represented by the following formula).

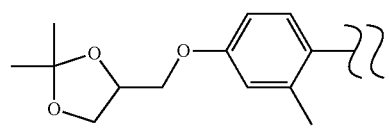

In addition to the above, examples of preferred carbazole oxime ester compound also include those described in Japanese Unexamined Patent Application Publication Nos. 2004-359639, 2005-097141, 2005-220097, 2006-160634, 2008-094770 and 2011-80036 and Japanese Translated PCT Patent Application Laid-open Nos. 2008-509967 and 2009-040762.

Specific examples of the compounds having an acyloxyimino group include O,O'-succinic acid diacetophenone oxime, O,O'-succinic acid dinaphthophenone oxime and benzophenone oxime acrylate-styrene copolymer.

Specific examples of the compounds having an N-formylated aromatic amino group or an N-acylated aromatic amino group include di-N-(p-formylamino)diphenyl methane, di-N (p-acetylamino)diphenyl methane, di-N-(p-benzamide)diphenyl methane, 4-formylaminotolylene, 4-acetylaminotolylene, 2,4-diformylaminotolylene, 1-formylaminonaphthalene, 1-acetylaminonaphthalene, 1,5-diformylaminonaphthalene, 1-formylaminoanthracene, 1,4-diformylaminoanthracene, 1-acetylaminoanthracene, 1,4-diformylaminoanthraquinone, 1,5-diformylaminoanthraquinone, 3,3'-dimethyl-4,4'-diformylaminobiphenyl and 4,4'-diformylamino benzophenone.

Specific examples of the compounds having a nitrobenzyl carbamate group or an alkoxybenzyl carbamate group include bis{{(2-nitrobenzyl)oxy}carbonyl} diamino diphenylmethane, 2,4-di{{(2-nitrobenzyl)oxy}tolylene, bis{{(2-nitrobenzyloxy)carbonyl}hexane-1,6-diamine and m-xylidine {{(2-nitro-4-chlorobenzyl)oxy}amide}.

The photobase generator is preferably an oxime ester compound or an α-aminoacetophenone compound. As the α-aminoacetophenone compound, one which has two or more nitrogen atoms is particularly preferred.

As other photobase generator, for example, WPBG-018 (trade name: 9-anthrylmethyl N,N'-diethylcarbamate), WPBG-027 (trade name: (E)-1-[3-(2-hydroxyphenyl)-2-propenoyl]piperidine), WPBG-082 (trade name: guanidinium-2-(3-benzoylphenyl)propionate) and WPBG-140 (trade name: 1-(anthraquinon-2-yl)ethyl imidazole carboxylate) can also be used.

Further, those photobase generators that are described in, for example, Japanese Unexamined Patent Application Publication Nos. H11-71450, 2003-20339, 2003-212856, 2003-344992, 2007-86763, 2007-231325, 2008-3581, 2008-3582, 2009-280785, 2009-080452, 2010-95686, 2010-126662, 2010-185010, 2010-185036, 2010-186054, 2010-186056, 2010-275388, 2010-222586, 2010-084144, 2011-107199, 2011-236416 and 2011-080032, WO 2002/051905 and WO 2008/072651, can also be used.

The above-described photobase generators may be used individually, or two or more thereof may be used in combination. The amount of the photobase generator(s) to be incorporated in the thermosetting resin composition is preferably 1 to 50 parts by mass, more preferably 1 to 40 parts by mass, with respect to 100 parts by mass of the heat-reactive compound. When the amount is less than 1 part by mass, the development may become difficult, which is not preferred.

(Maleimide Compound)

The thermosetting resin composition according to the present invention may also contain a maleimide compound.

Examples of the maleimide compound include polyfunctional aliphatic/alicyclic maleimides and polyfunctional aromatic maleimides. Examples of the polyfunctional aliphatic/alicyclic maleimides include N,N'-methylenebismaleimide; N,N'-ethylenebismaleimide; maleimide ester compounds having an isocyanurate skeleton, which are obtained by dehydration esterification of tris(hydroxyethyl)isocyanurate and an aliphatic/alicyclic maleimide carboxylic acid; polymaleimides having an isocyanurate skeleton, such as maleimide urethane compounds having an isocyanurate skeleton which are obtained by urethanization of tris(carbamatehexyl)isocyanurate and an aliphatic/alicyclic maleimide alcohol; isophorone bisurethane bis(N-ethylmaleimide); triethylene glycol bis(maleimideethylcarbonate); aliphatic/alicyclic polymaleimide ester compounds obtained by dehydration esterification of an aliphatic/alicyclic maleimide carboxylic acid and a variety of aliphatic/alicyclic polyols or by a transesterification reaction between an aliphatic/alicyclic maleimide carboxylic acid ester and a variety of aliphatic/alicyclic polyols; aliphatic/alicyclic polymaleimide ester compounds obtained by an ether ring-opening reaction between an aliphatic/alicyclic maleimide carboxylic acid and a variety of aliphatic/alicyclic polyepoxides; and aliphatic/alicyclic polymaleimide urethane compounds obtained by urethanization of an aliphatic/alicyclic maleimide alcohol and a variety of aliphatic/alicyclic polyisocyanates.

Examples of the polyfunctional aromatic maleimides include polyfunctional aromatic maleimides, such as aromatic polymaleimide ester compounds obtained by dehydration esterification of a maleimide carboxylic acid and a variety of aromatic polyols or by a transesterification reaction between a maleimide carboxylic acid ester and a variety of aromatic polyols; aromatic polymaleimide ester compounds obtained by an ether ring-opening reaction between a maleimide carboxylic acid and a variety of aromatic polyepoxides; and aromatic polymaleimide urethane compounds obtained by an urethanization reaction between a maleimide alcohol and a variety of aromatic polyisocyanates.

Specific examples of the polyfunctional aromatic maleimides include N,N'-(4,4'-diphenylmethane)bismaleimide, N,N'-2,4-tolylene bismaleimide, N,N'-2,6-tolylene bismaleimide, 1-methyl-2,4-bismaleimide benzene, N,N'-m-phenylene bismaleimide, N,N'-p-phenylene bismaleimide, N,N'-m-tolylene bismaleimide, N,N'-4,4'-biphenylene bismaleimide, N,N'-4,4'-[3,3'-dimethyl-biphenylene]bismaleimide, N,N'-4,4'-[3,3'-dimethyldiphenylmethane]bismaleimide, N,N'-4,4'-[3,3'-diethyldiphenylmethane]bismaleimide, N,N'-4,4'-diphenylmethane bismaleimide, N,N'-4,4'-diphenylpropane bismaleimide, N,N'-4,4'-diphenyl ether bismaleimide, N,N'-3,3'-diphenylsulfone bismaleimide, N,N'-4,4'-diphenylsulfone bismaleimide, 2,2-bis[4-(4-maleimidephenoxy)phenyl]propane, 2,2-bis[3-t-butyl-4-(4-maleimidephenoxy)phenyl]propane, 2,2-bis[3-s-butyl-4-(4-maleimidephenoxy)phenyl]propane, 1,1-bis[4-(4-maleimidephenoxy)phenyl]decane, 1,1-bis[2-methyl-4-(4-maleimidephenoxy)-5-t-butylphenyl]-2-methylpropane, 4,4'-cyclohexylidene-bis[1-(4-maleimidephenoxy)-2-(1,1-dimethylethyl)benzene], 4,4'-methylene-bis[1-(4-maleimidephenoxy)-2,6-bis(1,1-dimethylethyl)benzene], 4,4'-methylene-bis[1-(4-maleimidephenoxy)-2,6-di-s-butylbenzene], 4,4'-cyclohexylidene-bis[1-(4-maleimidephenoxy)-2-cyclohexylbenzene, 4,4'-methylenebis[1-(maleimidephenoxy)-2-nonylbenzene], 4,4'-(1-methylethylidene)-bis[1-(maleimidephenoxy)-2,6-bis(1,1-dimethylethyl)benzene], 4,4'-(2-ethylhexylidene)-bis[1-(maleimidephenoxy)-benzene], 4,4'-(1-methylheptylidene)-bis[1-(maleimidephenoxy)-benzene], 4,4'-cyclohexylidene-bis[1-(maleimidephenoxy)-3-methylbenzene], 2,2-bis[4-(4-maleimidephenoxy)phenyl]hexafluoropropane, 2,2-bis[3-methyl-4-(4-maleimidephenoxy)phenyl]propane, 2,2-bis[3-methyl-4-(4-maleimidephenoxy)phenyl]hexafluoropropane, 2,2-bis[3,5-dimethyl-4-(4-maleimidephenoxy)phenyl]propane, 2,2-bis[3,5-dimethyl-4-(4-maleimidephenoxy)phenyl] hexafluoropropane, 2,2-bis[3-ethyl-4-(4- maleimidephenoxy)phenyl]propane, 2,2-bis[3-ethyl-4-(4-maleimidephenoxy)phenyl]hexafluoropropane, bis[3-methyl-(4-maleimidephenoxy)phenyl]methane, bis[3,5-dimethyl-(4-maleimidephenoxy)phenyl]methane, bis[3-ethyl-(4-maleimidephenoxy)phenyl]methane, 3,8-bis[4-(4-maleimidephenoxy)phenyl]-tricyclo[5.2.1.02,6]decane, 4,8-bis[4-(4-maleimidephenoxy)phenyl]-tricyclo[5.2.1.02,6] decane, 3,9-bis[4-(4-maleimidephenoxy)phenyl]-tricyclo[5.2.1.02,6]decane, 4,9-bis[4-(4-maleimidephenoxy)phenyl]-tricyclo[5.2.1.02,6]decane, 1,8-bis[4-(4-maleimidephenoxy)phenyl]menthane, 1,8-bis[3-methyl-4-(4-maleimidephenoxy)phenyl]menthane and 1,8-bis[3,5-dimethyl-4-(4-maleimidephenoxy)phenyl]menthane.

The amount of the maleimide compound to be blended is, in terms of its equivalence ratio to the alkali-developable resin (maleimide group:alkali-developable group), is preferably 1:0.1 to 1:10, more preferably 1:0.2 to 1:5. When the blending ratio is in this range, the development is easily carried out.

[Polymeric Resin]

In the above-described thermosetting resin composition, in order to improve the flexibility and the dryness to touch of the resulting cured product, a known and commonly-used polymeric resin may be incorporated. Examples of the polymeric resin include cellulose-based, polyester-based, phenoxy resin-based, polyvinyl acetal-based, polyvinyl butyral-based, polyamide-based and polyamide imide-based binder polymers, block copolymers, elastomers and rubber particles.

The above-described polymeric resins may be used individually, or two or more thereof may be used in combination.

By incorporating such a polymeric resin, the melt viscosity of the thermosetting resin composition is increased, so that an increase in the fluidity of the resin of the through-hole part can be inhibited during heating after the light irradiation. As a result, a flat substrate having no recess on through-holes can be prepared.

The amount of the above-described polymeric resin to be added is preferably 50 parts by mass or less, more preferably 1 to 30 parts by mass, particularly preferably 5 to 30 parts by mass, with respect to 100 parts by mass of the above-described heat-reactive compound. When the amount of the polymeric resin is greater than 50 parts by mass, there is a concern that the desmear resistance of the thermosetting resin composition is deteriorated; therefore, such an amount is not preferred.

(Block Copolymer)

The term "block copolymer" refers to a copolymer having a molecular structure in which two or more polymers having different properties are connected by covalent bonds in the form of a long chain. Within this scope, the block copolymer may be a solid, and the block copolymer may also be a solid at a temperature corresponding to outside of this scope. With the block copolymer being a solid in the above-described temperature range, when the thermosetting resin composition is made into a dry film or coated and pre-dried on a substrate, excellent tack property can be attained.

As a block copolymer used in the present invention, a black copolymer of A-B-A-type or A-B-A'-type is preferred. Among A-B-A-type and A-B-A' type black copolymers, a block copolymer constituted by a middle polymer unit B which is a soft block having a low grass transition temperature (Tg) (preferably lower than 0° C.) and an outer polymer unit A or A' which is a hard block having a high Tg (preferably 0° C. or higher) is preferred. The glass transition temperature Tg is measured by differential scanning calorimetry (DSC).

Further, among A-B-A-type and A-B-A'-type block copolymers, a block copolymer constituted by a polymer unit A or A' having a Tg of not lower than 50° C. and a polymer unit B having a Tg of not higher than −20° C. is more preferred.

Still further, among A-B-A-type and A-B-A'-type block copolymers, one in which A or A' has a high compatibility with the above-described heat-reactive compound and B has a low compatibility with the above-described heat-reactive compound is also preferred. It is believed that a block copolymer whose outer blocks are compatible with a matrix and middle block is incompatible with the matrix in this manner is likely to exhibit a specific structure in the matrix.

It is preferred that the block copolymer contain, for example, polymethyl (meth)acrylate (PMMA) or polystyrene (PS) as the A or A' and poly-n-butylacrylate (PBA) or polybutadiene (PB) as the B. In addition, by introducing a hydrophilic unit having excellent compatibility with the above-described matrix, which is represented by a styrene unit, a hydroxyl group-containing unit, a carboxyl group-containing unit, an epoxy-containing unit, an N-substituted acrylamide unit or the like, to a part of the component A or A', the compatibility of the block copolymer can be further improved.

Further, as the block copolymer used in the present invention, a ternary or higher order block copolymer is preferred and a block copolymer which is synthesized by a living polymerization method and has a precisely controlled molecular structure is more preferred from the standpoint of attaining the effects of the present invention. This is thought to be because a block copolymer synthesized by a living polymerization method has a narrow molecular weight distribution and, therefore, the characteristics of each unit are clear. The molecular weight distribution (Mw/Mn) of the block copolymer to be used is preferably not greater than 3, more preferably not greater than 2.5, still more preferably not greater than 2.0.

Such a block copolymer containing a (meth)acrylate polymer block as described in the above can be suitably obtained by, for example, those methods that are described in Japanese Unexamined Patent Application Publication Nos. 2007-516326 and 2005-515281 (Specification), particularly by polymerizing a Y unit using an alkoxyamine compound represented by any one of the following formulae (1) to (4) as an initiator and then polymerizing an X unit thereto.

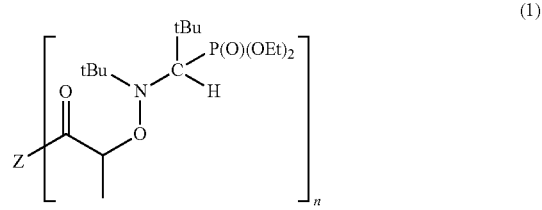

(1)

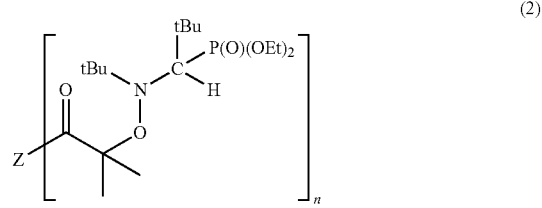

(2)

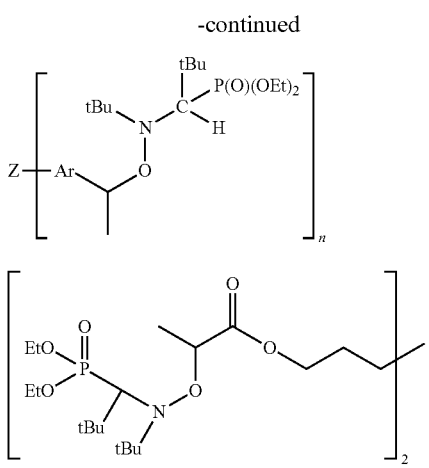

(wherein, n represents 2; Z represents a divalent organic group, preferably one selected from 1,2-ethanedioxy, 1,3-propanedioxy, 1,4-butanedioxy, 1,6-hexanedioxy, 1,3,5-tris(2-ethoxy)cyanuric acid, polyaminoamines such as polyethyleneamine, 1,3,5-tris(2-ethylamino)cyanuric acid, polythioxy, phosphonate and polyphosphonate; and Ar represents a divalent aryl group)

The weight-average molecular weight of the block copolymer is in the range of preferably 20,000 to 400,000, more preferably 50,000 to 300,000. When the weight-average molecular weight is less than 20,000, a desired toughness and the effects of having flexibility cannot be attained, so that the tack property becomes poor when the thermosetting resin composition is made into a dry film or applied onto a substrate and pre-dried. Meanwhile, when the weight-average molecular weight is higher than 400,000, the viscosity of the thermosetting resin composition is increased, so that the printing property and processability may be considerably deteriorated. When the weight-average molecular weight is 50,000 or higher, an excellent effect can be attained in terms of the property of alleviating external impacts.

As a polymeric resin, a block copolymer is preferred since it exhibits excellent crack resistance during the thermal cycle and can inhibit warping on curing. Further, a block copolymer is particularly preferred from the standpoint that it inhibits the generation of recesses on the through-holes and thereby allows a substrate having a flat surface to be prepared. Moreover, by using a block copolymer in combination with an inorganic filler, the crack resistance during the thermal cycle can be further improved.

(Elastomer)

In the above-described thermosetting resin composition, an elastomer having a functional group may be incorporated. By adding an elastomer having a functional group, the coating property as well as the strength of the resulting coating film can be expected to be improved. As such an elastomer, for example, a polyester-based elastomer, a polyurethane-based elastomer, a polyester-urethane-based elastomer, a polyamide-based elastomer, a polyester-amide-based elastomer, an acrylic elastomer or an olefin-based elastomer can be employed. In addition, for example, a resin which is obtained by modifying some or all of the epoxy groups contained in an epoxy resin having various skeletons with a butadiene-acrylonitrile rubber whose terminals are both modified with carboxylic acid can also be employed. Moreover, for example, an epoxy-containing polybutadiene-based elastomer, an acryl-containing polybutadiene-based elastomer, a hydroxyl group-containing polybutadiene-based elastomer or a hydroxyl group-containing isoprene-based elastomer can also be employed. These elastomers may be used individually, or two or more thereof may be used in combination.

(Rubber Particle)

As a rubber particle, any rubber particle may be used as long as it is particulate and formed from an organic substance such as a polymer having a cross-linked structure. Examples of such rubber particle include cross-linked NBR particles formed by copolymerization of acrylonitrile and butadiene as a acrylonitrile-butadiene copolymer; particles obtained by copolymerization of acrylonitrile, butadiene and a carboxylic acid such as acrylic acid; and cross-linked rubber particles having a so-called core-shell structure (hereinafter, also referred to as "core-shell rubber particle") in which a cross-linked polybutadiene, a cross-linked silicon rubber or NBR constitutes the core layer and a cross-linked acrylic resin constitutes the shell layer.

Thereamong, from the standpoints of dispersion control and particle size stability, a cross-linked rubber particle having a core-shell structure is preferred and a cross-linked rubber particle having a core-shell structure in which a cross-linked acrylic resin constitutes the shell layer and a cross-linked polybutadiene or a cross-linked silicon rubber constitutes the core layer is more preferred.

The term "cross-linked NBR particle" refers to a copolymer of acrylonitrile and butadiene which is partially cross-linked during copolymerization and then made into the form of particles. Further, by copolymerizing acrylonitrile and butadiene along with a carboxylic acid such as acrylic acid or methacrylic acid, a carboxylic acid-modified cross-linked NBR particle can be obtained.

A core-shell rubber particle of crosslinked butadiene rubber-crosslinked acrylic resin can be obtained by a two-step polymerization method in which butadiene particles are polymerized by emulsion polymerization and further polymerized with an addition of a monomer such as acrylic ester or acrylic acid.

A core-shell rubber particle of crosslinked silicon rubber-crosslinked acrylic resin can be obtained by a two-step polymerization method in which silicon particles are polymerized by emulsion polymerization and further polymerized with an addition of a monomer such as acrylic ester or acrylic acid.

The size of the rubber particle is, in terms of average primary particle size, 1 μm or smaller, preferably 50 nm to 1 μm. When the average primary particle size is larger than 1 μm, the adhesive strength is reduced and the insulation reliability in fine wiring is impaired. The term "average primary particle size" used herein refers to an average size of individual particles that are not aggregated, not an average size of aggregated particles, that is, secondary particle size.

The average primary particle size can be determined by using, for example, a laser diffraction-type particle size distribution meter.

The above-described rubber particles may be used individually, or two or more thereof may be used in combination.

The content of rubber particles in the resin composition is preferably not greater than 50% by mass, more preferably 1 to 30% by mass.

Examples of commercially available carboxylic acid-modified acrylonitrile-butadiene rubber particles include XER-91 manufactured by JSR Corporation.

Examples of the core-shell particle of a butadiene rubber-acrylic resin include PARALOID EXL2655 manufactured by Rohm and Haas Company and AC-3832 manufactured by Ganz Chemical Co., Ltd. Examples of the core-shell particle of a crosslinked silicon rubber-acrylic resin include GENIOPERL P52 manufactured by Wacker Asahikasei Silicone Co., Ltd.

By using a rubber particle, the crack resistance during the thermal cycle can be improved.

[Inorganic Filler]

It is preferred that the above-described thermosetting resin composition contain an inorganic filler. The inorganic filler is used for inhibiting shrinkage on curing of a cured product of the thermosetting resin composition and improving its characteristics such as adhesive property and hardness. Examples of the inorganic filler include barium sulfate, barium titanate, amorphous silica, molten silica, spherical silica, talc, clay, magnesium carbonate, calcium carbonate, aluminum oxide, aluminum hydroxide, silicon nitride and aluminum nitride, boron nitride and Neuburg siliceous earth.

The above-described inorganic filler has an average particle size (D50) of preferably not larger than 1 μm, more preferably not larger than 0.7 μm, still more preferably 0.5 μm. When the average particle size is larger than 1 μm, there is a concern that the resulting patterned layer develops cloudiness, which is not preferred. The lower limit of the average particle size (D50) of the inorganic filler is not particularly restricted; however, it is, for example, not smaller than 0.01 μm. The term "average particle size" used herein means an average primary particle size.

The average particle size (D50) can be measured by a laser diffraction/scattering method. By controlling the average particle size in the above-described range, the thermosetting resin composition has a refractive index comparable to that of the resin component, so that the light permeability is improved and the efficiency at which the photobase generator generates a base when irradiated with a light is thus increased. The difference in the refractive index between the inorganic filler and the alkali-developable resin is preferably not larger than 0.3. By controlling the difference in the refractive index to be not larger than 0.3, scattering of light can be inhibited, so that good deep-part curability can be attained. Here, the refractive index of the inorganic filler is preferably 1.4 to 1.8. The refractive index of the inorganic filler can be measured in accordance with JIS K7105.

The ratio of the inorganic filler to be incorporated is, based on the total solids of the above-described thermosetting resin composition, preferably 20% by mass to 80% by mass, more preferably 30% by mass to 80% by mass. When the ratio of the inorganic filler is higher than 80% by mass, the viscosity of the composition is increased, so that the coating property may be deteriorated and the resulting cured product of the thermosetting resin composition may become fragile.

In a composition which is cured by a radical reaction, an increase in the content of an inorganic filler leads to a reduction in the resolution; however, in the present invention, since the composition is cured by a curing reaction induced by the generated base, good resolution can be maintained even when the content of inorganic filler is increased.

Further, the specific gravity of the inorganic filler is preferably not higher than 3, more preferably not higher than 2.8, still more preferably not higher than 2.5. When the specific gravity of the inorganic filler is 3 or less, thermal expansion thereof can be inhibited. Examples of such inorganic filler having a specific gravity of 3 or less include silica and aluminum hydroxide, and silica is particularly preferred.

As for the shape of the inorganic filler, the inorganic filler may take, for example, an amorphous shape, a needle shape, a disk shape, a scaly shape, a spherical shape or a hollow shape. From the standpoint of enabling to blend the inorganic filler in the composition at a high ratio, it is preferred that the inorganic filler assume a spherical shape. Also, in order to improve the moisture resistance, it is more preferred that the inorganic filler be treated with a surface treatment agent such as a silane coupling agent.

Further, by incorporating such inorganic filler, the crack resistance during the thermal cycle can be improved. By incorporating the inorganic filler in a large amount, warping after the curing process can be inhibited as well.

In the present invention, the coefficient of thermal expansion (CTE) of the resulting cured product is preferably not higher than 40 ppm, more preferably not higher than 30 ppm, still more preferably not higher than 20 ppm.

[Coloring Agent]

Further, in the thermosetting resin composition according to the present invention, a coloring agent may be incorporated.

Conventionally, at the edge portion of a copper circuit on a printed circuit board, when the coloring strength of a patterned layer is insufficient, copper is discolored in the thermal history after the formation of the patterned layer, so that only a thin portion thereof appears to be discolored. Representative examples of the thermal history include heat-curing of markings, warping correction, preheating performed prior to mounting, and mounting.

Therefore, conventionally, the problem of apparent discoloration of only the edge portion of a copper circuit is solved by incorporating a large amount of a coloring agent in the patterned layer and thereby increasing the coloring strength.

However, since a coloring agent has light-absorbing property, it prevents a light from permeating into a deep part. As a result, in a composition containing a coloring agent, an undercut is likely to be formed, making it difficult to attain sufficient adhesive property.

In contrast to this, in the thermosetting resin composition according to the present invention, as described in the above, chemical propagation of a base into deep parts allows the resulting resin layer to be sufficiently cured into the deep parts.

Therefore, with the thermosetting resin composition according to the present invention, even when it contains a coloring agent, a patterned layer having excellent copper circuit-hiding property and excellent adhesive property can be formed.

Particularly, even when the content of a coloring agent is increased, the formation of an under-cut is inhibited, so that good via-holes and lines can be formed.

As the coloring agent, a known and commonly-used coloring agent of red, blue, green, yellow, white, black or the like can be used, and it may be any of a pigment, a stain or a dye. Specific examples of the coloring agent include those assigned with the following Color Index numbers (C.I.; issued by The Society of Dyers and Colourists). Here, from the standpoint of reducing the environmental stress and the effects on human body, it is preferred that the coloring agent contain no halogen.

Red Coloring Agent:

Examples of red coloring agent include monoazo-type, disazo-type, azo lake-type, benzimidazolone-type, perylene-type, diketopyrrolopyrrole-type, condensed azo-type, anthraquinone-type and quinacridone-type red coloring agents, and specific examples thereof include the followings.

Monoazo-type: Pigment Reds 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268 and 269

Disazo-type: Pigment Reds 37, 38 and 41

Monoazo lake-type: Pigment Reds 48:1, 48:2, 48:3, 48:4, 49:1, 49:2, 50:1, 52:1, 52:2, 53:1, 53:2, 57:1, 58:4, 63:1, 63:2, 64:1 and 68

Benzimidazolone-type: Pigment Red 171, Pigment Red 175, Pigment Red 176, Pigment Red 185 and Pigment Red 208

Perylene-type: Solvent Red 135, Solvent Red 179, Pigment Red 123, Pigment Red 149, Pigment Red 166, Pigment Red 178, Pigment Red 179, Pigment Red 190, Pigment Red 194 and Pigment Red 224

Diketopyrrolopyrrole-type: Pigment Red 254, Pigment Red 255, Pigment Red 264, Pigment Red 270 and Pigment Red 272

Condensed azo-type: Pigment Red 220, Pigment Red 144, Pigment Red 166, Pigment Red 214, Pigment Red 220, Pigment Red 221 and Pigment Red 242

Anthraquinone-type: Pigment Red 168, Pigment Red 177, Pigment Red 216, Solvent Red 149, Solvent Red 150, Solvent Red 52 and Solvent Red 207

Quinacridone-type: Pigment Red 122, Pigment Red 202, Pigment Red 206, Pigment Red 207 and Pigment Red 209.

Blue Coloring Agent:

Examples of blue coloring agent include phthalocyanine-type and anthraquinone-type blue coloring agents, and examples of pigment-type blue coloring agent include those compounds that are classified as pigments, specifically the following agents: Pigment Blue 15, Pigment Blue 15:1, Pigment Blue 15:2, Pigment Blue 15:3, Pigment Blue 15:4, Pigment Blue 15:6, Pigment Blue 16 and Pigment Blue 60.

As a stain-type blue coloring agent, for example, Solvent Blue 35, Solvent Blue 63, Solvent Blue 68, Solvent Blue 70, Solvent Blue 83, Solvent Blue 87, Solvent Blue 94, Solvent Blue 97, Solvent Blue 122, Solvent Blue 136, Solvent Blue 67 and Solvent Blue 70 can be used. In addition to the above-described ones, a metal-substituted or unsubstituted phthalocyanine compound can be used as well.

Green Coloring Agent:

Similarly, examples of green coloring agent include phthalocyanine-type, anthraquinone-type and perylene-type green coloring agents and specifically, for example, Pigment Green 7, Pigment Green 36, Solvent Green 3, Solvent Green 5, Solvent Green 20 and Solvent Green 28 can be used. In addition to the above-described ones, a metal-substituted or unsubstituted phthalocyanine compound can be used as well.

Yellow Coloring Agent:

Examples of yellow coloring agent include monoazo-type, disazo-type, condensed azo-type, benzimidazolone-type, isoindolinone-type and anthraquinone-type yellow coloring agents and specific examples thereof include the followings.

Anthraquinone-type: Solvent Yellow 163, Pigment Yellow 24, Pigment Yellow 108, Pigment Yellow 193, Pigment Yellow 147, Pigment Yellow 199 and Pigment Yellow 202

Isoindolinone-type: Pigment Yellow 110, Pigment Yellow 109, Pigment Yellow 139, Pigment Yellow 179 and Pigment Yellow 185

Condensed azo-type: Pigment Yellow 93, Pigment Yellow 94, Pigment Yellow 95, Pigment Yellow 128, Pigment Yellow 155, Pigment Yellow 166 and Pigment Yellow 180

Benzimidazolone-type: Pigment Yellow 120, Pigment Yellow 151, Pigment Yellow 154, Pigment Yellow 156, Pigment Yellow 175 and Pigment Yellow 181

Monoazo-type: Pigment Yellows 1, 2, 3, 4, 5, 6, 9, 10, 12, 61, 62, 62:1, 65, 73, 74, 75, 97, 100, 104, 105, 111, 116, 167, 168, 169, 182 and 183

Disazo-type: Pigment Yellows 12, 13, 14, 16, 17, 55, 63, 81, 83, 87, 126, 127, 152, 170, 172, 174, 176, 188, and 198.

White Coloring Agent:

Further, in the present invention, as a coloring agent, a white coloring agent can be used as well. Examples of the white coloring agent include titanium oxides. As a titanium oxide, a rutile-type titanium oxide or an anatase-type titanium oxide may be used; however, it is preferred to use a rutile-type titanium oxide. An anatase-type titanium oxide, which is also a titanium oxide, has a higher degree of whiteness as compared to a rutile-type titanium oxide and is thus often used as a white pigment; however, since an anatase-type titanium oxide has a photocatalytic activity, it may cause discoloration of a resin in an insulating resin composition particularly when irradiated with a light from an LED. In contrast to this, although a rutile-type titanium oxide has a slightly lower degree of whiteness as compared to an anatase-type titanium oxide, since it has hardly any photoactivity, deterioration (yellowing) of a resin by a light, which is attributed to the photoactivity of titanium oxide, is markedly inhibited, and a rutile-type titanium oxide is also stable against heat. Therefore, when a rutile-type titanium oxide is used as a white pigment in an insulating layer of a printed circuit board mounted with an LED, a high reflectance can be maintained over a prolonged period of time.

As a rutile-type titanium oxide, a known one can be used. There are two kinds of methods of producing a rutile-type titanium oxide, which are sulfuric acid method and chlorine method. In the present invention, a rutile-type titanium oxide produced by either of these methods can be suitably used. Here, the term "sulfuric acid method" refers to a production method in which a starting material, which is an ilmenite ore or a titanium slag, is dissolved in a concentrated sulfuric acid to separate an iron content as iron sulfate and the resulting solution is hydrolyzed to obtain a hydroxide precipitate, which is then calcinated at a high temperature to recover a rutile-type titanium oxide. Meanwhile, the term "chlorine method" refers to a production method in which a starting material, which is a synthetic rutile or natural rutile, is allowed to react with a chlorine gas and carbon at a high temperature of about 1,000° C. to synthesize titanium tetrachloride and the thus obtained titanium tetrachloride is then oxidized to recover a rutile-type titanium oxide. Thereamong, a rutile-type titanium oxide produced by a chlorine method exhibits a prominent effect of inhibiting deterioration (yellowing) of a resin caused by heat in particular and is, therefore, more suitably used in the present invention.

Among these titanium oxides, from the standpoints of the dispersibility in the composition, storage stability and flame retardancy, it is particularly preferred to use a titanium oxide whose surface is treated with hydrous alumina or aluminum hydroxide.

Black Coloring Agent:

As a black coloring agent used in the present invention, a known and commonly-used one can be employed. Examples of such black coloring agent include carbon black-based pigments represented by, for example, C.I. Pigment Blacks 6, 7, 9 and 18; graphite-based pigments represented by, for example, C.I. Pigment Blacks 8 and 10; iron oxide-based pigments represented by C.I. Pigment Blacks 11, 12 and 27, Pigment Brown 35 and the like, such as iron oxide KN-370 manufactured by Toda Kogyo Corp.; Titanium Black 13M manufactured by Mitsubishi Materials Corporation; anthraquinone-based pigments represented by C.I. Pigment Black 20 and the like; cobalt oxide-based pigments represented by, for example, C.I. Pigment Blacks 13, 25 and 29; copper oxide-based pigments represented by, for example, C.I. Pigment Blacks 15 and 28; manganese-based pigments represented by, for example, C.I. Pigment Blacks 14 and 26; antimony oxide-based pigments represented by C.I. Pigment Black 23 and the like; nickel oxide-based pigments represented by C.I. Pigment Black 30 and the like; perylene-based pigments represented by C.I. Pigment Blacks 31 and 32; and aniline-based pigments represented by Pigment Black 1. In addition, molybdenum sulfide and bismuth sulfide may also be exemplified as suitable pigments. These pigments are used individually or in combination as appropriate. Carbon blacks such as M-40, M-45, M-50, MA-8 and MA-100, which are manufactured by Mitsubishi Chemical Corporation, are particularly preferred and, among organic pigments, perylene-based pigments are effective in reducing the halogen amount.

In addition to the above, in order to adjust the color tone, for example, a violet, orange, brown and/or black coloring agent(s) may also be added.

Specific examples of such coloring agent include Pigment Violets 19, 23, 29, 32, 36, 38 and 42; Solvent Violets 13 and 36; C.I. Pigment Oranges 1, 5, 13, 14, 16, 17, 24, 34, 36, 38, 40, 43, 46, 49, 51, 61, 63, 64, 71 and 73; and C.I. Pigment Browns 23 and 25.

The amount of the coloring agent to be incorporated in the thermosetting resin composition according to the present invention is preferably 0.1 to 10 parts by mass, more preferably 0.8 to 10 parts by mass, still more preferably 1 to 5 parts by mass, with respect to 100 parts by mass of the above-described heat-reactive compound.

Here, when a white coloring agent is used, the amount thereof to be incorporated is preferably 20 parts by mass to 70 parts by mass, more preferably 20 parts by mass to 60 parts by mass, with respect to 100 parts by mass of the above-described heat-reactive compound.

[Organic Solvent]

In the above-described thermosetting resin composition, for the preparation thereof and/or adjustment of its viscosity for application onto a substrate or a carrier film, an organic solvent may be used.

Examples of such organic solvent include ketones, aromatic hydrocarbons, glycol ethers, glycol ether acetates, esters, alcohols, aliphatic hydrocarbons and petroleum-based solvents. These organic solvents may be used individually, or two or more thereof may be used in the form of a mixture.

[Photopolymerizable Monomer]

The thermosetting resin composition according to the present invention may also contain a photopolymerizable monomer in such an amount which does not adversely affect the effects of the present invention.

Examples of the photopolymerizable monomer include alkyl (meth)acrylates such as 2-ethylhexyl (meth)acrylate and cyclohexyl (meth)acrylate; hydroxyalkyl (meth)acrylates such as 2-hydroxyethyl (meth)acrylate and 2-hydroxypropyl (meth)acrylate; mono- or di-(meth)acrylates of alkylene oxide derivatives, such as ethylene glycol, propylene glycol, diethylene glycol and dipropylene glycol; polyvalent (meth)acrylates of polyhydric alcohols (e.g., hexanediol, trimethylolpropane, pentaerythritol, ditrimethylolpropane, dipentaerythritol and tris-hydroxyethyl isocyanurate) and polyvalent (meth)acrylates of ethylene oxide adducts or propylene oxide adducts of these polyhydric alcohols; (meth)acrylates of ethylene oxides or propylene oxide adducts of phenols, such as phenoxyethyl (meth)acrylate and bisphenol A polyethoxy di(meth)acrylate; (meth)acrylates of glycidyl ether, such as glycerin diglycidyl ether, trimethylolpropane triglycidyl ether and triglycidyl isocyanurate; and melamine (meth)acrylate.

The amount of the photopolymerizable monomer to be incorporated is, based on the amount of the solids in the thermosetting resin composition excluding the solvent, preferably not greater than 50% by mass, more preferably not greater than 30% by mass, still more preferably not greater than 15% by mass. When the amount of the photopolymerizable monomer is higher than 50% by mass, the shrinkage on curing is increased, which may result in an increase in warping. Further, when the photopolymerizable monomer is of a (meth)acrylate origin, it contains an ester bond. In this case, since the ester bond is hydrolyzed by a desmearing treatment, the electrical characteristics may be impaired.

(Other Arbitrary Components)

The above-described thermosetting resin composition may further contain, as required, components such as a mercapto compound, an adhesion-promoting agent, an antioxidant and an ultraviolet absorber. As such components, those which are known in the field of electronic materials can be used. In addition, in the above-described thermosetting resin composition, a known and commonly-used thickening agent such as fine-powder silica, hydrotalcite, organic bentonite or montmorillonite, an antifoaming agent such as a silicone-based, fluorine-based or polymeric antifoaming agent, and/or a known and commonly-used additive such as a leveling agent, a silicone coupling agent or a corrosion inhibitor can also be incorporated.

Further, as a thermosetting component, for example, a known and commonly-used thermosetting resin, such as a blocked isocyanate compound, an amino resin, a benzoxazine resin, a carbodiimide resin, a cyclocarbonate compound or an episulfide resin, may also be incorporated.

Moreover, by incorporating a phenol resin as the alkali-developable resin and an epoxy resin as the heat-reactive compound, a resin composition having a high Tg, from which a cured product having excellent HAST resistance can be produced regardless of the softening points of the starting materials, can be obtained. Furthermore, by not incorporating a photopolymerizable monomer (a low-molecular-weight compound which is added to facilitate the photocuring of a photocurable resin composition having an ethylenically unsaturated group in the molecule and comprising a carboxyl-group containing resin as a main component), a resin composition having excellent tack property can be obtained.

In a conventional photocurable resin composition, since a photocuring reaction thereof takes place at a room temperature, the Tg (softening point) of the resin composition is increased at the time of curing, so that there are cases where the curing reaction is stopped. Accordingly, such photocurable resin composition is required to be designed to have a low Tg. In contrast, in the alkali-developable thermosetting resin composition of the present invention, the Tg before a curing reaction is not restricted and the composition can be expected to have a high Tg. In addition, the alkali-developable thermosetting resin composition of the present invention can be expected to be cured without being subjected to oxygen inhibition.

The printed circuit board according to the present invention is characterized by comprising a patterned layer formed by the above-described pattern forming method. Examples of the patterned layer include solder resists and interlayer insulating layers. The printed circuit board according to the present invention can be produced by a known production method, except that the patterned layer is formed by the pattern forming method of the present invention.

The thermosetting resin composition according to the present invention is useful for forming a patterned layer of a printed circuit board and, in particular, the thermosetting resin composition according to the present invention is useful as a material of a solder resist or an interlayer insulating layer.

The printed circuit board according to the present invention is characterized by comprising: a patterned layer formed by irradiating a resin layer composed of an alkali-developable thermosetting resin composition comprising a photobase generator (hereinafter, may be simply referred to as "thermosetting resin composition") with a light in a negative pattern and then developing the resulting resin layer; and an opening formed on the thus formed patterned layer or other layer by laser processing.

Here, it is preferred that the patterned layer be prepared by forming a resin layer composed of a thermosetting resin composition; activating a photobase generator contained in the thermosetting resin composition by irradiation with a light in a pattern form; and then removing an non-irradiated part by development to form a negative pattern.

In the resin layer composed of the thermosetting resin composition, a base is generated at the surface when irradiated with a light. The thus generated base destabilizes the photobase generator, which leads to further generation of the base. It is believed that such base generation in this manner allows the base to chemically propagate into a deep portion of the resin layer. Moreover, since the base functions as a catalyst for an addition reaction between the alkali-developable resin and the heat-reactive compound and thereby allows the addition reaction to progress into a deep portion, the resin layer is cured even in a deep portion at the irradiated part.

Therefore, by irradiating the thermosetting resin composition with a light in a pattern form and then developing the resulting composition with an alkali to remove the non-irradiated part, a patterned layer can be easily formed.

In this manner, in the present invention, since the thermosetting resin composition can be irradiated with a light and developed as in the case of a photocurable resin composition, a patterned layer can be formed in a short task time.

Further, by subjecting the patterned layer or other layer to laser processing, micro openings can be easily formed thereon.

Moreover, since curing of the thermosetting resin composition of the present invention progresses by thermal reactions, as compared to a case where the curing progresses by photoreactions, distortion and shrinkage of the resulting cured product can be better inhibited.

The thermosetting resin composition may also be a composition which is not cured by heating in unirradiated state and becomes curable by heating only after being irradiated with a light.

The above-described thermosetting resin composition preferably exhibits an exothermic peak in DSC measurement when irradiated with a light. Alternatively, it is preferred that the exothermic onset temperature of irradiated thermosetting resin composition in DSC measurement be lower than that of non-irradiated thermosetting resin composition in DSC measurement, or that the exothermic peak temperature of irradiated thermosetting resin composition in DSC measurement be lower than that of non-irradiated thermosetting resin composition in DSC measurement.

Further, in the above-described thermosetting resin composition, the difference in the exothermic onset temperature (hereinafter, may also be referred to as "ΔTstart") or the difference in the exothermic peak temperature (hereinafter, may also be referred to as "ΔTpeak") between irradiated and non-irradiated thermosetting resin compositions, which is determined by DSC measurement, is preferably not less than 10° C., more preferably not less than 20° C., still more preferably not less than 30° C.

Here, the term "ΔTstart" refers to a difference between the exothermic onset temperature representing the start of the curing reaction of irradiated resin composition and the exothermic onset temperature of non-irradiated resin composition, which temperatures are determined by preparing thermosetting resin compositions having the same constitution, irradiating only one of them with a light to leave the other non-irradiated and then subjecting the respective thermosetting resin compositions to DSC measurement (differential scanning calorimetry). The term "ΔTpeak" refers to a difference in the exothermic peak temperature between irradiated and non-irradiated resin compositions, which is determined by performing DSC measurement in the same manner.

The irradiation dose used in the DSC measurement of the irradiated thermosetting resin composition is one at which, when the irradiation dose is increased, there is no longer a shift in the exothermic peak temperature caused by irradiation of the thermosetting resin composition (saturation dose).

By controlling the ΔTstart or ΔTpeak to be 10° C. or larger, occurrence of so-called "fogging" where a non-irradiated part is left unremoved after alkali development or so-called "erosion" where an irradiated part is removed by alkali development can be inhibited. In addition, when the ΔTstart or ΔTpeak is 10° C. or larger, in the below-described heating step (B1), the heating can be performed in a wide temperature range.

[Method of Producing Printed Circuit Board]

Figure 8:
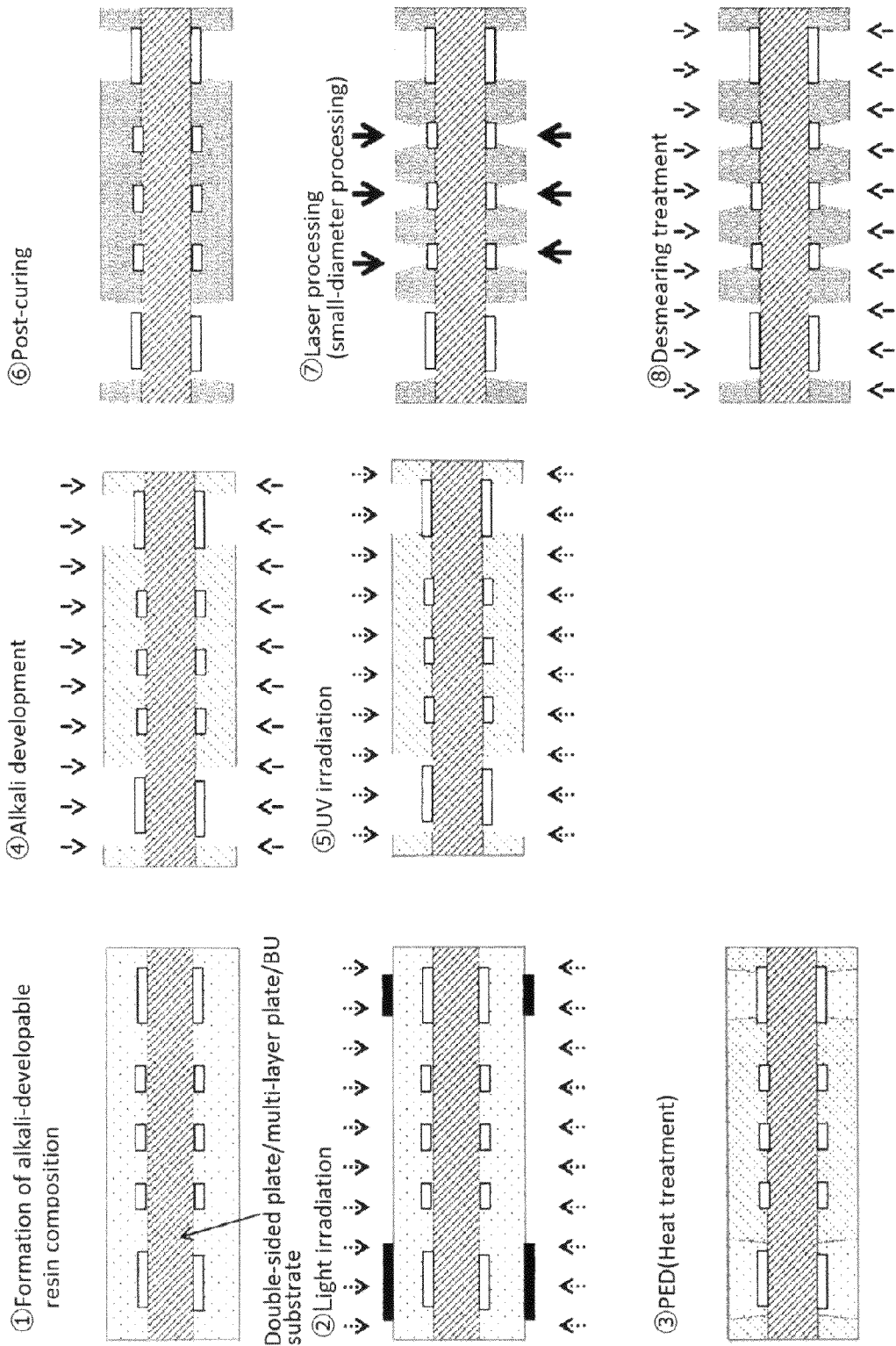
FIG. 8 shows one example of the method of producing a printed circuit board according to the present invention.
Figure 9:
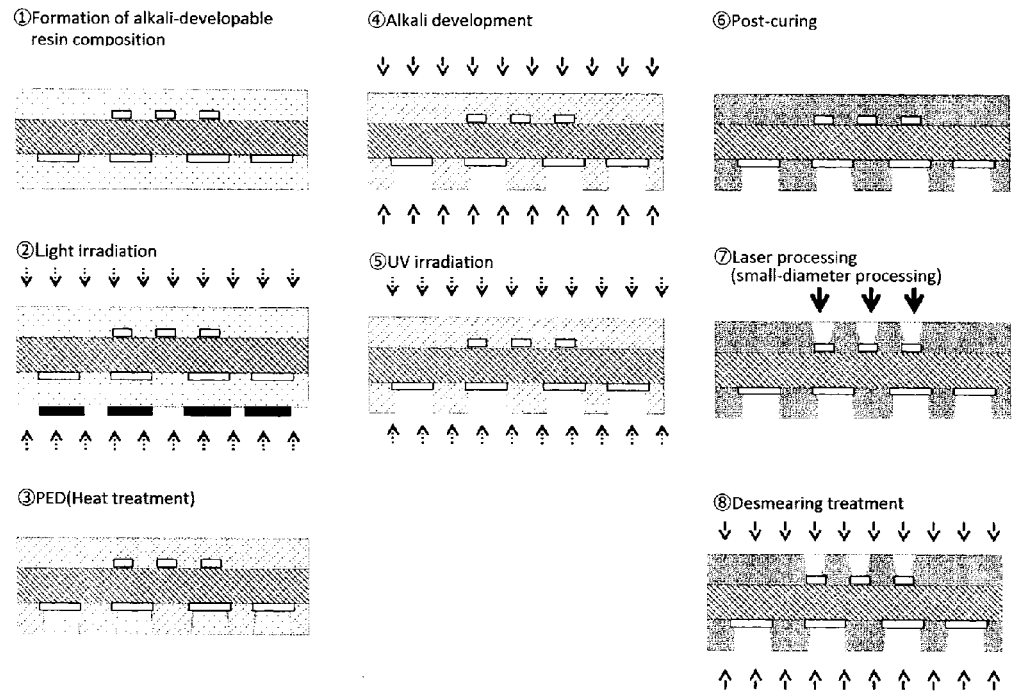
FIG. 9 shows another example of the method of producing a printed circuit board according to the present invention.

The method of producing a printed circuit board according to the present invention is characterized by comprising the steps of: (A) forming a resin layer composed of an alkali-developable thermosetting resin composition comprising a photobase generator on a substrate; (B) activating the photobase generator contained in the alkali-developable thermosetting resin composition by irradiation with a light in a negative pattern so as to cure an irradiated part; (C) forming a negatively patterned layer by removing a non-irradiated part by alkali development; and (D) subjecting the thus formed patterned layer to a laser processing. FIGS. 8 and 9 each show an example of the method of producing a printed circuit board according to the present invention.

By irradiating the resin layer with a light in a pattern form, the photobase generator contained in the irradiated part of the resin layer is activated and a basic substance is generated therefrom. Then, the irradiated part is cured by the work of the generated basic substance. By developing the resulting resin layer with an aqueous alkaline solution to remove the non-irradiated part, a negatively patterned layer can be formed.

Here, in the present invention, it is preferred that the pattern forming method comprise, after the step (B), the step (B1) of heating the resulting resin layer. By this, the resin layer is sufficiently cured, so that a patterned layer having even superior curing characteristics can be obtained.

In the method of producing a printed circuit board according to the present invention, the steps (A) to (D) can be performed in the same manner as in the steps (A) to (D) of the above-described pattern forming method of the present invention. Further, after the steps (A) to (D), the same steps as the above-described steps (E) to (G) may be performed.

EXAMPLES

The present invention will now be described in more detail by way of examples and comparative examples thereof; however, the present invention is not restricted thereto.

Examples 1 to 10

<Preparation of Thermosetting Resin Composition>

According to the formulations shown in Table 1 below, the respective materials of each Example were blended and premixed using a stirrer. Then, each resulting mixture was kneaded using a 3-roll mill to prepare a thermosetting resin composition. In Table 1, unless otherwise specified, all values are based on parts by mass.

<Preparation of Printed Circuit Substrate Having Resin Layer>

A double-sided printed circuit substrate of 0.4 mm in thickness, on which a 15 μm-thick copper circuit is formed on both sides, was prepared and pre-treated using CZ-8100 (manufactured by MEC Company Ltd.). Then, using a roll coater (manufactured by Furnace Co., Ltd.), each thermosetting resin composition was coated on both sides of the thus pre-treated printed circuit substrate to a thickness after drying of 20 μm. Thereafter, the resulting printed circuit substrate was dried in a hot air circulation-type drying oven at 90° C. for 30 minutes to form a resin layer composed of the thermosetting resin composition.

<Formation of Opening Pattern (Alkali Developability/Patterning Property)>

Using HMW680GW (metal halide lamp, scattering light-type; manufactured by ORC Manufacturing Co., Ltd.), the thus obtained substrate having a resin layer was irradiated with a light in a negative pattern having a designed opening size of 100 μm. The irradiation dose was set as shown in Table 3 below with reference to the respective exothermic peak temperatures measured by DSC. Then, the resulting substrate was heat-treated for 60 to 80 minutes at the temperature shown in Table 3. Thereafter, the substrate was developed by being immersed in a 3 wt % TMAH/5 wt % ethanolamine mixed aqueous solution at 35° C. for 3 minutes, and the developing property and the patterning property were evaluated in accordance with the following criteria. The results thereof are shown in Table 3. It is noted here that the evaluations shown in Tables 7 to 14 were also performed in the same manner.

(Evaluation Criteria)

●: The substrate could be developed even when an aqueous sodium carbonate solution was used in place of the TMAH/5 wt % ethanolamine mixed aqueous solution. The surface of the irradiated part showed no damage caused by the developer and there was observed no development residue on the non-irradiated part.

○: The surface of the irradiated part showed no damage caused by the developer and there was observed no development residue on the non-irradiated part.

x: Development residue was observed on the non-irradiated part, or the non-irradiated part could not be developed.

xx: Both the irradiated and non-irradiated parts were completely dissolved.

xxx: An under-cut was observed in a deep part of an opening section.

(Desmear Resistance)

A substrate was prepared in the same manner as in the case of the above-described substrate for which the formation of an opening pattern was evaluated. Using an ultraviolet irradiation apparatus (manufactured by ORC Manufacturing Co., Ltd.), the thus obtained substrate was further irradiated with an ultraviolet light at an energy of 1 J/cm$^2$ and then cured for 60 minutes in a hot air circulation-type drying oven at the post-curing temperature shown in Table 3 (post-curing). Thereafter, the irradiated surface was subjected to a laser processing. In this laser processing, a CO$_2$ laser (manufactured by Hitachi Via Mechanics, Ltd., light source: 10.6 μm) was used as a light source. The desmear resistance was evaluated in accordance with the below-described criteria. In order to clarify the differences in the processability, the laser processings of the respective substrates were all performed under the same conditions. It is noted here that the evaluations shown in Tables 7 to 14 were also performed in the same manner.

The target processing diameters were: top diameter=65 μm and bottom diameter=50 μm.

Conditions: aperture (mask diameter)=3.1 mm, pulse width=20 μsec, output=2W, frequency=5 kHz, number of shots=3 burst shots The thus laser-processed substrates were each further subjected to a desmearing treatment with an aqueous permanganate desmear solution (wet method). For evaluation of the desmear resistance, the surface roughness of each substrate was examined and the condition of the periphery of the openings formed by the laser processing was evaluated in accordance with the below-described criteria. For the examination of the surface roughness, the surface roughness, Ra, was measured under a laser microscope VK-8500 (manufactured by Keyence Corporation; at a magnification of ×2,000 and a Z-axis measurement pitch of 10 nm). The observation of the openings formed by the laser processing was performed under a light microscope.

Drug solutions (Rohm and Haas Company):
Swelling: MLB-211, temperature=80° C., time=10 minutes
Permanganate: MLB-213, temperature=80° C., time=15 minutes
Reduction: MLB-216, temperature=50° C., time=5 minutes Evaluation Criteria:

●: The surface roughness, Ra, was less than 0.1 μm after the desmearing with the permanganate solution and the difference in the opening diameter before and after the laser processing was 2 μm or less.

○: The surface roughness, Ra, was 0.1 to 0.3 μm after the desmearing with the permanganate solution and the difference in the opening diameter before and after the laser processing was 2 to 5 μm.

x: The surface roughness, Ra, was greater than 0.3 μm after the desmearing with the permanganate solution and the difference in the opening diameter before and after the laser processing was 5 μm or larger.

<DSC Measurement>

Figure 2:
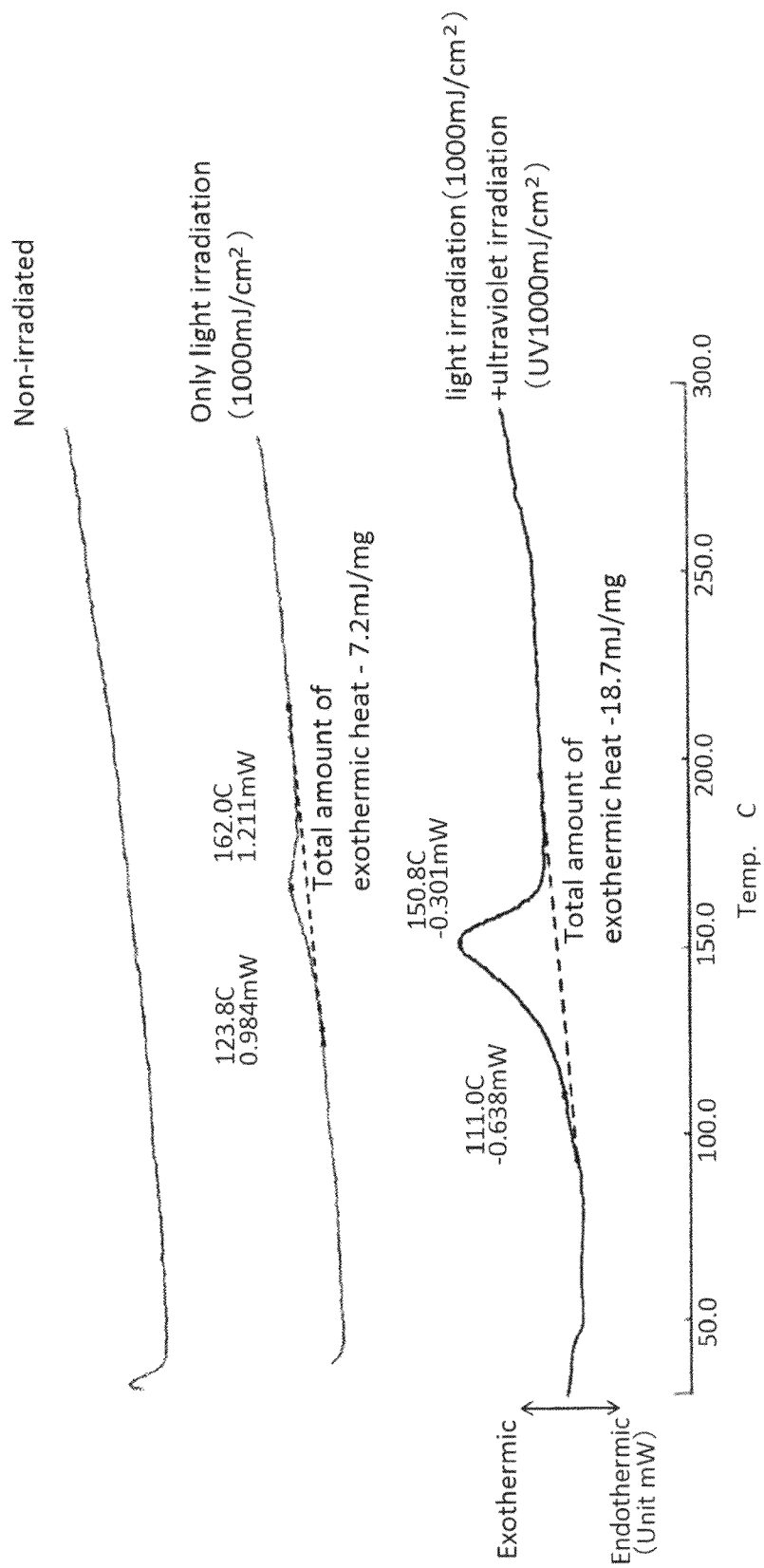
FIG. 2 shows the DSC charts for an irradiated part and a non-irradiated part of a layer composed of the thermosetting resin composition according to Example 9 of the present invention.

Using HMW680GW (metal halide lamp, scattering light-type; manufactured by ORC Manufacturing Co., Ltd.), the substrates having a resin layer obtained in the above were each irradiated with a light in a negative pattern. Here, each substrate was irradiated with two patterns where the irradiation dose was set at 500 mJ/cm$^2$ and 1,000 mJ/cm$^2$. After the light irradiation, the resin layer was scraped from the substrate. Immediately thereafter, using DSC-6200 (manufactured by Seiko Instruments Inc.), the resin layer was heated from 30° C. to 300° C. at a heating rate of 5° C./min to perform DSC measurement for each of the irradiated and non-irradiated parts. From the resulting DSC charts, the exothermic peak temperature of the irradiated part and that of the non-irradiated part were each determined. The results thereof are shown in Table 2 below. FIG. 1 shows the DSC charts of the resin layer according to Example 1 and FIG. 2 shows the DSC charts of the resin layer according to Example 9. These figures each show the DSC charts for the non-irradiated resin layer and the resin layer irradiated at an irradiation dose of 1,000 mJ/cm$^2$. In the resin layer of Example 1, the peak shifted to the low temperature side upon the light irradiation. In the resin layer of Example 9, a peak appeared only after the resin layer was irradiated.

From the DSC charts obtained by the above-described method, the exothermic peak temperature of the irradiated part (Tpeak 1) and that of the non-irradiated part (Tpeak 2) were determined and ΔT was defined as follows.

$$\Delta Tpeak = Tpeak\ 2 - Tpeak\ 1$$

According to the above-described definition, a positive ΔTpeak value indicates that the exothermic peak of the irradiated part shifted to the low temperature side and that the photobase generator was activated by the irradiation.

Further, in Examples 1 and 9, after the irradiation with an ultraviolet light, the patterned layer before the post-curing was subjected to the above-described DSC measurement. More specifically, the patterned layer was irradiated with a light at an irradiation dose of 1,000 mJ/cm$^2$ and then with an ultraviolet light at an irradiation does of 1,000 mJ/cm$^2$ before being subjected to the DSC measurement.

For each of the patterned layers of Examples 1 and 9, the exothermic peak temperature was determined from the resulting DSC charts. The DSC charts of the patterned layers of Examples 1 and 9 are shown in FIGS. 1 and 2, respectively.

In the patterned layer of Example 1, since the ultraviolet irradiation resulted in an increase in the amount of exothermic heat, it is seen that the ultraviolet irradiation allowed the heat-curing reaction to proceed more efficiently. Further, in the patterned layer of Example 9, since the ultraviolet irradiation resulted in an increase in the amount of exothermic heat and a peak shift to the low temperature side, it is seen that the ultraviolet irradiation allowed the heat-curing reaction to progress more efficiently.

TABLE 1

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Heat-reactive compound | 828 | 100 | 100 | 100 | 100 | 50 | 50 | — | — | — | — |
|  | HP-4032 | — | — | — | — | 50 | — | — | — | — | — |
|  | HP-7200 H60 | — | — | — | — | — | 83 | 166 | 166 | 166 | 166 |
| Alkali-developable resin | HF-1M H60 | 88 | 88 | 88 | — | 100 | 75 | 63 | 63 | 63 | 63 |
|  | JONCRYL 68 | — | — | — | 238 | — | — | — | — | — | — |
| Photobase generator | IRG 907 | — | — | — | — | — | — | — | — | 30 | 10 |
|  | IRG 369 | 30 | 30 | — | 30 | 30 | 30 | 30 | — | — | — |
|  | IRG 379 | — | — | — | — | — | — | — | 30 | — | — |
|  | OXE-02 | — | — | 10 | — | — | — | — | — | — | — |
|  | TPO | — | — | — | — | — | — | — | — | — | — |
|  | Σ (solid) | 183 | 163 | 183 | 163 | 273 | 190 | 175 | 168 | 168 | 168 |

828: bis-A-type liquid epoxy (epoxy equivalent = 190 g/eq, refractive index = 1.57), manufactured by Mitsubishi Chemical Corporation
HP-4032: naphthol-type epoxy (epoxy equivalent = 150 g/eq, refractive index = 1.61), manufactured by DIC Corporation
HP-7200 H60: dicyclopentadiene-type epoxy (epoxy equivalent = 265 g/eq, manufactured by DIC Corporation) dissolved in cyclohexanone; solid content = 60%, refractive index = 1.58
HF-1M H60: phenol novolac (manufactured by Meiwa Plastic Industries, Ltd.) dissolved in cyclohexanone; solid content = 60%, solid OH equivalent = 100 g/eq, refractive index = 1.65
JONCRYL 68 H60: styrene-acrylic acid copolymer resin; Mw = 10,000, acid value = 195, solid equivalent = 287 g/eq, refractive index = 1.56, manufactured by Johnson Polymers Ltd.
IRG 907: 2-methyl-1-(4-methylthiophenyl)-2-morpholinopropane-1-one, manufactured by BASF Japan Ltd.
IRG 369: 2-benzyl-2-dimethylamino-1-(4-morpholinophenyl)-butanone-1, manufactured by BASF Japan Ltd.
IRG 379: 2-(4-methylbenzyl)-2-(dimethylamino)-1-(4-morpholinophenyl)ethane-1-one, manufactured by BASF Japan Ltd.
OXE-02: ethanone-1-[9-ethyl-6-(2-methylbenzoyl)-9H-carbazole-3-yl]-1-(o-acetyloxime), manufactured by BASF Japan Ltd.
TPO: LUCIRIN TPO, manufactured by BASF Japan Ltd.

TABLE 2

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| DSC measurement Irradiation dose: 500 mJ/cm$^2$ | Tpeak 1*[1] | 137 | 137 | 158 | 129 | 137 | 150 | 166 | 165 | 166 | 171 |
|  | Tpeak 2*[2] | 152 | 152 | 165 | 174 | 147 | 177 | 181 | 180 | *4 | *4 |
|  | ΔTpeak*[3] | 15 | 15 | 7 | 45 | 10 | 27 | 15 | 15 | — | — |
| DSC measurement Irradiation dose: 1000 mJ/cm$^2$ | Tpeak 1*[1] | 132 | 132 | 160 | 124 | 132 | 150 | 155 | 155 | 162 | 162 |
|  | Tpeak 2*[2] | 152 | 152 | 165 | 174 | 147 | 177 | 181 | 182 | *4 | *4 |
|  | ΔTpeak*[3] | 20 | 20 | 5 | 50 | 15 | 27 | 26 | 27 | — | — |

*[1] Exothermic peak temperature of the irradiated part
*[2] Exothermic peak temperature of the non-irradiated part
*[3] Tpeak 2 − Tpeak 1
*4 In Examples 9 and 10, no exothermic peak was observed before the irradiation and an exothermic peak appeared only after the irradiation.

TABLE 3

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| Light irradiation dose (mJ/cm$^2$) | 500 | 500 | 500 | 500 | 500 | 500 | 500 | 500 | 1,000 | 1,000 |
| Heating temperature (° C.) | 100 | 100 | 100 | 90 | 100 | 100 | 100 | 100 | 120 | 120 |
| Post-curing temperature (° C.) | 170 | 170 | 170 | 170 | 170 | 170 | 170 | 170 | 170 | 170 |

TABLE 3-continued

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| Ultraviolet irradiation dose (mJ/cm$^2$) | 1,000 | — | 1,000 | 1,000 | 1,000 | 1,000 | 1,000 | 1,000 | 1,000 | 1,000 |
| Alkali-developability/Patterning | ◯ | ◯ | ◯ | ◯ | ◯ | ◯ | ◯ | ◯ | ◯ | ◯ |
| Surface curing characteristics (desmear resistance) | ● | ◯ | ● | ● | ● | ● | ● | ● | ● | ● |

Comparative Examples 1 to 4

According to the respective formulations shown in Table 4 below, in the same manner as in the above-described Examples, a thermosetting resin composition was prepared and applied onto a substrate to prepare a substrate having a resin layer composed of the thermosetting resin composition. The DSC measurement results thereof are shown in Table 5 below.

In Comparative Example 1, the evaluations were carried out in the same manner as in Example 1, except that no photobase generator was blended.

In Comparative Example 2, the evaluations were carried out in the same manner as in Example 1, except that LUCIRIN TPO was blended in place of the photobase generator.

In Comparative Examples 3 and 4, the substrate was heat-treated for 30 minutes at the temperature shown in Table 6 without being subjected to the initial light irradiation. In addition, the subsequent ultraviolet irradiation and post-curing were also not performed. In Comparative Example 4, the resulting substrate was subjected to a desmearing treatment in the same manner as described in the above to evaluate the curing characteristics. The results thereof are shown in Table 6 below.

TABLE 4

|  |  | Comparative Example 1 | Comparative Example 2 | Comparative Example 3 | Comparative Example 4 |
|---|---|---|---|---|---|
| Heat-reactive compound | 828 | 100 | 100 | 100 | 100 |
|  | HP-4032 | — | — | — | — |
|  | HP-7200 H60 | — | — | — | — |
| Alkali-developable resin | HF-1M H60 | 88 | 88 | 88 | 88 |
|  | JONCRYL 68 | — | — | — | — |
| Photobase generator | IRG 907 | — | — | — | — |
|  | IRG 369 | — | — | 30 | 30 |
|  | IRG 379 | — | — | — | — |
|  | OXE-02 | — | — | — | — |
|  | TPO | — | 30 | — | — |
| Σ (solid) |  | 153 | 183 | 183 | 183 |

TABLE 5

|  |  | Comparative Example 1 | Comparative Example 2 | Comparative Example 3 | Comparative Example 4 |
|---|---|---|---|---|---|
| DSC measurement Light irradiation dose: 500 mJ/cm$^2$ | Tpeak 1*$^1$ | no peak | no peak | — | — |
|  | Tpeak 2*$^2$ | no peak | no peak | 152 | 152 |
|  | ΔTpeak*$^3$ | — | — | — | — |
| DSC measurement Light irradiation dose: 1,000 mJ/cm$^2$ | Tpeak 1*$^1$ | no peak | no peak | — | — |
|  | Tpeak 2*$^2$ | no peak | no peak | 152 | 152 |
|  | ΔTpeak*$^3$ | — | — | — | — |

TABLE 6

|  | Comparative Example 1 | Comparative Example 2 | Comparative Example 3 | Comparative Example 4 |
|---|---|---|---|---|
| Light irradiation dose (mJ/cm$^2$) | 500 | 500 | — | — |
| Heating temperature (° C.) | 100 | 100 | 100 | 170 |
| Ultraviolet irradiation dose (mJ/cm$^2$) | 1,000 | 1,000 | — | — |
| Post-curing temperature (° C.) | 170 | 170 | — | — |

TABLE 6-continued

| | Comparative Example 1 | Comparative Example 2 | Comparative Example 3 | Comparative Example 4 |
|---|---|---|---|---|
| Alkali developability/patterning | XX | XX | XX | X |
| Surface curing characteristics (desmear resistance) | — | — | — | ○ |

From the results shown in the above Tables 3 and 6, in Examples 1 to 10, it was found that, by using a thermosetting resin composition comprising a heat-reactive compound, an alkali-developable resin and a photobase generator, a pattern having excellent curing characteristics (e.g., desmear resistance) can be formed by development. On the other hand, in Comparative Examples 1 to 4, it was difficult to form a pattern.

Examples 11 to 96 and Comparative Examples 5 to 16

In Examples 11 to 96 and Comparative Examples 5 to 16, a thermosetting resin composition was prepared in the same manner as in Example 1. FIG. 9 shows one example of the method of producing a printed circuit board according to the present invention.

In Example 11, in the same manner as in Example 1, the thus obtained liquid thermosetting resin composition was directly applied and dried onto a printed circuit substrate and then sequentially subjected to light irradiation, heat treatment, alkali development, ultraviolet irradiation and heat-curing.

In Examples 12 to 96 and Comparative Examples 5 to 16, a dry film was prepared using the thus obtained thermosetting resin composition in the below-described manner and then laminated on a printed circuit substrate to prepare a printed circuit board.

<Preparation of Dry Film>

Using an applicator, a thermosetting resin composition was applied onto a 38 μm-thick PET film used as a carrier film. Then, the thermosetting resin composition was dried at 90° C. for 30 minutes to prepare a dry film. The application amount was adjusted such that the thickness of the thermosetting resin composition after drying became about 20 μm. Thereafter, a slit of a prescribed size was formed on the thus dried film.

<Laminate>

A double-sided printed circuit substrate having a 15 μm-thick copper circuit is formed on both sides was prepared and pre-treated using CZ-8100 (manufactured by MEC Company Ltd.). Then, using a vacuum laminator (MVLP-500, manufactured by Meiki Co., Ltd.), the thus obtained dry film was laminated on the pretreated printed circuit substrate to prepare a printed circuit board having a resin layer. The lamination was performed at a temperature of 80° C. and a pressure of 5 kg/cm$^2$/60 sec.

<Evaluation of B-stage State (Handling in Formation on Substrate)>

For the thermosetting resin compositions of Examples 12 to 96, the B-stage state (semi-cured state) of dry film (DF) was evaluated. A DF was prepared using the thus obtained thermosetting resin composition and a slit of a prescribed size was formed on the DF. The condition of the DF was evaluated in accordance with the following criteria.

(Evaluation Criteria)

●: After the slit-formation process, neither cracking of the resin layer nor chalking of the resin was observed.

○: After the slit-formation process, minor cracking of the resin layer was observed; however no chalking of the resin was observed.

Δ: After the slit-formation process, both cracking of the resin layer and chalking of the resin were observed.

<Evaluation of Recess on Through-Hole>

Figure 10:
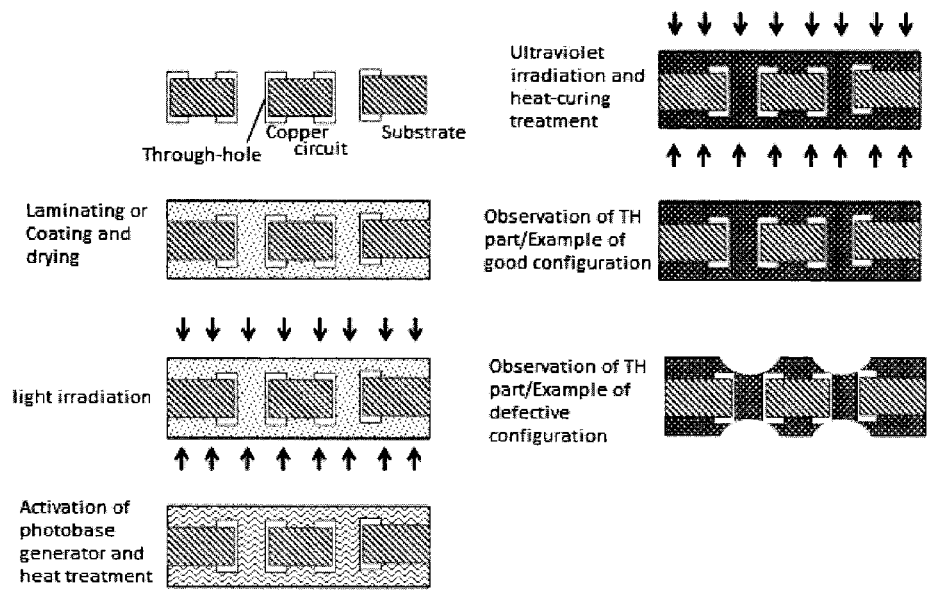
FIG. 10 shows the steps of producing a printed circuit board for evaluation of recesses on through-holes in Examples of the present invention.

As shown in FIG. 10, a 0.3 mm-thick double-sided printed circuit substrate, on which copper-plated through-holes of 300 μm in diameter were formed at a pitch distance of 1 mm, was prepared and pre-treated using CZ-8100 (manufactured by MEC Company Ltd.). Then, using a vacuum laminator (MVLP-500, manufactured by Meiki Co., Ltd.), a 50 μm-thick dry film, which was prepared in accordance with the method described in the above paragraph directed to the preparation of a dry film, was laminated simultaneously on both sides of the printed circuit substrate having the through-holes formed thereon. The lamination was performed at a temperature of 80° C. and a pressure of 5 kg/cm$^2$/60 sec. Then, using HMW680GW (metal halide lamp, scattering light-type; manufactured by ORC Manufacturing Co., Ltd.), the entire surfaces of both sides of the thus obtained substrate having a thermosetting resin layer were subjected to light irradiation. The irradiation dose was set as shown in Tables 7 to 14 below with reference to the respective exothermic peak temperatures measured by DSC. Then, the resulting substrate was placed vertically and heat-treated for 60 to 80 minutes at the temperature shown in Tables 7 to 14. Using an ultraviolet irradiation apparatus (manufactured by ORC Manufacturing Co., Ltd.), the thus heat-treated substrate was further irradiated with an ultraviolet light at an energy of 1 J/cm$^2$ and then placed vertically and completely cured at 170° C. for 60 minutes in a hot air circulation-type drying oven. Thereafter, using a surface roughness measuring apparatus (SE-700, manufactured by Kosaka Laboratory Ltd.), the amount of recesses on the through-holes was determined.

(Evaluation Criteria)

○: The maximum size of the recesses on the through-holes was 5 μm or smaller.

Δ: The maximum size of the recesses on the through-holes was larger than 5 μm.

<Formation of Line Pattern>

Using HMW680GW (metal halide lamp, scattering light-type; manufactured by ORC Manufacturing Co., Ltd.), the substrate having a resin layer obtained in the above was irradiated with a light in a negative pattern having a designed value of line/space=100/100 μm. The irradiation dose was set as shown in Tables 7 to 14 below with reference to the respective exothermic peak temperatures measured by DSC. Then, the resulting substrate was heat-treated for 60 to 80 minutes at the temperature shown in Tables 7 to 14. Thereafter, the substrate was developed by being immersed in a 3 wt % TMAH/5 wt % ethanolamine mixed aqueous solution at 35° C. for 3 minutes, and the resulting line pattern having a designed width of 100 μm was evaluated in accordance with the following criteria. The results thereof are shown in Tables 7 to 14.
(Evaluation Criteria)

○: A pattern was obtained as designed with the lines having a top length of 100 μm and a bottom length of 100 μm.

Δ: The lines had a top length of 100 μm and a bottom length of 60 μm to less than 100 μm, and a minor under-cut was observed.

x: The lines had a top length of 100 μm and a bottom length of less than 60 μm, and a large under-cut was observed at the bottom.

<Evaluation of Warping after Curing>

Using a vacuum laminator (MVLP-500, manufactured by Meiki Co., Ltd.), a 20 μm-thick dry film, which was prepared in accordance with the method described in the above paragraph directed to the preparation of a dry film, was laminated on a glossy surface of a 18 μm-thick copper foil cut into a 50 mm×50 mm square. The lamination was performed at a temperature of 80° C. and a pressure of 5 kg/cm²/60 sec. Subsequently, using HMW680GW (metal halide lamp, scattering light-type; manufactured by ORC Manufacturing Co., Ltd.), the entire surface of the resulting copper foil having a thermosetting resin layer was solidly irradiated with a light. The irradiation dose was set as shown in Tables 7 to 14 below with reference to the respective exothermic peak temperatures measured by DSC. Then, the resulting substrate was heat-treated for 60 to 80 minutes at the temperature shown in Tables 7 to 14. Using an ultraviolet irradiation apparatus (manufactured by ORC Manufacturing Co., Ltd.), the thus heat-treated substrate was further irradiated with an ultraviolet light at an energy of 1 J/cm² and then cured at 170° C. for 60 minutes in a hot air circulation-type drying oven to obtain a copper foil having a thermosetting resin composition on one side. Thereafter, in order to evaluate the warping condition of the thus obtained cured product, the warpage amount was measured with calipers at 4 spots on the edge.
(Evaluation Criteria)

●: Hardy any warping was observed. The warpage amount of the largest warping at the 4 edge spots was less than 5 mm.

○: Minor warping was observed. The warpage amount of the largest warping at the 4 edge spots was 5 mm to less than 20 mm.

Δ: The warpage amount of the largest warping at the 4 edge spots was 20 mm or greater.

x: The cured product shrank into the form of a cylinder. The warpage amount at the edge could not be measured with calipers.

<CTE Measurement>

In accordance with the method described in the above paragraph directed to the preparation of a dry film, a 40 μm-thick dry film was prepared from the respective thermosetting resin compositions. Then, using a vacuum laminator (MVLP-500, manufactured by Meiki Co., Ltd.), the thus obtained dry film was laminated on the glossy surface side of a 18 μm-thick copper foil. The lamination was performed at a temperature of 80° C. and a pressure of 5 kg/cm²/60 sec. Subsequently, using HMW680GW (metal halide lamp, scattering light-type; manufactured by ORC Manufacturing Co., Ltd.), the entire surface of the resulting copper foil was solidly irradiated with a light. The irradiation dose was set as shown in Tables 7 to 14 below with reference to the respective exothermic peak temperatures measured by DSC. Then, the copper foil was heat-treated for 60 to 80 minutes at the temperature shown in Tables 7 to 14. Using an ultraviolet irradiation apparatus (manufactured by ORC Manufacturing Co., Ltd.), the thus heat-treated copper foil was further irradiated with an ultraviolet light at an energy of 1 J/cm² and then completely cured at 170° C. for 60 minutes in a hot air circulation-type drying oven. Thereafter, by detaching from the copper foil, the respective resin compositions according to Examples and Comparative Examples were obtained. The thus obtained resin compositions were each cut out into a rectangle of 3 mm in width and 10 mm in length and then subjected to CTE (coefficient of thermal expansion) measurement in accordance with the TMA method (tensile method) prescribed in JIS C6481. The coefficient of thermal expansion was evaluated at a heating rate of 5° C./min and a temperature of Tg or lower and expressed in terms of average coefficient of thermal expansion in the temperature range of 25° C. to 100° C. in the unit of ppm.

The thus obtained CTE values are shown in Tables 7 to 14.

<Evaluation of Thermal Cycle Characteristics>

Using a commercially available electroless nickel plating bath and electroless gold plating bath, a printed circuit board which had been subjected to a desmearing treatment with permanganate in the above-described manner was plated at a nickel thickness of 0.5 μm and a gold plating thickness of 0.03 μm, and the patterned layer was subjected to a gold-plating treatment. For the resulting printed circuit board, the thermal cycle characteristics were evaluated. After applying 2,000 cycles of a thermal history in which each cycle consists of a 30-minute treatment at −65° C. and a 30-minute treatment at 150° C., the conditions of the surface and periphery of the pattern were observed under a light microscope to evaluate the cracking in accordance with the below-described criteria. The pattern was observed for a total of 100 holes. The results thereof are shown in Tables 7 to 14 below.
(Evaluation Criteria)

●○: Cracking occurred on neither the surface nor the periphery of the patterned layer.

●: The crack occurrence in the periphery of the patterned layer was less than 10%.

○: The crack occurrence in the periphery of the patterned layer was 10% to less than 30%.

Δ: The crack occurrence in the periphery of the patterned layer was 30% or higher.

<Method of Measuring Refractive Indices of Heat-reactive Compound, Maleimide Compound and Alkali-developable Resin>

Measuring apparatus: Abbe refractometer

Measurement conditions: wavelength=589.3 nm, temperature=25° C.

TABLE 7

| | Components | Solid content | Example 11 | Example 12 | Example 13 | Example 14 | Example 15 | Example 16 | Example 17 | Example 18 | Example 19 | Example 20 |
|---|---|---|---|---|---|---|---|---|---|---|---|---|
| Heat-reactive compound | 828 | 100 | 100 | 100 | | 100 | 100 | 100 | 100 | 50 | 50 | 50 |
| | HP-4032 | 100 | | | | | | | | 50 | 50 | 50 |
| | HP-7200 H60 | 60 | | | 166 | | | | | | | |
| Maleimide | UVT-302 | 100 | | | | | | | | | | |

TABLE 7-continued

|  | Components | Solid content | Example 11 | Example 12 | Example 13 | Example 14 | Example 15 | Example 16 | Example 17 | Example 18 | Example 19 | Example 20 |
|---|---|---|---|---|---|---|---|---|---|---|---|---|
| compound | DIC maleimide MIA-200 | 100 | | | | | | | | | | |
|  | BMI-3000 | 100 | | | | | | | | | | |
| Alkali-developable resin | HF-1M H60 solid OH equivalent: 100 g/eq | 60 | 88 | 88 | 63 | 88 | | | | 100 | 100 | 100 |
|  | MEH-7851M H60 solid OH equivalent: 210 g/eq | 60 | | | | | 222 | 92 | 330 | | | |
|  | JONCRYL 586 H60 solid equivalent: 519 g/eq | 60 | | | | | | | | | | |
|  | JONCRYL 68 H60 solid equivalent: 287 g/eq | 60 | | | | | | | | | | |
| Photobase generator | IRG 907 | 100 | 30 | 30 | 30 | | | | | 30 | | |
|  | IRG 369 | 100 | | | | 30 | 30 | 30 | 30 | | 30 | |
|  | IRG 379 | 100 | | | | | | | | | | 30 |
|  | OXE-02 | 100 | | | | | | | | | | |
|  | WPBG-140 | 100 | | | | | | | | | | |
| Polymeric resin | MAM M52 H30 | 30 | | | | | | | | | | |
|  | PB3600 | 100 | | | | | | | | | | |
|  | KS-10 | 30 | | | | | | | | | | |
|  | XER-91 | 100 | | | | | | | | | | |
|  | PARALOID EXL2655 | 100 | | | | | | | | | | |
|  | YX8100 BH30 | 30 | | | | | | | | | | |
| Inorganic filler | SO-C2/silica D50 = 0.5 um, refractive index = 1.45, 2.2 g/cm³ | 100 | | | | | | | | | | |
|  | AO-502/alumina D50 = 0.7 um, refractive index = 1.76 3.9 g/cm³ | 100 | | | | | | | | | | |
|  | HIGILITE H-42M D50 = 1.0 um, refractive index = 1.65, 2.4 g/cm³ | 100 | | | | | | | | | | |
|  | B-30 D50 = 0.3 um, refractive index = 1.64, 4.3 g/cm³ | 100 | | | | | | | | | | |
|  | DAW-10/alumina D50 = 10 um, refractive index = 1.76, 3.9 g/cm³ | 100 | | | | | | | | | | |
|  | US-10/silica D50 = 10 um, refractive index = 1.45, 2.2 g/cm³ | 100 | | | | | | | | | | |
| Coloring agent | phthalocyanine blue | 100 | | | | | | | | | | |
|  | Carbon MA-50: carbon black | 100 | | | | | | | | | | |
|  | CR58 rutile-type titanium oxide D50 = 0.28 um, 4.2 g/cm³ | 100 | | | | | | | | | | |
|  | Chrome phthal yellow | 100 | | | | | | | | | | |
| Other | R-2000 | 61 | | | | | | | | | | |
|  | IRG-184 | 100 | | | | | | | | | | |
|  | DPHA | 100 | | | | | | | | | | |
|  | LAROMER LR8863 | 100 | | | | | | | | | | |
|  | Σ (solid) | | 183 | 183 | 167 | 183 | 263 | 185 | 329 | 190 | 190 | 190 |
|  | Σ (varnish) | | 218 | 218 | 259 | 218 | 352 | 222 | 460 | 230 | 230 | 230 |
|  | Equivalence ratio (heat-reactive group:alkali-developable group) | | 1:1 | 1:1 | 1:1 | 1:1 | 1:1.2 | 1:0.5 | 1:1.8 | 1:1 | 1:1 | 1:1 |
|  | Inorganic filler content (wt %) | | 0 | 0 | 0 | 0 | 0 | 0 | 0 | 0 | 0 | 0 |
|  | Coloring agent content (wt %) | | 0 | 0 | 0 | 0 | 0 | 0 | 0 | 0 | 0 | 0 |
|  | Polymeric resin content (wt %) | | 0 | 0 | 0 | 0 | 0 | 0 | 0 | 0 | 0 | 0 |
| Evaluation | Method of forming a layer of prepared resin composition on a substrate | | liquid | DF | DF | DF | DF | DF | DF | DF | DF | DF |
|  | Handling property in the formation of a resin layer on a substrate | | Δ | Δ | Δ | Δ | Δ | Δ | Δ | Δ | Δ | Δ |
|  | Light irradiation dose (mJ/cm²) | | 750 | 750 | 750 | 750 | 750 | 750 | 750 | 500 | 500 | 500 |
|  | Heating temperature (° C.) | | 120 | 120 | 120 | 100 | 100 | 100 | 100 | 120 | 100 | 100 |
|  | Ultraviolet irradiation dose (mJ/cm²) | | 1,000 | 1,000 | 1,000 | 1,000 | 1,000 | 1,000 | 1,000 | 1,000 | 1,000 | 1,000 |
|  | Post-curing temperature (° C.) | | 170 | 170 | 170 | 170 | 170 | 170 | 170 | 170 | 170 | 170 |
|  | Evaluation of recess on through-hole | | Δ | Δ | Δ | Δ | Δ | Δ | Δ | Δ | Δ | Δ |

TABLE 7-continued

| Components | Solid content | Example 11 | Example 12 | Example 13 | Example 14 | Example 15 | Example 16 | Example 17 | Example 18 | Example 19 | Example 20 |
|---|---|---|---|---|---|---|---|---|---|---|---|
| Formation of opening pattern | | ○ | ○ | ○ | ○ | ○ | ○ | ○ | ○ | ○ | ○ |
| Formation of line pattern | | ○ | ○ | ○ | ○ | ○ | ○ | ○ | ○ | ○ | ○ |
| Curability (desmear resistance) | | ● | ● | ● | ● | ● | ● | ● | ● | ● | ● |
| Warping after curing | | Δ | Δ | Δ | Δ | Δ | Δ | Δ | Δ | Δ | Δ |
| CTE measurement (unit: ppm) | | 60 | 59 | 55 | 60 | 60 | 58 | 59 | 50 | 52 | 50 |
| Thermal cycle characteristics | | Δ | Δ | Δ | Δ | Δ | Δ | Δ | Δ | Δ | Δ |

TABLE 8

| Components | | Solid content | Example 21 | Example 22 | Example 23 | Example 24 | Example 25 | Example 26 | Example 27 | Example 28 | Example 29 | Example 30 | Example 31 |
|---|---|---|---|---|---|---|---|---|---|---|---|---|---|
| Heat-reactive compound | 828 | 100 | 50 | 50 | 50 | 100 | 100 | 100 | 100 | 100 | 100 | 50 | 100 |
|  | HP-4032 | 100 | 50 | 50 |  |  |  |  |  |  |  | 50 |  |
|  | HP-7200 H60 | 60 |  |  | 83 |  |  |  |  |  |  |  |  |
|  | UVT-302 | 100 |  |  |  |  |  |  |  |  |  |  |  |
|  | DIC maleimide MIA-200 | 100 |  |  |  |  |  |  |  |  |  |  |  |
| Maleimide compound | BMI-3000 | 100 |  |  |  |  |  |  |  |  |  |  |  |
| Alkali-developable resin | HF-1M H60 solid OH equivalent: 100 g/eq | 60 | 100 | 100 | 75 |  |  |  |  |  |  |  | 43 |
|  | MEH-7851M H60 solid OH equivalent: 210 g/eq | 60 |  |  |  |  |  |  |  |  |  |  |  |
|  | JONCRYL 586 H60 solid OH equivalent: 519 g/eq | 60 |  |  |  | 252 | 410 |  |  | 435 | 252 | 285 | 127 |
|  | JONCRYL 68 H60 solid OH equivalent: 287 g/eq | 60 |  |  |  |  |  | 92 | 683 |  |  |  | 30 |
| Photobase generator | IRG 907 | 100 |  |  |  |  |  |  |  |  |  |  |  |
|  | IRG 369 | 100 |  |  | 30 | 30 | 30 | 30 | 30 |  |  |  |  |
|  | IRG 379 | 100 |  |  |  |  |  |  |  |  |  |  |  |
|  | OXE-02 | 100 | 10 |  |  |  |  |  |  | 10 | 10 | 10 |  |
|  | WPBG-140 | 100 |  | 10 |  |  |  |  |  |  |  |  |  |
| Polymeric resin | MAM M52 H30 | 30 |  |  |  |  |  |  |  |  |  |  |  |
|  | PB3600 | 100 |  |  |  |  |  |  |  |  |  |  |  |
|  | KS-10 | 30 |  |  |  |  |  |  |  |  |  |  |  |
|  | XER-91 | 100 |  |  |  |  |  |  |  |  |  |  |  |
|  | PARALOID EXL2655 | 100 |  |  |  |  |  |  |  |  |  |  |  |
|  | YX8100 BH30 | 30 |  |  |  |  |  |  |  |  |  |  |  |
| Inorganic filler | SO-C2/silica D50 = 0.5 um, refractive index = 1.45, 2.2 g/cm³ | 100 |  |  |  |  |  |  |  |  |  |  |  |
|  | AO-502/alumina D50 = 0.7 um, refractive index = 1.76, 3.9 g/cm³ | 100 |  |  |  |  |  |  |  |  |  |  |  |
|  | HIGILITE H-42M D50 = 1.0 um, refractive index = 1.65, 2.4 g/cm³ | 100 |  |  |  |  |  |  |  |  |  |  |  |
|  | B-30 D50 = 0.3 um, refractive index = 1.64, 4.3 g/cm³ | 100 |  |  |  |  |  |  |  |  |  |  |  |
|  | DAW-10/alumina D50 = 10 um, refractive index = 1.76, 3.9 g/cm³ | 100 |  |  |  |  |  |  |  |  |  |  |  |

TABLE 8-continued

| Components | | Solid content | Example 21 | Example 22 | Example 23 | Example 24 | Example 25 | Example 26 | Example 27 | Example 28 | Example 29 | Example 30 | Example 31 |
|---|---|---|---|---|---|---|---|---|---|---|---|---|---|
| | US-10/silica D50 = 10 um, refractive index = 1.45, 2.2 g/cm³ | 100 | | | | | | | | | | | |
| Coloring agent | phthalocyanine blue | 100 | | | | | | | | | | | |
| | Carbon MA-50: carbon black | 100 | | | | | | | | | | | |
| | CR58 rutile-type titanium oxide D50 = 0.28 um, 4.2 g/cm³ | 100 | | | | | | | | | | | |
| | Chrome phthal yellow | 100 | | | | | | | | | | | |
| Other | R-2000 | 61 | | | | | | | | | | | |
| | IRG-184 | 100 | | | | | | | | | | | |
| | DPHA | 100 | | | | | | | | | | | |
| | LAROMER LR8863 | 100 | | | | | | | | | | | |
| | Σ (solid) | | 170 | 170 | 175 | 281 | 376 | 185 | 540 | 261 | 261 | 281 | 232 |
| | Σ (varnish) | | 210 | 210 | 238 | 382 | 540 | 222 | 813 | 545 | 362 | 395 | 300 |
| | Equivalence ratio (heat-reactive group:alkali-developable group) | | 1:1 | 1:1 | 1:1 | 1:1 | 1:0.9 | 1:0.2 | 1:1.5 | 1:1 | 1:1 | 1:1 | 1:1 |
| | Inorganic filler content (wt %) | | 0 | 0 | 0 | 0 | 0 | 0 | 0 | 0 | 0 | 0 | 0 |
| | Coloring agent content (wt %) | | 0 | 0 | 0 | 0 | 0 | 0 | 0 | 0 | 0 | 0 | 0 |
| | Polymeric resin content (wt %) | | 0 | 0 | 0 | 0 | 0 | 0 | 0 | 0 | 0 | 0 | 0 |
| Evaluation | Method of forming a layer of prepared resin composition on a substrate | | DF | DF | DF | DF | DF | DF | DF | DF | DF | DF | DF |
| | Handling property in the formation of a resin layer on a substrate | | △ | △ | △ | △ | △ | △ | △ | △ | △ | △ | △ |
| | Light irradiation dose (mJ/cm²) | | 500 | 500 | 500 | 500 | 500 | 500 | 500 | 500 | 500 | 500 | 500 |
| | Heating temperature (° C.) | | 100 | 100 | 100 | 100 | 100 | 100 | 100 | 100 | 100 | 100 | 100 |
| | Ultraviolet irradiation dose (mJ/cm²) | | 1,000 | 1,000 | 1,000 | 1,000 | 1,000 | 1,000 | 1,000 | 1,000 | 1,000 | 1,000 | 1,000 |
| | Post-curing temperature (° C.) | | 170 | 170 | 170 | 170 | 170 | 170 | 170 | 170 | 170 | 170 | 170 |
| | Evaluation of recess on through-hole | | △ | △ | △ | △ | △ | △ | △ | △ | △ | △ | △ |
| | Formation of opening pattern | | ○ | ○ | ○ | ● | ● | ● | ● | ● | ● | ● | ● |
| | Formation of line pattern | | ● | ● | ○ | ○ | ○ | ○ | ○ | ○ | ○ | ○ | ○ |
| | Curability (desmear resistance) | | △ | ● | ● | ● | ● | ● | ● | ● | ● | ● | ● |
| | Warping after curing | | △ | △ | △ | △ | △ | △ | △ | △ | △ | △ | △ |
| | CTE measurement (unit: ppm) | | 50 | 50 | 58 | 60 | 60 | 59 | 60 | 58 | 59 | 50 | 58 |
| | Thermal cycle characteristics | | △ | △ | △ | △ | △ | △ | △ | △ | △ | △ | △ |

TABLE 9

| Components | | Solid content | Example 32 | Example 33 | Example 34 | Example 35 | Example 36 | Example 37 | Example 38 | Example 39 | Example 40 | Example 41 | Example 42 |
|---|---|---|---|---|---|---|---|---|---|---|---|---|---|
| Heat-reactive compound | 828 | 100 | 50 | 50 | 50 | 50 | 100 | 100 | 100 | 100 | 100 | 100 | 100 |
| | HP-4032 | 100 | 50 | 50 | 50 | 50 | | | | | | | |
| | HP-7200 H60 | 60 | | | | | | | | | | | |
| | UVT-302 | 100 | | | | | | | | | | | |
| Maleimide compound | DIC maleimide MIA-200 | 100 | | | | | | | | | | | |
| | BMI-3000 | 100 | | | | | | | | | | | |
| Alkali-developable resin | HF-1M H60 solid OH equivalent: 100 g/eq | 60 | 100 | 100 | 100 | 100 | | | | | | | |
| | MEH-7851M H60 solid OH equivalent: 210 g/eq | 60 | | | | | 88 | | | | | | |
| | JONCRYL 586 H60 solid equivalent: 519 g/eq | 60 | | | | | | 222 | 92 | 330 | | | |
| | JONCRYL 68 H60 solid equivalent: 287 g/eq | 60 | | | | | | | | | 410 | 92 | 683 |
| Photobase generator | IRG 907 | 100 | | | | | | | | | | | |
| | IRG 369 | 100 | | | | | | | | | | | |
| | IRG 379 | 100 | 30 | 30 | 30 | 30 | 30 | 30 | 30 | 30 | 30 | 30 | 30 |
| | OXE-02 | 100 | | | | | | | | | | | |
| | WPBG-140 | 100 | | | | | | | | | | | |
| Polymeric resin | MAM M52 H30 | 30 | | | | | | | | | | | |
| | PB3600 | 100 | | | | | | | | | | | |
| | KS-10 | 30 | | | | | | | | | | | |
| | XER-91 | 100 | | | | | | | | | | | |
| | PARALOID EXL2655 | 100 | | | | | | | | | | | |
| | YX8100 BH30 | 30 | | | | | | | | | | | |
| Inorganic filler | SO-C2/silica D50 = 0.5 um, refractive index = 1.45, 2.2 g/cm³ | 100 | | | | | | | | | | | |
| | AO-502/alumina D50 = 0.7 um, refractive index = 1.76, 3.9 g/cm³ | 100 | | | | | | 260 | 185 | 330 | 370 | 182 | 530 |
| | HIGILITE H-42M D50 = 1.0 um, refractive index = 1.65, 2.4 g/cm³ | 100 | | | | | 183 | | | | | | |
| | B-30 D50 = 0.3 um, refractive index = 1.64, 4.3 g/cm³ | 100 | | | | | | | | | | | |
| | DAW-10/alumina D50 = 10 um, refractive index = 1.76, 3.9 g/cm³ | 100 | | | | | | | | | | | |

TABLE 9-continued

| Components | | Solid content | Example 32 | Example 33 | Example 34 | Example 35 | Example 36 | Example 37 | Example 38 | Example 39 | Example 40 | Example 41 | Example 42 |
|---|---|---|---|---|---|---|---|---|---|---|---|---|---|
| | US-10/silica D50 = 10 um, refractive index = 1.45, 2.2 g/cm³ | 100 | | | | | | | | | | | |
| Coloring agent | phthalocyanine blue | 100 | 2 | | | | | | | | | | |
| | Carbon MA-50: carbon black | 100 | | 1 | | | | | | | | | |
| | CR58 rutile-type titanium oxide D50 = 0.28 um, 4.2 g/cm³ | 100 | | | 60 | | | | | | | | |
| | Chrome phthal yellow | 100 | 2 | | | 2 | | | | | | | |
| Other | R-2000 | 61 | | | | | | | | | | | |
| | IRG-184 | 100 | | | | | | | | | | | |
| | DPHA | 100 | | | | | | | | | | | |
| | LAROMER LR8863 | 100 | | | | 20 | | | | | | | |
| Equivalence ratio (heat-reactive group:alkali-developable group) | | | 1:1 | 1:1 | 1:1 | 1:1 | 1:1 | 1:1.2 | 1:0.5 | 1:1.8 | 1:0.9 | 1:0.2 | 1:1.5 |
| Inorganic filler content (wt %) | | | 194 | 191 | 250 | 214 | 366 | 523 | 370 | 659 | 746 | 367 | 1070 |
| Σ (solid) | | | 234 | 231 | 290 | 254 | 401 | 612 | 407 | 790 | 910 | 404 | 1343 |
| Σ (varnish) | | | 0 | 0 | 0 | 0 | 50 | 50 | 50 | 50 | 50 | 50 | 50 |
| Coloring agent content (wt %) | | | 2 | 1 | 24 | 2 | 0 | 0 | 0 | 0 | 0 | 0 | 0 |
| Polymeric resin content (wt %) | | | 0 | 0 | 0 | 0 | 0 | 0 | 0 | 0 | 0 | 0 | 0 |
| Evaluation | Method of forming a layer of prepared resin composition on a substrate | | DF | DF | DF | DF | DF | DF | DF | DF | DF | DF | DF |
| | Handling property in the formation of a resin layer on a substrate | | △ | △ | △ | △ | △ | △ | △ | △ | △ | △ | △ |
| | Light irradiation dose (mJ/cm²) | | 500 | 500 | 500 | 500 | 500 | 500 | 500 | 500 | 500 | 500 | 500 |
| | Heating temperature (° C.) | | 100 | 100 | 100 | 100 | 100 | 100 | 100 | 100 | 100 | 100 | 100 |
| | Ultraviolet irradiation dose (mJ/cm²) | | 1,000 | 1,000 | 1,000 | 1,000 | 1,000 | 1,000 | 1,000 | 1,000 | 1,000 | 1,000 | 1,000 |
| | Post-curing temperature (° C.) | | 170 | 170 | 170 | 170 | 170 | 170 | 170 | 170 | 170 | 170 | 170 |
| | Evaluation of recess on through-hole | | △ | △ | △ | △ | △ | △ | △ | △ | △ | △ | △ |
| | Formation of opening pattern | | ●○○○ | ●○○○ | ●○○○ | ○○○● | ○○○○ | ○○○○ | ○○○○ | ○○○○ | ●○○○ | ●○○○ | ●○○○ |
| | Formation of line pattern | | △ | △ | △ | △ | △ | △ | △ | △ | △ | △ | △ |
| | Curability (desmear resistance) | | ● | ● | ● | ● | ○ | ○ | ○ | ○ | ● | ● | ● |
| | Warping after curing | | △ | △ | △ | △ | ○ | ○ | ○ | ○ | ○ | ○ | ○ |
| | CTE measurement (unit: ppm) | | 50 | 50 | 45 | 50 | 35 | 35 | 38 | 37 | 35 | 35 | 36 |
| | Thermal cycle characteristics | | △ | △ | △ | △ | ○ | ○ | ○ | ○ | ○ | ○ | ○ |

TABLE 10

| Components | | Solid content | Example 43 | Example 44 | Example 45 | Example 46 | Example 47 | Example 48 | Example 49 | Example 50 | Example 51 | Example 52 | Example 53 | Example 54 | Example 55 | Example 56 |
|---|---|---|---|---|---|---|---|---|---|---|---|---|---|---|---|---|
| Heat-reactive compound | 828 | 100 | 50 | 50 | 50 | 50 | 50 | 100 | 100 | 100 | 100 | 100 | 100 | 100 | 100 | 100 |
| | HP-4032 | 100 | 50 | 50 | 50 | 50 | 50 | | | | | | | | | |
| | HP-7200 H60 | 60 | | | | | | | | | | | | | | |
| Maleimide compound | UVT-302 | 100 | | | | | | | | | | | | | | |
| | DIC maleimide | 100 | | | | | | | | | | | | | | |
| | MIA-200 | | | | | | | | | | | | | | | |
| | BMI-3000 | 100 | | | | | | | | | | | | | | |
| Alkali-developable resin | HF-1M H60 solid OH equivalent: 100 g/eq | 60 | 100 | 100 | 100 | 100 | 100 | | | | | | | | | |
| | MEH-7851M H60 solid OH equivalent: 210 g/eq | 60 | | | | | | | | 88 | | 92 | 330 | | | |
| | JONCRYL 586 H60 solid equivalent: 519 g/eq | 60 | | | | | | 478 | 478 | | 222 | | | 410 | | |
| | JONCRYL 68 H60 solid equivalent: 287 g/eq | 60 | | | | | | | | | | | | | | 683 |
| Photobase generator | IRG 907 | 100 | 30 | 30 | 30 | 30 | 30 | | | 30 | 30 | 30 | 30 | 30 | 30 | 30 |
| | IRG 369 | 100 | | | | | | | | | | | | | | |
| | IRG 379 | 100 | | | | | | | | | | | | | | |
| | OXE-02 | 100 | | | | | | | 10 | | | | | | | |
| | WPBG-140 | 100 | | | | | | 10 | | | | | | | | |
| Polymeric resin | MAM M52 H30 | 30 | | | | | | | | | | | | | | |
| | PB3600 | 100 | | | | | | | | | | | | | | |
| | KS-10 | 30 | | | | | | | | | | | | | | |
| | XER-91 | 100 | | | | | | | | | | | | | | |
| | PARALOID EXL2655 | 100 | | | | | | | | | | | | | | |
| Inorganic filler | YX8100 BH30 | 30 | 190 | 190 | | | | | | | | | | | | |
| | SO-C2/silica D50 = 0.5 um, refractive index = 1.45, 2.2 g/cm³ | 100 | | | | | 95 | 400 | | 67 | 100 | 67 | 117 | 40 | 20 | 60 |
| | AO-502/alumina D50 = 0.7 um, refractive index = 1.76, 3.9 g/cm³ | 100 | | | | | | | | | | | | | | |

TABLE 10-continued

| Components | | Solid content | Example 43 | Example 44 | Example 45 | Example 46 | Example 47 | Example 48 | Example 49 | Example 50 | Example 51 | Example 52 | Example 53 | Example 54 | Example 55 | Example 56 |
|---|---|---|---|---|---|---|---|---|---|---|---|---|---|---|---|---|
| | HIGILITE H-42M D50 = 1.0 um, refractive index = 1.65, 2.4 g/cm³ | 100 | | | 190 | | | | | | | | | | | |
| | B-30 D50 = 0.3 um, refractive index = 1.64, 4.3 g/cm³ | 100 | | | | 190 | 95 | | 400 | | | | | | | |
| | DAW-10/alumina D50 = 10 um, refractive index = 1.76, 3.9 g/cm³ | 100 | | | | | | | | | | | | | | |
| | US-10/silica D50 = 10 um, refractive index = 1.45, 2.2 g/cm³ | 100 | | | | | | | | | | | | | | |
| Coloring agent | phthalocyanine blue | 100 | | | | | | | | | | | | | | |
| | Carbon MA-50: carbon black | 100 | | | | | | | | | | | | | | |
| | CR58 rutile-type titanium oxide D50 = 0.28 um, 4.2 g/cm³ | 100 | | | | | | | | | | | | | | |
| | Chrome phthal yellow | 100 | | | | | | | | | | | | | | |
| Other | R-2000 | 61 | | | | | | | | | | | | | | |
| | IRG-184 | 100 | | | | | | | | | | | | | | |
| | DPHA | 100 | | | | | | | | | | | | | | |
| | LAROMER LR8863 | 100 | | | | | | | | | | | | | | |
| | Σ (solid) | | 380 | 380 | 380 | 380 | 380 | 797 | 797 | 203 | 293 | 205 | 364 | 416 | 205 | 600 |
| | Σ (varnish) | | 420 | 420 | 420 | 420 | 420 | 988 | 988 | 285 | 452 | 289 | 577 | 580 | 242 | 873 |
| | Equivalence ratio (heat-reactive group:alkali-developable group) | | 1:1 | 1:1 | 1:1 | 1:1 | 1:1 | 1:1 | 1:1 | 1:1 | 1:1.2 | 1:0.5 | 1:1.8 | 1:0.9 | 1:0.2 | 1:1.5 |
| | Inorganic filler content (wt %) | | 50 | 50 | 50 | 50 | 50 | 50 | 50 | 0 | 0 | 0 | 0 | 0 | 0 | 0 |
| | Coloring agent content (wt %) | | 0 | 0 | 0 | 0 | 0 | 0 | 0 | 0 | 0 | 0 | 0 | 0 | 0 | 0 |
| | Polymeric resin content (wt %) | | 0 | 0 | 0 | 0 | 0 | 0 | 0 | 10 | 10 | 10 | 10 | 10 | 10 | 10 |
| Evaluation | Method of forming a layer of prepared resin composition on a substrate | | DF | DF | DF | DF | DF | DF | DF | DF | DF | DF | DF | DF | DF | DF |
| | Handling property in the formation of a resin layer on a substrate | | △ | △ | △ | △ | △ | △ | △ | ● | ● | ● | ● | ● | ● | ● |

TABLE 10-continued

| Components | Solid content | Example 43 | Example 44 | Example 45 | Example 46 | Example 47 | Example 48 | Example 49 | Example 50 | Example 51 | Example 52 | Example 53 | Example 54 | Example 55 | Example 56 |
|---|---|---|---|---|---|---|---|---|---|---|---|---|---|---|---|
| Light irradiation dose (mJ/cm²) | | 500 | 500 | 500 | 500 | 500 | 500 | 500 | 500 | 500 | 500 | 500 | 500 | 500 | 500 |
| Heating temperature (° C.) | | 100 | 100 | 100 | 100 | 100 | 100 | 100 | 100 | 100 | 100 | 100 | 100 | 100 | 100 |
| Ultraviolet irradiation dose (mJ/cm²) | | 1,000 | 1,000 | 1,000 | 1,000 | 1,000 | 1,000 | 1,000 | 1,000 | 1,000 | 1,000 | 1,000 | 1,000 | 1,000 | 1,000 |
| Post-curing temperature (° C.) | | 170 | 170 | 170 | 170 | 170 | 170 | 170 | 170 | 170 | 170 | 170 | 170 | 170 | 170 |
| Evaluation of recess on through-hole | | △ | △ | △ | △ | △ | △ | △ | ○ | ○ | ○ | ○ | ○ | ○ | ○ |
| Formation of opening pattern | | ○ | ○ | ○ | ○ | ○ | ● | ● | ● | ● | ● | ● | ● | ● | ● |
| Formation of line pattern | | ○ | ○ | ○ | ○ | ○ | ○ | ○ | ○ | ○ | ○ | ○ | ○ | ○ | ○ |
| Curability (desmear resistance) | | ○ | ○ | ○ | ○ | ○ | ○ | ○ | ● | ● | ● | ● | ● | ● | ● |
| Warping after curing | | ○ | ○ | ○ | ○ | ○ | ○ | ○ | ● | ● | ● | ● | ● | ● | ● |
| CTE measurement (unit: ppm) | | 30 | 38 | 32 | 42 | 35 | 30 | 40 | 60 | 60 | 59 | 60 | 60 | 60 | 63 |
| Thermal cycle characteristics | | ○ | ○ | ○ | ○ | ○ | ○ | ○ | ○ | ○ | ○ | ○ | ○ | ○ | ○ |

TABLE 11

| Components | | Solid content | Example 57 | Example 58 | Example 59 | Example 60 | Example 61 | Example 62 | Example 63 | Example 64 | Example 65 | Example 66 | Example 67 | Example 68 |
|---|---|---|---|---|---|---|---|---|---|---|---|---|---|---|
| Heat-reactive compound | 828 | 100 | 50 | 50 | 50 | 50 | 50 | 50 | 50 | 50 | | | | |
| | HP-4032 | 100 | | | | | | | | | | | | |
| | HP-7200 H60 | 60 | 83 | 83 | 83 | 83 | 83 | 83 | 83 | 83 | | | | |
| Maleimide compound | UVT-302 | 100 | | | | | | | | | 100 | 100 | 100 | 100 |
| | DIC maleimide MIA-200 | 100 | | | | | | | | | | | | |
| | BMI-3000 | 100 | | | | | | | | | | | | |
| Alkali-developable resin | HF-1M H60 solid OH equivalent: 100 g/eq | 60 | 75 | 75 | 75 | 75 | 75 | | 75 | | 52 | | | |
| | MEH-7851M H60 solid OH equivalent: 210 g/eq | 60 | | | | | | | | | | 132 | 55 | 198 |
| | JONCRYL 586 H60 solid equivalent: 519 g/eq | 60 | | | | | | 217 | | 317 | | | | |
| | JONCRYL 68 H60 solid equivalent: 287 g/eq | 60 | | | | | | | | | | | | |
| Photobase generator | IRG 907 | 100 | 30 | 30 | 30 | 30 | 30 | 30 | 30 | 30 | 30 | 30 | 30 | 30 |
| | IRG 369 | 100 | | | | | | | | | | | | |
| | IRG 379 | 100 | | | | | | | | | | | | |
| | OXE-02 | 100 | | | | | | | | | | | | |
| | WPBG-140 | 100 | | | | | | | | | | | | |
| Polymeric resin | MAM M52 H30 | 30 | 67 | | | | | | | | | | | |
| | PB3600 | 100 | | 20 | | | | | | | | | | |
| | KS-10 | 30 | | | 67 | | | | | | | | | |
| | XER-91 | 100 | | | | 67 | 33 | 67 | | | | | | |
| | PARALOID EXL2655 | 100 | | | | | 33 | | 133 | 117 | | | | |
| | YX8100 BH30 | 30 | | | | | | | | | | | | |
| Inorganic filler | SO-C2/silica D50 = 0.5 um, refractive index = 1.45, 2.2 g/cm³ | 100 | | | | | | | | | | | | |
| | AO-502/alumina D50 = 0.7 um, refractive index = 1.76, 3.9 g/cm³ | 100 | | | | | | | | | | | | |
| | HIGILITE H-42M D50 = 1.0 um, refractive index = 1.65, 2.4 g/cm³ | 100 | | | | | | | 205 | | | | | |
| | B-30 D50 = 0.3 um, refractive index = 1.64, 4.3 g/cm³ | 100 | | | | | | | | 330 | | | | |
| | DAW-10/alumina D50 = 10 um, refractive index = 1.76, 3.9 g/cm³ | 100 | | | | | | | | | | | | |
| | US-10/silica D50 = 10 um, refractive index = 1.45, 2.2 g/cm³ | 100 | | | | | | | | | | | | |

TABLE 11-continued

| | Components | Solid content | Example 57 | Example 58 | Example 59 | Example 60 | Example 61 | Example 62 | Example 63 | Example 64 | Example 65 | Example 66 | Example 67 | Example 68 |
|---|---|---|---|---|---|---|---|---|---|---|---|---|---|---|
| Coloring agent | phthalocyanine blue | 100 | | | | | | | | | | | | |
| | Carbon MA-50: carbon black | 100 | | | | | | | | | | | | |
| | CR58 rutile-type titanium oxide D50 = 0.28 um, 4.2 g/cm³ | 100 | | | | | | | | | | | | |
| | Chrome phthal yellow | 61 | | | | | | | | | | | | |
| Other | R-2000 | 100 | | | | | | | | | | | | |
| | IRG-184 | 100 | | | | | | | | | | | | |
| | DPHA | 100 | | | | | | | | | | | | |
| | LAROMER LR8863 | 100 | | | | | | | | | | | | |
| | Σ (solid) | | 195 | 195 | 195 | 195 | 195 | 290 | 410 | 654.6 | 161 | 209 | 163 | 249 |
| | Σ (varnish) | | 305 | 258 | 305 | 305 | 304 | 447 | 576 | 927 | 182 | 262 | 185 | 328 |
| Equivalence ratio (heat-reactive group:alkali-developable group) | | | 1:1 | 1:1 | 1:1 | 1:1 | 1:1 | 1:1 | 1:1 | 1:1 | 1:1 | 1:1.2 | 1:0.5 | 1:1.8 |
| Inorganic filler content (wt %) | | | 0 | 0 | 0 | 0 | 0 | 0 | 50 | 50 | 0 | 0 | 0 | 0 |
| Coloring agent content (wt %) | | | 0 | 0 | 0 | 0 | 0 | 0 | 0 | 0 | 0 | 0 | 0 | 0 |
| Polymeric resin content (wt %) | | | 10 | 10 | 10 | 10 | 10 | 10 | 10 | 5 | 0 | 0 | 0 | 0 |
| Evaluation | Method of forming a layer of prepared resin composition on a substrate | | DF | DF | DF | DF | DF | DF | DF | DF | DF | DF | DF | DF |
| | Handling property in the formation of a resin layer on a substrate | | ● | ● | ● | ● | ● | ● | ○ | ○ | △ | △ | △ | △ |
| | Light irradiation dose (mJ/cm²) | | 500 | 500 | 500 | 500 | 500 | 500 | 500 | 500 | 500 | 500 | 500 | 500 |
| | Heating temperature (° C.) | | 100 | 100 | 100 | 100 | 100 | 100 | 100 | 100 | 100 | 100 | 100 | 100 |
| | Ultraviolet irradiation dose (mJ/cm²) | | 1,000 | 1,000 | 1,000 | 1,000 | 1,000 | 1,000 | 1,000 | 1,000 | 1,000 | 1,000 | 1,000 | 1,000 |
| | Post-curing temperature (° C.) | | 170 | 170 | 170 | 170 | 170 | 170 | 170 | 170 | 170 | 170 | 170 | 170 |
| | Evaluation of recess on through-hole | | ○○○ | ○○○ | ○○○ | ○○○ | ○○○ | ●●● | ○○○● | ○●○○● | △○○● | △○○● | △○○● | △○○● |
| | Formation of opening pattern | | ●○ | ●● | ●● | ●● | ●● | ●● | ● | ● | ● | ● | ● | ● |
| | Formation of line pattern | | ● | ● | ● | ● | ● | ● | ● | ● | △ | △ | △ | △ |
| | Curability (desmear resistance) | | 59 | 60 | 61 | 60 | 60 | 59 | 40 | 41 | 60 | 61 | 60 | 60 |
| | CTE measurement (unit: ppm) | | ● | ○ | ○ | ○ | ○ | ○ | ● | ● | △ | △ | △ | △ |
| | Thermal cycle characteristics | | | | | | | | | | | | | |

TABLE 12

| | Components | Solid content | Example 69 | Example 70 | Example 71 | Example 72 | Example 73 | Example 74 | Example 75 | Example 76 | Example 77 | Example 78 | Example 79 | Example 80 | Example 81 |
|---|---|---|---|---|---|---|---|---|---|---|---|---|---|---|---|
| Heat-reactive compound | 828 | 100 | | | | | | | | | | | | | |
| | HP-4032 | 100 | | | | | | 50 | | | | | | | 50 |
| | HP-7200 H60 | 60 | | | | | | | | | | | | | |
| Maleimide compound | UVT-302 | 100 | 100 | 100 | 100 | 100 | | 50 | 100 | | 100 | 100 | 100 | 100 | 50 |
| | DIC maleimide MIA-200 | 100 | | | | | | | | 100 | | | | | |
| | BMI-3000 | 100 | | | | | 100 | | | | | | | | |
| Alkali-developable resin | HF-1M H60 solid OH equivalent: 100 g/eq | 60 | | | | 33 | | 78.5 | | | | | | | |
| | MEH-7851M H60 solid OH equivalent: 210 g/eq | 60 | | | | | | | | | | | | | |
| | JONCRYL 586 H60 solid equivalent: 519 g/eq | 60 | 245 | 55 | 408 | | 115 | | | | 87 | 87 | 87 | 87 | 87 |
| | JONCRYL 68 H60 solid equivalent: 287 g/eq | 60 | | | | | | | 151 | 96 | | | | | |
| Photobase generator | IRG 907 | 100 | 30 | 30 | 30 | 30 | 30 | 30 | 30 | 30 | 30 | 30 | 30 | 30 | 30 |
| | IRG 369 | 100 | | | | | | | | | | | | | |
| | IRG 379 | 100 | | | | | | | | | | | | | |
| | OXE-02 | 100 | | | | | | | | | | | | | |
| | WPBG-140 | 30 | | | | | | | | | | | | | |
| Polymeric resin | MAM M52 H30 | 100 | | | | | | | | | 140 | | | | |
| | PB3600 | 30 | | | | | | | | | | | | | |
| | KS-10 | 100 | | | | | | | | | | | | | |
| | XER-91 | 100 | | | | | | | | | | 42 | | | |
| | PARALOID EXL2655 | 30 | | | | | | | | | | | | | |
| Inorganic filler | YX8100 BH30 | 100 | | | | | | | | | | | | | |
| | SO-C2/silica D50 = 0.5 um, refractive index = 1.45, 2.2 g/cm³ | | | | | | | | | | 200 | 200 | 160 | 140 | 140 |
| | AO-502/alumina D50 = 0.7 um, refractive index = 1.76, 3.9 g/cm³ | 100 | | | | | | | | | | | | | |
| | HIGILITE H-42M D50 = 1.0 um, refractive index = 1.65, 2.4 g/cm³ | 100 | | | | | | | | | | | | | 200 |
| | B-30 D50 = 0.3 um, refractive index = 1.64, 4.3 g/cm³ | 100 | | | | | | | | | | | | | |

TABLE 12-continued

| Components | | Solid content | Example 69 | Example 70 | Example 71 | Example 72 | Example 73 | Example 74 | Example 75 | Example 76 | Example 77 | Example 78 | Example 79 | Example 80 | Example 81 |
|---|---|---|---|---|---|---|---|---|---|---|---|---|---|---|---|
| | DAW-10/alumina D50 = 10 um, refractive index = 1.76, 3.9 g/cm³ | 100 | | | | | | | | | | | | | |
| | US-10/silica D50 = 10 um, refractive index = 1.45, 2.2 g/cm³ | 100 | | | | | | | | | | | | | |
| Coloring agent | phthalocyanine blue | 100 | | | | | | | | | | | | | |
| | Carbon MA-50: carbon black | 100 | | | | | | | | | | | | | |
| | CR58 rutile-type titanium oxide | 100 | | | | | | | | | | | | | |
| | Chrome phthal yellow D50 = 0.28 um, 4.2 g/cm³ | 100 | | | | | | | | | | | | | |
| Other | R-2000 | 61 | | | | | | | | | | | | | |
| | IRG-184 | 100 | | | | | | | | | | | | | |
| | DPHA | 100 | | | | | | | | | | | | | |
| | LAROMER LR8863 | 100 | | | | | | | | | | | | | |
| | Σ (solid) | | 277 | 163 | 375 | 150 | 199 | 145.7 | 220.3 | 187.4 | 403.4 | 403.4 | 321.4 | 403.4 | 403.4 |
| | Σ (varnish) | | 375 | 185 | 538 | 163 | 245 | 208.5 | 281 | 226 | 557 | 459 | 377 | 557 | 557 |
| Equivalence ratio (heat-reactive group:alkali-developable group) | | | 1:0.9 | 1:0.2 | 1:1.5 | 1:1 | 1:2 | 1:3 | 1:1 | 1:1 | 1:1 | 1:1 | 1:1 | 1:1 | 1:1 |
| Inorganic filler content (wt %) | | | 0 | 0 | 0 | 0 | 0 | 0 | 0 | 0 | 50 | 50 | 50 | 50 | 50 |
| Coloring agent content (wt %) | | | 0 | 0 | 0 | 0 | 0 | 0 | 0 | 0 | 0 | 0 | 0 | 0 | 0 |
| Polymeric resin content (wt %) | | | 0 | 0 | 0 | 0 | 0 | 0 | 0 | 0 | 10 | 10 | 0 | 10 | 10 |
| Evaluation | Method of forming a layer of prepared resin composition on a substrate | | DF | DF | DF | DF | DF | DF | DF | DF | DF | DF | DF | DF | DF |
| | Handling property in the formation of a resin layer on a substrate | | △ | △ | △ | △ | △ | △ | △ | △ | ○ | ○ | △ | ○ | ○ |
| | Light irradiation dose (mJ/cm²) | | 500 | 500 | 500 | 500 | 500 | 500 | 500 | 500 | 500 | 500 | 500 | 500 | 500 |
| | Heating temperature (° C.) | | 100 | 100 | 100 | 100 | 100 | 100 | 100 | 100 | 100 | 100 | 100 | 100 | 100 |
| | Ultraviolet irradiation dose (mJ/cm²) | | 1,000 | 1,000 | 1,000 | 1,000 | 1,000 | 1,000 | 1,000 | 1,000 | 1,000 | 1,000 | 1,000 | 1,000 | 1,000 |
| | Post-curing temperature (° C.) | | 170 | 170 | 170 | 170 | 170 | 170 | 170 | 170 | 170 | 170 | 170 | 170 | 170 |
| | Evaluation of recess on through-hole | | △ | △ | △ | △ | △ | △ | △ | △ | ○ | ○ | △ | ○ | ○ |
| | Formation of opening pattern | | ●○ | ●○ | ●○ | ○○ | ○○ | ○○ | ●○ | ●○ | ○○ | ○○ | ○○ | ○○ | ○○ |
| | Formation of line pattern | | ●△ | ●△ | ●△ | ●△ | ●△ | ●△ | ●△ | ●△ | ●○ | ●● | ○○ | ●○ | ○○ |
| | Curability (desmear resistance) | | △ | △ | △ | △ | △ | △ | △ | △ | ○ | ○ | ○ | ○ | ○ |
| | Warping after curing | | 59 | 60 | 60 | 60 | 63 | 58 | 60 | 60 | 35 | 36 | 35 | 36 | 35 |
| | CTE measurement (unit: ppm) | | △ | △ | △ | △ | △ | △ | △ | △ | ○ | ○ | ○ | ○ | ○ |
| | Thermal cycle characteristics | | △ | △ | △ | △ | △ | △ | △ | △ | ● | ● | ○ | ● | ● |

TABLE 13

| Components | | Solid content | Example 82 | Example 83 | Example 84 | Example 85 | Example 86 | Example 87 | Example 88 | Example 89 | Example 90 | Example 91 | Example 92 | Example 93 | Example 94 | Example 95 | Example 96 |
|---|---|---|---|---|---|---|---|---|---|---|---|---|---|---|---|---|---|
| Heat-reactive compound | 828 | 100 | 50 | 50 | 50 | 50 | 50 | 50 | 50 | | | | | | | | |
| | HP-4032 | 100 | | | 50 | 50 | 50 | 50 | 50 | | | | | | | | |
| | HP-7200 H60 | 60 | 83 | 83 | | | | | | | | | | | | | |
| Maleimide compound | UVT-302 | 100 | | | | | | | | | | | | | 100 | 100 | 100 |
| | DIC maleimide MIA-200 | 100 | | | | | | | 100 | | | | | | | | |
| | BMI-3000 | 100 | | | | | | | | | | | | | | | |
| Alkali-developable resin | HF-1M H60 solid OH equivalent: 100 g/eq | 60 | | | | | | | | 50 | 50 | 50 | 50 | 50 | 50 | 50 | 50 |
| | MEH-7851M H60 solid OH equivalent: 210 g/eq | 60 | | | | | | | | | | | | | | | |
| | JONCRYL 586 solid equivalent: 519 g/eq | 60 | | | 100 | 100 | 100 | 100 | 100 | 100 | 100 | 100 | 100 | 100 | 100 | 100 | 100 |
| | JONCRYL 68 solid equivalent: 287 g/eq | 60 | 75 | 75 | | | | | | | | | | | | | |
| Photobase generator | IRG 907 | 100 | | | | | | | | | | | | | | | |
| | IRG 369 | 100 | 30 | 30 | 30 | 30 | 30 | 30 | 30 | | | 30 | 30 | 30 | 30 | 30 | 30 |
| | IRG 379 | 100 | | | | | | | | 30 | | | | | | | |
| | OXE-02 | 100 | | | | | | | | | 30 | | | | | | |
| | WPBG-140 | 100 | | | | | | | | | | | | | | | |
| Polymeric resin | MAM M52 H30 | 30 | | | | | | | | | | | | | | | |
| | PB3600 | 100 | | | | | | | | | | | | | | | |
| | KS-10 | 30 | 20 | | | | | | | | | | | | | | |
| | XER-91 | 100 | | 20 | | | | | | | | | | | | | |
| | PARALOID EXL2655 | 100 | | | | | | | | | | | | | | | |
| | YX8100 BH30 | 30 | | | | | | | | | | | | | | | |
| Inorganic filler | SO-C2/silica D50 = 0.5 um, refractive index = 1.45, 2.2 g/cm³ | 100 | | | | | | 443 | | | | | | | | | |
| | AO-502/alumina D50 = 0.7 um, refractive index = 1.76, 3.9 g/cm³ | 100 | | | | | | | 443 | | | | | | | | |

TABLE 13-continued

| Components | | Solid content | Example 82 | Example 83 | Example 84 | Example 85 | Example 86 | Example 87 | Example 88 | Example 89 | Example 90 | Example 91 | Example 92 | Example 93 | Example 94 | Example 95 | Example 96 |
|---|---|---|---|---|---|---|---|---|---|---|---|---|---|---|---|---|---|
| | HIGILITE H-42M D50 = 1.0 um, refractive index = 1.65, 2.4 g/cm³ | 100 | | | | | | | | | | | | | | | |
| | B-30 D50 = 0.3 um, refractive index = 1.64, 4.3 g/cm³ | 100 | | | | | | | | | | | | | | | |
| | DAW-10/alumina D50 = 10 um, refractive index = 1.76, 3.9 g/cm³ | 100 | | | | | | | | | | | | | | | |
| | US-10/silica D50 = 10 um, refractive index = 1.45, 2.2 g/cm³ | 100 | | | | | | | | | | | | | | | |
| Coloring agent | phthalocyanine blue | 100 | | | | | | | | | | 2 | | | | | |
| | Carbon MA-50: carbon black | 100 | | | 20 | 10 | | | | | | | 1 | | | 10 | |
| | CR58 rutile-type titanium oxide D50 = 0.28 um, 4.2 g/cm³ | 100 | | | | | 158 | | | | | | | 50 | | | 160 |
| | Chrome phthal yellow | 100 | | | 2 | | | | | | | 2 | | | 2 | | |
| Other | R-2000 | 61 | | | | | | | | | | | | | | | |
| | IRG-184 | 100 | | | | | | | | | | | | | | | |
| | DPHA | 100 | | | | | | | | | | | | | | | |
| | LAROMER LR8863 | 100 | | | | | | | | | | | | | | | |
| | Σ (solid) | | 195 | 195 | 212 | 200 | 315 | 633 | 633 | 160 | 160 | 164 | 161 | 210 | 184 | 170 | 320 |
| | Σ (varnish) | | 258 | 258 | 252 | 240 | 388 | 673 | 673 | 180 | 180 | 184 | 181 | 230 | 202 | 190 | 340 |
| | Equivalence ratio (heat-reactive group:alkali-developable group) | | 1:1 | 1:1 | 1:1 | 1:1 | 1:1 | 1:1 | 1:1 | 1:1 | 1:1 | 1:1 | 1:1 | 1:1 | 1:1 | 1:1 | 1:1 |
| | Inorganic filler content (wt %) | | 0 | 0 | 0 | 0 | 0 | 70 | 70 | 0 | 0 | 0 | 0 | 0 | 0 | 0 | 0 |
| | Coloring agent content (wt %) | | 0 | 0 | 10 | 5 | 50 | 0 | 0 | 0 | 0 | 2 | 1 | 24 | 12 | 6 | 50 |
| | Polymeric resin content (wt %) | | 10 | 10 | 0 | 0 | 0 | 0 | 0 | 0 | 0 | 0 | 0 | 0 | 0 | 0 | 0 |
| Evaluation | Method of forming a layer of prepared resin composition on a substrate | | DF | DF | DF | DF | DF | DF | DF | DF | DF | DF | DF | DF | DF | DF | DF |
| | Handling property in the formation of a resin layer on a substrate | | ● | ● | △ | △ | △ | △ | △ | △ | △ | △ | △ | △ | △ | △ | △ |
| | Light irradiation dose (mJ/cm²) | | 500 | 500 | 500 | 500 | 500 | 500 | 500 | 500 | 500 | 500 | 500 | 500 | 500 | 500 | 500 |
| | Heating temperature (°C.) | | 100 | 100 | 100 | 100 | 100 | 100 | 100 | 100 | 100 | 100 | 100 | 100 | 100 | 100 | 100 |
| | Ultraviolet irradiation dose (mJ/cm²) | | 1,000 | 1,000 | 1,000 | 1,000 | 1,000 | 1,000 | 1,000 | 1,000 | 1,000 | 1,000 | 1,000 | 1,000 | 1,000 | 1,000 | 1,000 |

TABLE 13-continued

| Components | Solid content | Example 82 | Example 83 | Example 84 | Example 85 | Example 86 | Example 87 | Example 88 | Example 89 | Example 90 | Example 91 | Example 92 | Example 93 | Example 94 | Example 95 | Example 96 |
|---|---|---|---|---|---|---|---|---|---|---|---|---|---|---|---|---|
| Post-curing temperature (° C.) | | 170 | 170 | 170 | 170 | 170 | 170 | 170 | 170 | 170 | 170 | 170 | 170 | 170 | 170 | 170 |
| Evaluation of recess on through-hole | | ○ | ○ | △ | △ | △ | △ | △ | △ | △ | △ | △ | △ | △ | △ | △ |
| Formation of opening pattern | | ○ | ○ | ○ | ○ | ○ | ○ | ○ | ○ | ○ | ○ | ○ | ○ | ○ | ○ | ○ |
| Formation of line pattern | | △ ● | ○ ● | ○ ● | ○ ● | △ ● | ○ ● | △ ○ | ○ ● | ○ ● | ○ ● | ○ ● | ○ ● | ○ ● | ○ ● | △ ● |
| Curability (desmear resistance) | | △ ● | ● | △ | △ | ○ | ● | ● | △ | △ | △ | △ | △ | △ | ○ | ○ |
| Warping after curing | | 58 | 59 | 60 | 60 | 36 | 17 | 24 | 60 | 60 | 60 | 58 | 39 | 60 | 60 | 40 |
| CTE measurement (unit: ppm) | | ● | ● | △ | △ | ○ | ● | ● | △ | △ | △ | △ | △ | △ | △ | ○ |
| Thermal cycle characteristics | | | | | | | | | | | | | | | | |

TABLE 14

| | Components | Solid content | Comparative Example 5 | Comparative Example 6 | Comparative Example 7 | Comparative Example 8 | Comparative Example 9 | Comparative Example 10 |
|---|---|---|---|---|---|---|---|---|
| Heat-reactive compound | 828 | 100 | 50 | | 50 | 50 | | |
| | HP-4032 | 100 | 50 | | 50 | | | |
| | HP-7200 H60 | 60 | | | | 83 | | |
| Maleimide compound | UVT-302 | 100 | | | | | 100 | |
| | DIC maleimide MIA-200 | 100 | | | | | | |
| | BMI-3000 | 100 | | | | | | |
| Alkali-developable resin | HF-1M H60 solid OH equivalent: 100 g/eq | 60 | | | | | | |
| | MEH-7851M H60 solid OH equivalent: 210 g/eq | 60 | | | | | | |
| | JONCRYL 586 H60 solid equivalent: 519 g/eq | 60 | | | | | | |
| | JONCRYL 68 H60 solid equivalent: 287 g/eq | 60 | | 238 | | | | |
| Photobase generator | IRG 907 | 100 | | | | | | |
| | IRG 369 | 100 | 30 | 30 | 30 | | 30 | |
| | IRG 379 | 100 | | | | | | |
| | OXE-02 | 100 | | | | 10 | | |
| | WPBG-140 | 100 | | | | | | |
| Polymeric resin | MAM M52 H30 | 30 | | | | | | |
| | PB3600 | 100 | | | | | | |
| | KS-10 | 30 | | | | | | |
| | XER-91 | 100 | | | | | | |
| | PARALOID EXL2655 | 100 | | | | | | |
| | YX8100 BH30 | 30 | | | | 40 | | |
| Inorganic filler | SO-C2/silica D50 = 0.5 um, refractive index = 1.45, 2.2 g/cm$^3$ | 100 | | | 130 | | | |
| | AO-502/alumina D50 = 0.7 um, refractive index = 1.76, 3.9 g/cm$^3$ | 100 | | | | | | |
| | HIGILITE H-42M D50 = 1.0 um, refractive index = 1.65, 2.4 g/cm$^3$ | 100 | | | | | | |
| | B-30 D50 = 0.3 um, refractive index = 1.64, 4.3 g/cm$^3$ | 100 | | | | | | |
| | DAW-10/alumina D50 = 10 um, refractive index = 1.76, 3.9 g/cm$^3$ | 100 | | | | | | |
| | US-10/silica D50 = 10 um, refractive index = 1.45, 2.2 g/cm$^3$ | 100 | | | | | | |
| Coloring agent | phthalocyanine blue | 100 | | | | | | 2 |
| | Carbon MA-50: carbon black | 100 | | | | | | |
| | CR58 rutile-type titanium oxide D50 = 0.28 um, 4.2 g/cm$^3$ | 100 | | | | | | |
| | Chrome phthal yellow | 100 | | | | | | 2 |
| Other | R-2000 | 61 | | | | | | 164 |
| | IRG-184 | 100 | | | | | | 10 |
| | DPHA | 100 | | | | | | 30 |
| | LAROMER LR8863 | 100 | | | | | | |
| | Σ (solid) | | 130 | 173 | 260 | 122 | 130 | 144 |
| | Σ (varnish) | | 130 | 268 | 260 | 183 | 130 | 208 |
| | Equivalence ratio (heat-reactive group:alkali-developable group) | | 1:1 | 1:1 | 1:1 | 1:1 | 1:1 | 1:1 |
| | Inorganic filler content (wt %) | | 0 | 0 | 50 | 0 | 0 | 0 |
| | Coloring agent content (wt %) | | 0 | 0 | 0 | 0 | 0 | 3 |
| | Polymeric resin content (wt %) | | 0 | 0 | 0 | 33 | 0 | 0 |

TABLE 14-continued

| Evaluation | Method of forming a layer of prepared resin composition on a substrate | DF | DF | DF | DF | DF | DF |
|---|---|---|---|---|---|---|---|
| | Handling property in the formation of a resin layer on a substrate | Δ | Δ | Δ | ○ | Δ | Δ |
| | Light irradiation dose (mJ/cm²) | 500 | 500 | 500 | 500 | 500 | 500 |
| | Heating temperature (° C.) | 100 | 100 | 100 | 100 | 100 | — |
| | Ultraviolet irradiation dose (mJ/cm²) | 1,000 | 1,000 | 1,000 | 1,000 | 1,000 | 1,000 |
| | Post-curing temperature (° C.) | 170 | 170 | 170 | 170 | 170 | 170 |
| | Evaluation of recess on through-hole | Δ | Δ | Δ | ○ | Δ | Δ |
| | Formation of opening pattern | x | x | x | x | x | ○ |
| | Formation of line pattern | x | x | x | x | x | Δ |
| | Curability (desmear resistance) | ● | x | ● | ● | ● | ○ |
| | Warping after curing | Δ | Δ | Δ | ● | Δ | Δ |
| | CTE measurement (unit: ppm) | 55 | 65 | 32 | 60 | 65 | 60 |
| | Thermal cycle characteristics | Δ | Δ | ○ | ○ | Δ | Δ |

| | Components | Solid content | Comparative Example 11 | Comparative Example 12 | Comparative Example 13 | Comparative Example 14 | Comparative Example 15 | Comparative Example 16 |
|---|---|---|---|---|---|---|---|---|
| Heat-reactive compound | 828 | 100 | | | | | | |
| | HP-4032 | 100 | | | | | | |
| | HP-7200 H60 | 60 | | | | | | |
| Maleimide compound | UVT-302 | 100 | | | | | | |
| | DIC maleimide MIA-200 | 100 | | | | | | |
| | BMI-3000 | 100 | | | | | | |
| Alkali-developable resin | HF-1M H60 solid OH equivalent: 100 g/eq | 60 | | | | | | |
| | MEH-7851M H60 solid OH equivalent: 210 g/eq | 60 | | | | | | |
| | JONCRYL 586 H60 solid equivalent: 519 g/eq | 60 | | | | | | |
| | JONCRYL 68 H60 solid equivalent: 287 g/eq | 60 | | | | | | |
| Photobase generator | IRG 907 | 100 | | | | | | |
| | IRG 369 | 100 | | | | | | |
| | IRG 379 | 100 | | | | | | |
| | OXE-02 | 100 | | | | | | |
| | WPBG-140 | 100 | | | | | | |
| Polymeric resin | MAM M52 H30 | 30 | | | | | | |
| | PB3600 | 100 | | | | | | |
| | KS-10 | 30 | | | | | | |
| | XER-91 | 100 | | | | | | |
| | PARALOID EXL2655 | 100 | | | | | | |
| | YX8100 BH30 | 30 | | | | | | |
| Inorganic filler | SO-C2/silica D50 = 0.5 um, refractive index = 1.45, 2.2 g/cm³ | 100 | | | | | | 327 |
| | AO-502/alumina D50 = 0.7 um, refractive index = 1.76, 3.9 g/cm³ | 100 | | | | | | |
| | HIGILITE H-42M D50 = 1.0 um, refractive index = 1.65, 2.4 g/cm³ | 100 | | | | | | |

TABLE 14-continued

| | | | | | | | | |
|---|---|---|---|---|---|---|---|---|
| | B-30<br>D50 = 0.3 um,<br>refractive index =<br>1.64, 4.3 g/cm³ | 100 | | | | | | |
| | DAW-10/alumina<br>D50 = 10 um,<br>refractive index =<br>1.76, 3.9 g/cm³ | 100 | | | | | | |
| | US-10/silica<br>D50 = 10 um,<br>refractive index =<br>1.45, 2.2 g/cm³ | 100 | | | | | | |
| Coloring agent | phthalocyanine blue | 100 | 20 | | | | | |
| | Carbon MA-50:<br>carbon black | 100 | | | | 1 | 10 | |
| | CR58 rutile-type<br>titanium oxide<br>D50 = 0.28 um, 4.2 g/cm³ | 100 | | 44 | 140 | | | |
| | Chrome phthal<br>yellow | 100 | 2 | | | | | |
| Other | R-2000 | 61 | 164 | 164 | 164 | 164 | 164 | 164 |
| | IRG-184 | 100 | 10 | 10 | 10 | 10 | 10 | 10 |
| | DPHA | 100 | 30 | 30 | 30 | 30 | 30 | 30 |
| | LAROMER<br>LR8863 | 100 | | | | | | |
| | Σ (solid) | | 162 | 184 | 280 | 141 | 150 | 467 |
| | Σ (varnish) | | 226 | 248 | 344 | 205 | 364 | 998 |
| Equivalence ratio (heat-reactive group:alkali-developable group) | | | 1:1 | 1:1 | 1:1 | 1:1 | 1:1 | 1:1 |
| Inorganic filler content (wt %) | | | 0 | 0 | 0 | 0 | 0 | 70 |
| Coloring agent content (wt %) | | | 14 | 24 | 50 | 1 | 7 | 0 |
| Polymeric resin content (wt %) | | | 0 | 0 | 0 | 0 | 0 | 0 |
| Evaluation | Method of forming a<br>layer of prepared<br>resin composition on<br>a substrate | | DF | DF | DF | DF | DF | DF |
| | Handling property in<br>the formation of a<br>resin layer on a<br>substrate | | Δ | Δ | Δ | Δ | Δ | Δ |
| | Light irradiation<br>dose (mJ/cm²) | | 500 | 500 | 500 | 500 | 500 | 500 |
| | Heating temperature<br>(° C.) | | — | — | — | — | — | — |
| | Ultraviolet<br>irradiation dose<br>(mJ/cm²) | | 1,000 | 1,000 | 1,000 | 1,000 | 1,000 | 1,000 |
| | Post-curing<br>temperature (° C.) | | 170 | 170 | 170 | 170 | 170 | 170 |
| | Evaluation of recess<br>on through-hole | | Δ | Δ | Δ | Δ | Δ | Δ |
| | Formation of<br>opening pattern | | xxx | xxx | xxx | xxx | xxx | xxx |
| | Formation of line<br>pattern | | x | Δ | x | Δ | x | x |
| | Curability (desmear<br>resistance) | | x | x | x | x | x | x |
| | Warping after curing | | Δ | Δ | Δ | Δ | Δ | ○ |
| | CTE measurement<br>(unit: ppm) | | 63 | 50 | 43 | 60 | 63 | 25 |
| | Thermal cycle<br>characteristics | | Δ | Δ | Δ | Δ | Δ | Δ |

The materials used in the respective thermosetting resin compositions shown in Tables 7 to 14 are as follows. Here, in order to avoid redundancy, descriptions of the materials that are already indicated in Table 1 are omitted.

(Maleimide Compound)

UVT-302: an acrylic polymer having a maleimide group in the side chain (equivalent=320, refractive index=1.5); manufactured by Toagosei Co., Ltd.

Maleimide MIA-200: a maleimide oligomer manufactured by DIC Corporation; Mw=about 1,000, equivalent=500 g/eq BMI-3000: a long-chain alkyl bismaleimide oligomer manufactured by AR BROWN Co., Ltd.; Mw=3,000

(Alkali-Developable Resin)

MEH-7851M H60: biphenyl/phenolic novolac (hydroxyl group equivalent=210, manufactured by Meiwa Plastic Industries, Ltd.) dissolved in cyclohexanone; solid content=60%, solid OH equivalent=210 g/eq, refractive index=1.68

JONCRYL 586 H60: styrene-acrylic acid copolymer resin (Mw=3,100, solid acid value=108, manufactured by Johnson Polymers Ltd.) dissolved in cyclohexanone; solid content=60%, solid equivalent=519 g/eq, refractive index=1.55

(Photobase Generator)

WPBG-140: 1-(anthraquinone-2-yl)ethylimidazole carboxylate, manufactured by Wako Pure Chemical Industries, Ltd.

(Polymeric Resin)

MAM M52 H30: MMA/nBA/MMA triblock copolymer manufactured by Arkema K.K., dissolved in cyclohexanone; solid content=30%

PB3600: epoxidized polybutadiene, Mn=5,900; manufactured by Daicel Corporation.

KS-10 H30: polyvinyl butyral manufactured by Sekisui Chemical Co., Ltd., dissolved in cyclohexanone; solid content=30%

YX8100 BH30: phenoxy resin, manufactured by Mitsubishi Chemical Corporation; solid content=30%

XER-91: particulate cross-linked rubber particle (NBR, functional group=carboxylic group), manufactured by JSR Corporation PARALOID EXL2655: core-shell particle of butadiene-acrylic resin, manufactured by Rohm and Haas Company (Inorganic Filler)

SO-C2: spherical silica, D50=0.5 µm, refractive index=1.45, specific gravity=2.2 g/cm$^3$; manufactured by Admatechs Co., Ltd.

AO-502: spherical alumina, D50=0.7 µm, refractive index=1.76, specific gravity=3.9 g/cm$^3$; manufactured by Admatechs Co., Ltd.

HIGILITE H-42M: amorphous aluminum hydroxide, D50=1.0 µm, refractive index=1.65, specific gravity=2.4 g/cm$^3$; manufactured by Showa Denko K.K.

B-30: barium sulfate, D50=0.3 µm, refractive index=1.64, specific gravity=4.3 g/cm$^3$; manufactured by Sakai Chemical Industry Co., Ltd.

DAW-10: amorphous alumina, D50=10 µm, refractive index=1.76, specific gravity=3.9 g/cm$^3$; manufactured by Denki Kagaku Kogyo K.K.

US-10: spherical silica, D50=10 µm, refractive index=1.45, specific gravity=2.2 g/cm$^3$; manufactured by Tatsumori Ltd.

(Coloring Agents)

Phthalocyanine blue: C.I. Pigment Blue 15:3

Carbon MA-50: carbon black, manufactured by Mitsubishi Chemical Corporation

CR58 rutile-type titanium oxide: D50=0.28 µm, manufactured by Ishihara Sangyo Kaisha, Ltd.

Chrome phthal yellow: C.I. Pigment Yellow 147

(Other Additives)

LAROMER LR8863: 3-functional acrylate monomer, manufactured by BASF Japan Ltd.

R-2000: cresol novolac, acrylic acid, THPA-modified resin (solid content=61%, solid acid value=87 mg KOH/g, manufactured by DIC Corporation)

DPHA: dipentaerythritol hexaacrylate, manufactured by Nippon Kayaku Co., Ltd.

IRG-184: 1-hydroxycyclohexyl-phenyl ketone, manufactured by Ciba Japan K.K.

(Developable Conditions Depending on Difference in Temperature/Time in Examples 1, 3, 8, 9 and 97)

In order to evaluate the developability/patterning property in detail, the printed circuit boards prepared in the above-described Examples 1, 3, 8, 9 and the below-described Example 97 were examined in terms of the heating temperature and heating time after light irradiation. Table 15 below shows the ranges of the heating time in which the respective printed circuit boards could be developed. It is noted here that the printed circuit board of Example 97 was prepared in the same manner as in Example 1, except that the amount of the photobase generator was reduced to 10 parts by mass.

TABLE 15

|  | Example 1 | Example 3 | Example 8 | Example 9 | Example 97 |
| --- | --- | --- | --- | --- | --- |
| Photobase generator | 369 | OXE-02 | 379 | 907 | 369 |
| Added amount | 30 | 10 | 30 | 30 | 10 |
| Heating temperature 120° C. | 20 to 40 min | 80 to 100 min | 20 to 40 min | 60 min | 40 min |

As shown in Table 15, in Examples 1 and 8, good development was attained when the heating was performed at 120° C. for 20 to 40 minutes. That is, in Examples 1 and 8, the printed circuit boards could be developed at a heating time of 20 minutes. In Example 3, good development was attained when the heating was performed at 120° C. for 80 to 100 minutes. That is, in Example 3 as well, the printed circuit boards could be developed at a heating time of 20 minutes. In Examples 9 and 97, good development was attained only when the heating was performed at 120° C. for 60 minutes and 40 minutes, respectively.

Accordingly, it was found that, with the photobase generators used in Examples 1, 3 and 8 which contain a plurality of nitrogen atoms in the molecular structure, as compared to Example 9, since the range of the heating time in which the printed circuit board could be developed was longer, a printed circuit board can be easily produced.

<DSC Measurement Immediately after Irradiation with Light>

Using HMW680GW (metal halide lamp, scattering light-type; manufactured by ORC Manufacturing Co., Ltd.), the substrates having a resin layer, which were obtained in Examples 32, 36 and 50, were each irradiated with a light in a negative pattern. Here, each substrate was irradiated at an irradiation dose of 1,000 mJ/cm². After the light irradiation, the resin layer was scraped from the substrate. Immediately thereafter, using DSC-6200 (manufactured by Seiko Instruments Inc.), the resin layer was heated from 30° C. to 300° C. at a heating rate of 5° C./min to perform DSC measurement for each of the irradiated and non-irradiated parts. In addition, immediately after irradiating the respective substrates with an ultraviolet light, the cured layer composed of a thermosetting resin composition before post-curing was subjected to DSC measurement in the same manner.

Figure 3:
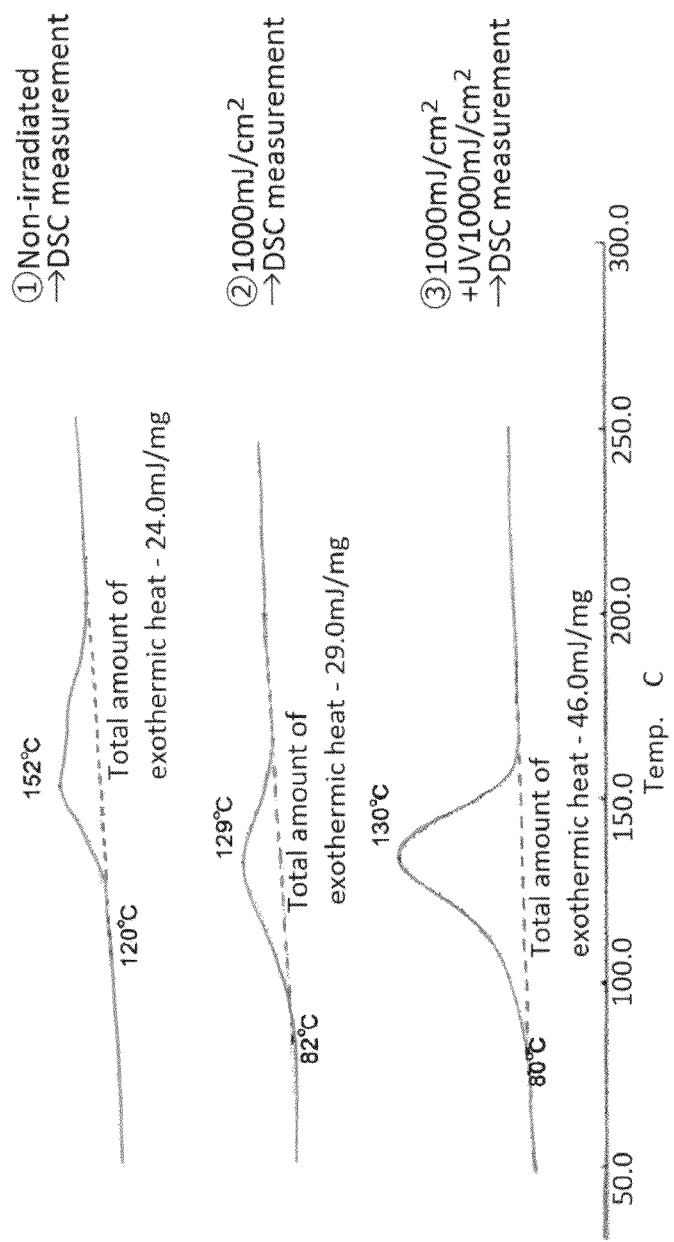
FIG. 3 shows the DSC charts for an irradiated part and a non-irradiated part of a layer composed of the thermosetting resin composition according to Example 32 of the present invention.
Figure 4:
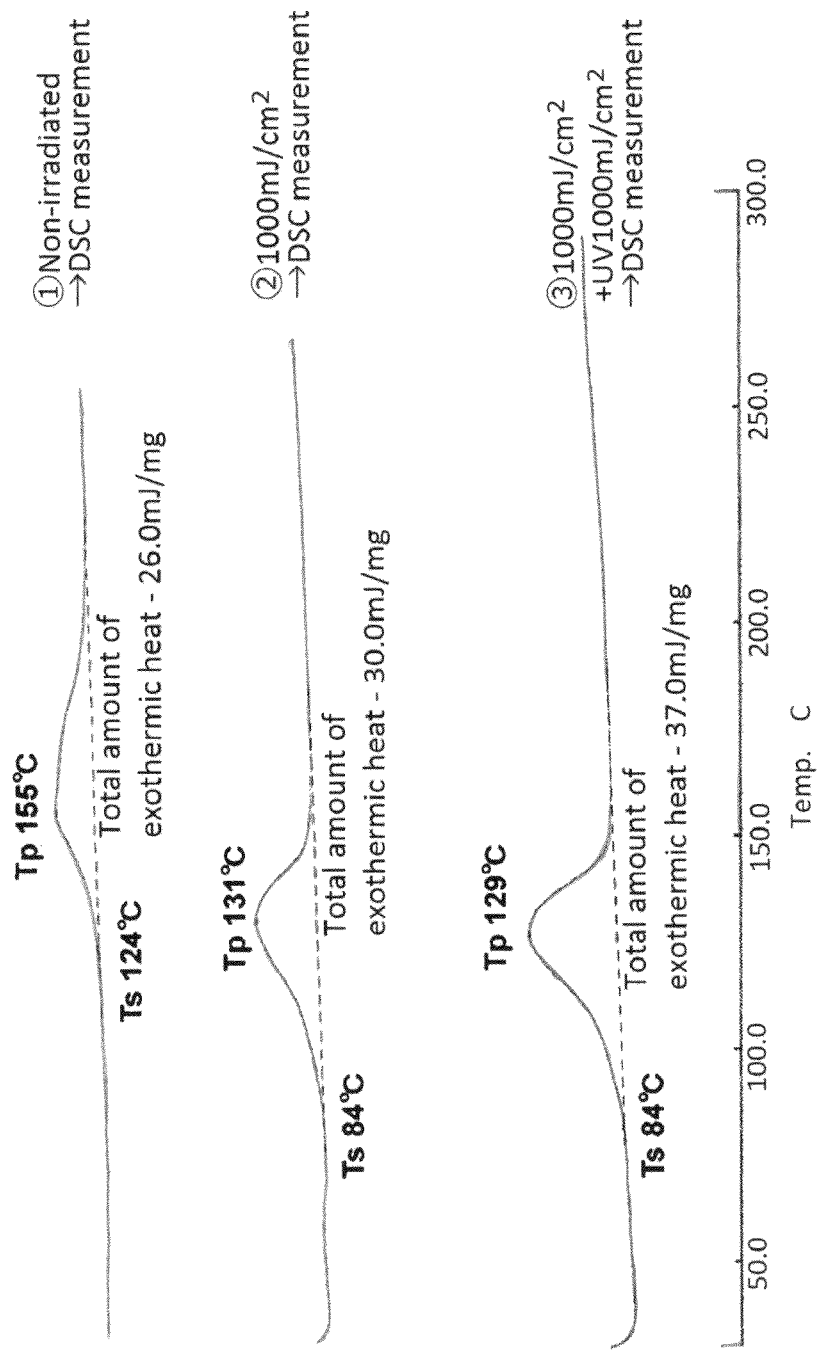
FIG. 4 shows the DSC charts for an irradiated part and a non-irradiated part of a layer composed of the thermosetting resin composition according to Example 36 of the present invention.
Figure 5:
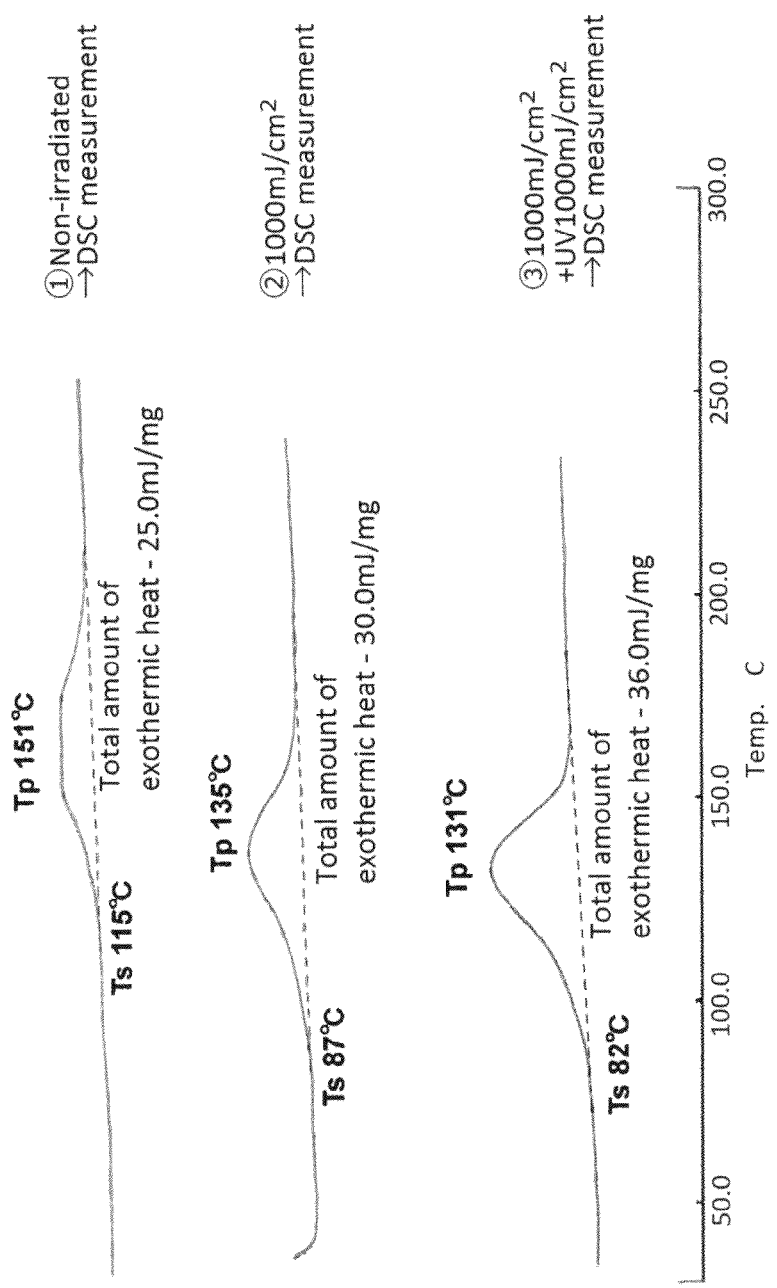
FIG. 5 shows the DSC charts for an irradiated part and a non-irradiated part of a layer composed of the thermosetting resin composition according to Example 50 of the present invention.
Figure 6:
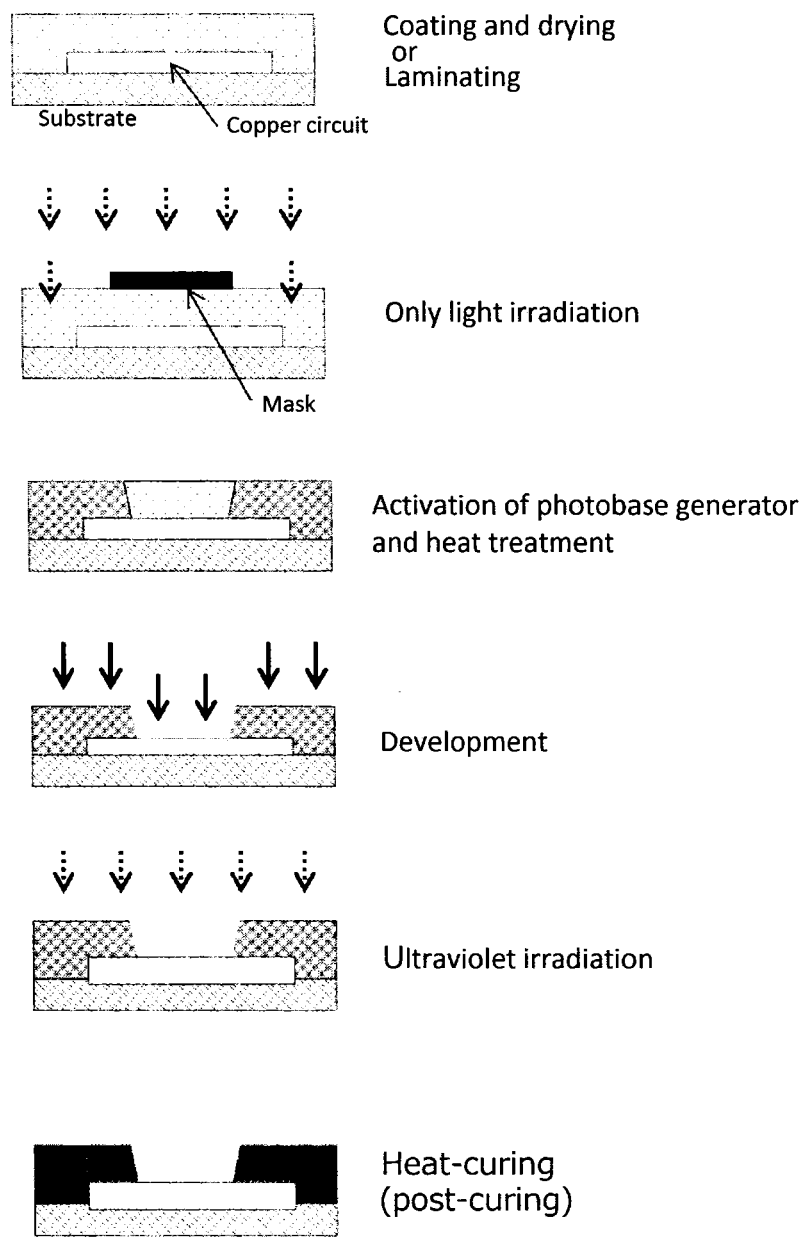
FIG. 6 is a schematic diagram showing the pattern forming method according to the present invention.

FIGS. 3 to 5 are DSC charts obtained in Examples 32, 36 and 50, respectively, showing the results of DSC measurements for the non-irradiated part, the part irradiated with a light at an irradiation dose of 1,000 mJ/cm² and the part irradiated with a light at an irradiation dose of 1,000 mJ/cm² and then with an ultraviolet light at an irradiation dose of 1,000 mJ/cm².

In the irradiated parts of the Examples 32, 36 and 50, the exothermic peak shifted to the low temperature side upon the light irradiation.

Comparative Example 17

A double-sided printed circuit substrate of 0.4 mm in thickness, on which a 15 μm-thick copper circuit is formed on both sides, was prepared and pre-treated using CZ-8100 (manufactured by MEC Company Ltd.). Then, PSR-4000G23K (trade name, manufactured by Taiyo Ink MFG. Co., Ltd.; a photocurable resin composition which contains an alkali-developable resin having an epoxy acrylate structure) was coated onto the printed circuit substrate by screen printing to a thickness after drying of 20 μm. After drying the resulting printed circuit substrate in a hot air circulation-type drying oven at 80° C. for 30 minutes, the thus dried printed circuit substrate was irradiated with a light in a negative pattern at an irradiation does of 300 mJ/cm² using HMW680GW (metal halide lamp, scattering light-type; manufactured by ORC Manufacturing Co., Ltd.). Thereafter, the printed circuit substrate was developed with 1 wt % aqueous sodium carbonate solution for 60 seconds and then heat-treated at 150° C. for 60 minutes in a hot air circulation-type drying oven, thereby obtaining a patterned cured coating film.

Subsequently, in the same manner as in the above-described Example 11, the desmear resistance was evaluated. As a result, the desmear resistance was evaluated to be "x".

Example 101 and Comparative Example 21

<Preparation of Thermosetting Resin Composition>
According to the formulations shown in Table 16 below, the respective materials were blended and premixed using a stirrer. Then, each resulting mixture was kneaded using a 3-roll mill to prepare a thermosetting resin composition. In Table 16, unless otherwise specified, all values are based on parts by mass.

<Preparation of Printed Circuit Substrate Having Resin Layer>
A double-sided printed circuit substrate of 0.4 mm in thickness, on which a 15 μm-thick copper circuit is formed on both sides, was prepared and pre-treated using CZ-8100 (manufactured by MEC Company Ltd.). Then, using a roll coater (manufactured by Furnace Co., Ltd.), each thermosetting resin composition was coated on both sides of the thus pre-treated printed circuit substrate to a thickness after drying of 20 μm. Thereafter, the resulting printed circuit substrate was dried in a hot air circulation-type drying oven at 90° C. for 30 minutes to form a resin layer composed of the thermosetting resin composition.

<Preparation of Substrate for Evaluation of Developing Property and Curing Characteristics>
(Evaluation of Alkali Developing Property/Patterning Property)

Using HMW680GW (metal halide lamp, scattering light-type; manufactured by ORC Manufacturing Co., Ltd.), the thus obtained substrate having a resin layer was irradiated with a light in a negative pattern. The irradiation dose was set as shown in Table 17 below with reference to the respective exothermic peak temperatures measured by DSC. Then, the resulting substrate was heat-treated for 70 minutes at the temperature shown in Table 17. Thereafter, the substrate was developed by being immersed in a 3 wt % TMAH/5 wt % ethanolamine mixed aqueous solution at 35° C. for 3 minutes, thereby forming a patterned layer. The developing property and the patterning property of the thus obtained patterned layer were evaluated in accordance with the following criteria. The results thereof are shown in Table 17 below.

○: The surface of the irradiated part showed no damage caused by the developer and there was observed no development residue on the non-irradiated part.

x: Development residue was observed on the non-irradiated part, or the non-irradiated part could not be developed.

xx: Both the irradiated and non-irradiated parts were completely dissolved.

(Laser Processability)
Using an ultraviolet irradiation apparatus (manufactured by ORC Manufacturing Co., Ltd.), the above-described substrates for which the developing property (patterning) was evaluated were each further irradiated with an ultraviolet light at an energy of 1 J/cm² and then cured for at 170° C. for 60 minutes in a hot air circulation-type drying oven (post-curing).

Thereafter, the irradiated surface was subjected to a laser processing. In this laser processing, a $CO_2$ laser (manufactured by Hitachi Via Mechanics, Ltd., light source: 10.6 μm) was used as a light source. The laser processability was evaluated in accordance with the following criteria. In order to clarify the differences in the processability, the laser processings of the respective substrates were all performed under the same conditions.

The target processing diameters were: top diameter=65 μm and bottom diameter=50 μm.

Conditions: aperture (mask diameter)=3.1 mm, pulse width=20 μsec, output=2W, frequency=5 kHz, number of shots=3 burst shots ○: The difference from the target processing diameter was less than ±2 μm x: The difference from the target processing diameter was ±2 μm or larger (Desmear Resistance)
The thus laser-processed substrates were each further subjected to a desmearing treatment with an aqueous permanganate desmear solution (wet method). For evaluation of the desmear resistance, the surface roughness of each substrate was examined and the condition of the periphery of the openings formed by the laser processing was evaluated in accordance with the below-described criteria. For the examination of the surface roughness, the surface roughness, Ra, was measured under a laser microscope VK-8500 (manufactured by Keyence Corporation; at a magnification of ×2,000 and a Z-axis measurement pitch of 10 nm). The observation of the openings formed by the laser processing was performed under a light microscope.

Drug solutions (Rohm and Haas Company):

Swelling: MLB-211, temperature=80° C., time=10 minutes

Permanganate: MLB-213, temperature=80° C., time=15 minutes

Reduction: MLB-216, temperature=50° C., time=5 minutes

Evaluation Criteria:

●: The surface roughness, Ra, was less than 0.1 μm after the desmearing with the permanganate solution and the difference in the opening diameter before and after the laser processing was 2 μm or less.

○: The surface roughness, Ra, was 0.1 to 0.3 μm after the desmearing with the permanganate solution and the difference in the opening diameter before and after the laser processing was 2 to 5 μm.

x: The surface roughness, Ra, was greater than 0.3 μm after the desmearing with the permanganate solution and the difference in the opening diameter before and after the laser processing was 5 μm or larger.

<DSC Measurement>

(DSC Measurement Immediately after Irradiation with Light)

After irradiating the resin layer on the substrate with a patterned light at an irradiation dose of 1,000 mJ/cm², the irradiated part and the non-irradiate part were scraped from the substrate. Immediately thereafter, using DSC-6200 (manufactured by Seiko Instruments Inc.), the irradiated and non-irradiated parts were heated from 30° C. to 300° C. at a heating rate of 5° C./min to perform DSC measurement for each of the irradiated and non-irradiated parts. From the resulting DSC charts, the exothermic peak temperatures thereof were determined.

(DSC Measurement Immediately after Irradiation with Ultraviolet Light)

After irradiating the resin layer on the substrate with an ultraviolet light at an irradiation dose of 1,000 mJ/cm², the resulting patterned layer was scraped from the substrate. Immediately thereafter, using DSC-6200 (manufactured by Seiko Instruments Inc.), the patterned layer was heated from 30° C. to 300° C. at a heating rate of 5° C./min to perform DSC measurement. From the resulting DSC charts, the exothermic peak temperatures were determined.

Figure 7:
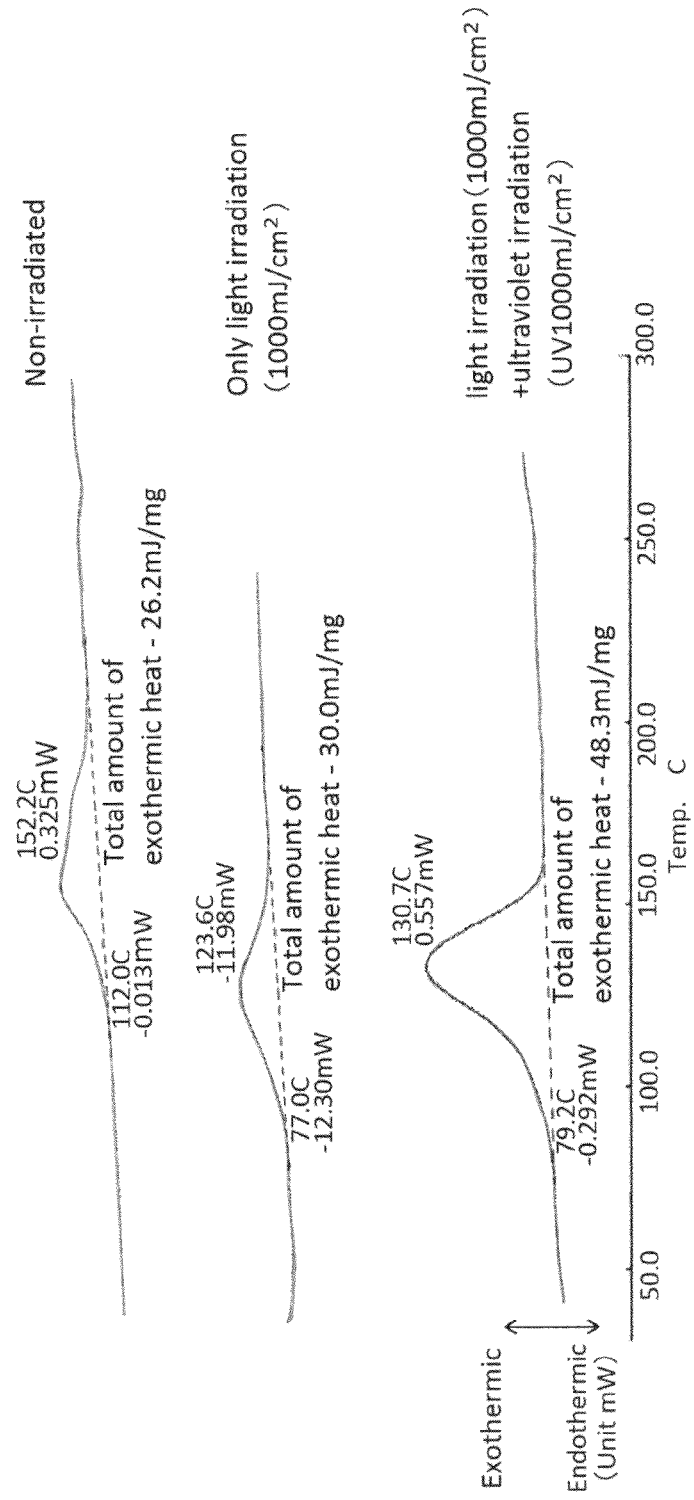
FIG. 7 shows the DSC charts for a resin layer composed of the alkali-developable thermosetting resin composition according to Example 1 of the present invention.

FIG. 7 shows DSC charts of the non-irradiated part, the part irradiated with a light at an irradiation dose of 1,000 mJ/cm² and the patterned layer irradiated with an ultraviolet light at an irradiation dose of 1,000 mJ/cm².

In the irradiated part of the Example 1, the exothermic peak shifted to the low temperature side upon the light irradiation.

Further, in the patterned layer immediately after the ultraviolet irradiation, since the amount of exothermic heat was increased, it is seen that the ultraviolet irradiation allowed the heat-curing reaction to proceed more efficiently.

From the DSC charts obtained by the above-described method, the exothermic peak temperature of the irradiated part (Tpeak 1) and that of the non-irradiated part (Tpeak 2) were determined and ΔTpeak was defined as follows.

$$\Delta Tpeak = Tpeak\ 2 - Tpeak\ 1$$

According to the above-described definition, a positive ΔTpeak value indicates that the exothermic peak of the irradiated part shifted to the low temperature side and that the photobase generator was activated by the irradiation.

TABLE 16

| | | Example 101 |
|---|---|---|
| Heat-reactive compound | 828: Bis-A-type liquid epoxy (epoxy equivalent = 190), manufactured by Mitsubishi Chemical Corporation | 100 |
| Alkali-developable resin | HF-1M H60: phenol novolac (hydroxyl group equivalent = 105, manufactured by Meiwa Plastic Industries, Ltd.) dissolved in cyclohexanone; solid content = 60% | 88 |
| Photobase generator | IRG 369: 2-benzyl-2-dimethylamino-1-(4-morpholinophenyl)-butanone-1, manufactured by BASF Japan Ltd. | 30 |
| Σ (solid) | | 183 |

TABLE 17

| | | Example 101 |
|---|---|---|
| DSC measurement Light irradiation dose = 500 mJ/cm² | Tpeak 1*[1] | 137 |
| | Tpeak 2*[2] | 152 |
| | ΔTpeak*[3] | 15 |
| DSC measurement Light irradiation dose = 1,000 mJ/cm² | Tpeak 1*[1] | 132 |
| | Tpeak 2*[2] | 152 |
| | ΔTpeak*[3] | 20 |
| Light irradiation dose (mJ/cm²) | | 500 |
| Heating temperature (° C.) | | 100 |
| Post-curing temperature (° C.) | | 170 |
| Ultraviolet irradiation dose (mJ/cm²) | | 1,000 |
| Alkali developability/patterning | | ○ |
| Surface curing characteristics (desmear resistance) | | ● |
| Laser processability | | ○ |

*[1]Exothermic peak temperature of the irradiated part
*[2]Exothermic peak temperature of the non-irradiated part
*[3]Tpeak2 − Tpeak 1

TABLE 18

| Components | | Solid content | Comparative Example 21 |
|---|---|---|---|
| Alkali-developable resin | R-2000PG (manufactured by DIC Corporation) | 65 | 153 |
| | LUCIRIN TPO (manufactured by BASF Japan Ltd.) | 100 | 5 |
| Inorganic filler | SO—C2/silica, D50 = 0.5 um, refractive index = 1.45 | 100 | 125 |
| Other | acrylate monomer (DA-600, manufactured by Sanyo Chemical Industries, Ltd.) | | 20 |
| Σ (solid) | | | 250 |
| Σ (varnish) | | | 303 |
| Inorganic filler content (wt %) | | | 50 |
| Polymeric resin content (wt %) | | | 0 |
| Light irradiation dose (mJ/cm²) | | | 500 |
| Heating temperature (° C.) | | | 100 |
| Ultraviolet irradiation dose (mJ/cm²) | | | 1,000 |
| Post-curing temperature (° C.) | | | 170 |
| Alkali-developability (patterning) | | | ○ |
| Laser processability | | | ○ |
| Curability (desmear resistance) | | | X |

It was found that a patterned layer can be easily formed by irradiating a resin layer composed of the thermosetting resin composition of Example 101 with a light in a negative pattern and then developing the resulting resin layer. In addition, it was also found that the patterned layer of Example 101 had excellent curing characteristics and laser processability. The components and results of Comparative Example 21 are shown in Table 18.

Comparative Example 22

A double-sided printed circuit substrate of 0.4 mm in thickness, on which a 15 μm-thick copper circuit is formed on both sides, was prepared and pre-treated using CZ-8100 (manufactured by MEC Company Ltd.). Then, PSR-4000G23K (trade name, manufactured by Taiyo Ink MFG. Co., Ltd.; a photocurable resin composition which contains an alkali-developable resin having an epoxy acrylate structure) was coated onto the printed circuit substrate by screen printing to a thickness after drying of 20 μm. After drying the resulting printed circuit substrate in a hot air circulation-type drying oven at 80° C. for 30 minutes, the thus dried printed circuit substrate was irradiated with a light in a negative pattern at an irradiation does of 300 mJ/cm$^2$ using HMW680GW (metal halide lamp, scattering light-type; manufactured by ORC Manufacturing Co., Ltd.). Thereafter, the printed circuit substrate was developed with 1 wt % aqueous sodium carbonate solution for 60 seconds and then heat-treated at 150° C. for 60 minutes in a hot air circulation-type drying oven, thereby obtaining a patterned cured coating film.

Subsequently, in the same manner as in the above-described Example 101, the laser processability and the desmear resistance were evaluated. As a result, the laser processability was evaluated to be "○"; however, the desmear resistance was evaluated to be "x".

The invention claimed is:

1. A pattern forming method, comprising:
   forming a resin layer composed of an alkali-developable thermosetting resin composition comprising a photobase generator on a substrate;
   irradiating the resin layer with a light in a negative pattern such that the photobase generator contained in the resin layer is activated, and that an irradiated portion of the resin layer is cured by a base generated by the photobase generator;
   heating the resin layer having the irradiated portion being cured; and
   removing by alkali development a non-irradiated portion of the resin layer such that a negatively patterned layer is formed,
   wherein the irradiating is performed such that, when the alkali-developable thermosetting resin composition in the irradiated portion and the alkali-developable thermosetting resin composition in the non-irradiated portion are subjected to a DSC measurement,
   the alkali-developable thermosetting resin composition in the irradiated portion exhibits an exothermic peak, and the alkali-developable thermosetting resin composition in the non-irradiated portion does not exhibit an exothermic peak, or
   the alkali-developable thermosetting resin composition in the irradiated portion and the alkali-developable thermosetting resin composition in the non-irradiated portion each exhibit an exothermic peak such that 1) an exothermic onset temperature of the alkali-developable thermosetting resin composition in the irradiated portion is lower than that of the alkali-developable thermosetting resin composition in the non-irradiated portion or 2) an exothermic peak temperature of the alkali-developable thermosetting resin composition in the irradiated portion is lower than that of the alkali-developable thermosetting resin composition in the non-irradiated portion.

2. The pattern forming method according to claim 1, wherein the irradiating is performed such that
   the exothermic onset temperature of the alkali-developable thermosetting resin composition in the irradiated portion is lower than that of the alkali-developable thermosetting resin composition in the non-irradiated portion or the exothermic peak temperature of the alkali-developable thermosetting resin composition in the irradiated portion is lower than that of the alkali-developable thermosetting resin composition in the non-irradiated portion.

3. The pattern forming method according to claim 1, further comprising:
   irradiating the resin layer with ultraviolet light after the removing of the non-irradiated portion.

4. The pattern forming method according to claim 1, further comprising:
   performing heat-curing after the removing of the non-irradiated portion.

5. The pattern forming method according to claim 1, further comprising:
   performing laser processing.

6. The pattern forming method according to claim 1, further comprising:
   performing desmearing.

7. A printed circuit board, comprising:
   a patterned layer formed by the pattern forming method according to claim 1.

8. The pattern forming method according to claim 1, wherein the irradiating is performed such that the alkali-developable thermosetting resin composition in the irradiated portion and the alkali-developable thermosetting resin composition in the non-irradiated portion have a difference of not less than 10° C. in the exothermic onset temperature or the exothermic peak temperature.

9. The pattern forming method according to claim 1, wherein the irradiating is performed such that the alkali-developable thermosetting resin composition in the irradiated portion and the alkali-developable thermosetting resin composition in the non-irradiated portion have a difference of not less than 20° C. in the exothermic onset temperature or the exothermic peak temperature.

10. The pattern forming method according to claim 1, wherein the irradiating is performed such that the alkali-developable thermosetting resin composition in the irradiated portion and the alkali-developable thermosetting resin composition in the non-irradiated potion have a difference of not less than 30° C. in the exothermic onset temperature or the exothermic peak temperature.

11. The pattern forming method according to claim 1, wherein the irradiating comprises applying a laser light or a scattering light which has a maximum wavelength in a range of 350 to 410 nm.

12. The pattern forming method according to claim 11, wherein the irradiating is performed such that an exposure dose is 300 to 1,500 mJ/cm$^2$.

13. The pattern forming method according to claim 12, further comprising:
   irradiating the resin layer with ultraviolet light after the removing of the non-irradiated portion.

14. The pattern forming method according to claim 13, wherein the irradiating of the resin layer with ultraviolet light is performed such that an exposure dose is 150 to 2,000 mJ/cm$^2$.

15. The pattern forming method according to claim 13, wherein the irradiating of the resin layer with ultraviolet light is performed such that an exposure dose is 500 to 1,000 mJ/cm².

16. A printed circuit board, comprising:
a patterned layer formed by irradiating, with a light in a negative pattern, a resin layer composed of an alkali-developable thermosetting resin composition comprising a photobase generator, heating the resin layer and then developing the resin layer; and
an opening formed on the patterned layer by laser processing,
wherein the irradiating is performed such that, when the alkali-developable thermosetting resin composition in the irradiated portion and the alkali-developable thermosetting resin composition in the non-irradiated portion are subjected to a DSC measurement,
the alkali-developable thermosetting resin composition in the irradiated portion exhibits an exothermic peak, and the alkali-developable thermosetting resin composition in the non-irradiated portion does not exhibit an exothermic peak, or
the alkali-developable thermosetting resin composition in the irradiated portion and the alkali-developable thermosetting resin composition in the non-irradiated portion each exhibit an exothermic peak such that 1) an exothermic onset temperature of the alkali-developable thermosetting resin composition in the irradiated portion is lower than that of the alkali-developable thermosetting resin composition in the non-irradiated portion or 2) an exothermic peak temperature of the alkali-developable thermosetting resin composition in the irradiated portion is lower than that of the alkali-developable thermosetting resin composition in the non-irradiated portion.

17. The printed circuit board according to claim 16, wherein the patterned layer is prepared by forming a resin layer by coating and drying the alkali-developable thermosetting resin composition; activating the photobase generator contained in the resin layer by irradiation with a light in a pattern form; and then removing an non-irradiated portion by development such that a negative pattern is formed.

* * * * *